(12) United States Patent
Wang et al.

(10) Patent No.: US 12,454,538 B2
(45) Date of Patent: Oct. 28, 2025

(54) STACKED ORGANIC ELECTROLUMINESCENT DEVICE

(71) Applicant: BEIJING SUMMER SPROUT TECHNOLOGY CO., LTD., Beijing (CN)

(72) Inventors: Jing Wang, Beijing (CN); Huiqing Pang, Beijing (CN); Zhihao Cui, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 946 days.

(21) Appl. No.: 17/649,261

(22) Filed: Jan. 28, 2022

(65) Prior Publication Data

US 2022/0336768 A1 Oct. 20, 2022

(30) Foreign Application Priority Data

Jan. 30, 2021 (CN) .......................... 202110131806.4

(51) Int. Cl.
*H01L 51/50* (2006.01)
*C07D 498/04* (2006.01)
(Continued)

(52) U.S. Cl.
CPC ........... *C07D 498/04* (2013.01); *H10K 50/11* (2023.02); *H10K 50/156* (2023.02); *H10K 50/17* (2023.02);
(Continued)

(58) Field of Classification Search
None
See application file for complete search history.

(56) References Cited

U.S. PATENT DOCUMENTS

| 6,717,358 B1 | 4/2004 | Liao et al. |
| 7,279,704 B2 | 10/2007 | Walters et al. |

(Continued)

FOREIGN PATENT DOCUMENTS

| CN | 101330129 A | 12/2008 |
| CN | 105176519 A | 12/2015 |

(Continued)

OTHER PUBLICATIONS

Tang et al., "Organic electroluminescent diodes," Appl. Phys. Lett. 51(12), pp. 913-915, DOI:10.1063/1.98799 (1987).

(Continued)

*Primary Examiner* — Gregory D Clark
(74) *Attorney, Agent, or Firm* — ArentFox Schiff LLP; Joseph M. Maraia; Marlo S. Grolnic

(57) ABSTRACT

Provided is a stacked organic electroluminescence device. At least one light-emitting unit of the stacked organic electroluminescent device includes an organic layer including a specific combination of a P-type material with a deep LUMO energy level and a hole transporting material with a deep HOMO energy level. Meanwhile, a P-type material is used as the buffer layer of the charge generation layer between the light-emitting units. The device can offer better device performance and more simplified fabrication process. Further provided is a display assembly including the device.

24 Claims, 3 Drawing Sheets

(51) Int. Cl.
  *H10K 50/11*    (2023.01)
  *H10K 50/15*    (2023.01)
  *H10K 50/17*    (2023.01)
  *H10K 85/60*    (2023.01)
  *H10K 59/80*    (2023.01)
  *H10K 101/40*   (2023.01)

(52) U.S. Cl.
  CPC ......... *H10K 85/622* (2023.02); *H10K 85/631* (2023.02); *H10K 85/653* (2023.02); *H10K 85/6572* (2023.02); *H10K 85/6574* (2023.02); *H10K 59/80* (2023.02); *H10K 2101/40* (2023.02)

(56) References Cited

U.S. PATENT DOCUMENTS

| | | |
|---|---|---|
| 2015/0115239 A1 | 4/2015 | Pflumm et al. |
| 2016/0141338 A1 | 5/2016 | Li |
| 2017/0155071 A1 | 6/2017 | Han et al. |
| 2017/0162792 A1 | 6/2017 | Kim et al. |
| 2018/0062083 A1 | 3/2018 | Kim et al. |
| 2019/0181349 A1 | 6/2019 | Xia |
| 2020/0062778 A1 | 2/2020 | Cui et al. |
| 2020/0144552 A1 | 5/2020 | Kim et al. |
| 2021/0104697 A1* | 4/2021 | Ohsawa ............... H10K 50/131 |
| 2021/0119162 A1 | 4/2021 | Gao et al. |
| 2021/0167298 A1 | 6/2021 | Pang et al. |
| 2021/0175455 A1 | 6/2021 | Chun et al. |
| 2022/0020935 A1 | 1/2022 | Ding et al. |

FOREIGN PATENT DOCUMENTS

| | | |
|---|---|---|
| CN | 107017349 A | 8/2017 |
| CN | 109912619 A | 6/2019 |
| CN | 112687811 A | 4/2021 |
| CN | 112745333 A | 5/2021 |
| CN | 112909188 A | 6/2021 |
| CN | 113956211 A | 1/2022 |
| EP | 3667755 A1 | 6/2020 |
| JP | 2008537314 A | 9/2008 |
| JP | 2008244430 A | 10/2008 |
| JP | 2009010338 A | 1/2009 |
| JP | 2016507475 A | 3/2016 |
| JP | 2016509369 A | 3/2016 |
| JP | 2017126598 A | 7/2017 |
| JP | 2019503078 A | 1/2019 |
| KR | 20170062938 A | 6/2017 |
| KR | 20170066194 A | 6/2017 |
| WO | 2020017772 A1 | 1/2020 |
| WO | 2020120791 A1 | 6/2020 |

OTHER PUBLICATIONS

Joyama et al., "Highly efficient organic light-emitting diodes from delayed fluorescence," Nature 492, pp. 234-240, DOI:10.1038/nature11687 (Dec. 2012).
First Office Action in Japanese Application No. 2022-011034 dated Nov. 4, 2022 with English translation, 11 pages.
Office Action for CN Application No. 202110131806.4 dated Jun. 30, 2024 (26 pgs.).
Office Action for DE Application No. 10 2022 102 034.7 dated Apr. 29, 2023 (15 pgs.).
Office Action for KR Application No. 10-2022-0011959 dated Nov. 11, 2023 (12 pgs.).

* cited by examiner

STACKED ORGANIC ELECTROLUMINESCENT DEVICE

CROSS-REFERENCE TO RELATED APPLICATION(S)

This application claims priority to Chinese Patent Application No. CN 202110131806.4 filed on Jan. 30, 2021, the disclosure of which is incorporated herein by reference in its entirety.

TECHNICAL FIELD

The present disclosure relates to a stacked organic electroluminescent device. The stacked organic electroluminescent device includes more than two light-emitting units, and a charge generation layer is disposed between adjacent two light-emitting units. More particularly, the present disclosure relates to an organic electroluminescent device having an organic layer doped with a P-type material and a display assembly including the organic electroluminescent device.

BACKGROUND

The organic light-emitting device (OLED) is composed of a cathode, an anode, and organic luminescent materials stacked between the cathode and the anode, can convert electric energy into light by applying voltages across the cathode and the anode of the OLED, and has the advantages of wide angle, high contrast, and fast response time. In 1987, Tang and Van Slyke of Eastman Kodak reported an organic electroluminescent device, which includes an arylamine hole transporting layer and a tris-8-hydroxyquinolato-aluminum layer as the electron transporting layer and emissive layer (Applied Physics Letters, 1987, 51 (12): 913-915). Once the voltage is applied across the device, green light was emitted from the device. This device laid the foundation for the development of modern organic light-emitting diodes (OLEDs). Since the OLED is a self-emitting solid-state thin-film device, it offers tremendous potential for display and lighting applications.

In terms of the device structure, OLEDs can be classified into OLEDs of monolayer structure and OLEDs of stacked structure (also called tandem structure). The monolayer OLEDs include only one light-emitting unit between the cathode and the anode while the stacked OLEDs have multiple light-emitting units stacked. One light-emitting unit generally includes at least one emissive layer, one hole transporting layer, and one electron transporting layer. Besides the above-mentioned layers, the light-emitting unit may further include a hole injection layer, an electron injection layer, a hole blocking layer, and an electron blocking layer. It is noted that although the monolayer OLEDs have only one light-emitting unit, this light-emitting unit may include multiple emissive layers, for example, the light-emitting unit may include a yellow light-emitting layer and a blue light-emitting layer. However, each light-emitting unit includes only one pair of a hole transporting layer and an electron transporting layer. The stacked OLEDs include at least two light-emitting units, that is, the stacked OLEDs include at least two pairs of hole transporting layer and electron transporting layer. When multiple light-emitting units are disposed in a vertically-stacked physical form and thus the characteristic of tandem on the circuit is achieved, this kind of OLEDs is referred to as stacked OLEDs (physically) or tandem OLEDs (according to circuit connections). That is, under the same brightness, the current density required by stacked OLEDs is smaller than the current density required by conventional monolayer OLEDs, thereby achieving the effect of prolonging the lifetime. However, at the constant current density, the brightness of stacked OLEDs is higher than the brightness of conventional monolayer OLEDs, with the voltage increasing accordingly.

At present, small and medium-sized OLED displays have been widely used in products such as mobile phones and tablet computers, and their costs are basically close to those of liquid crystal displays. However, large-size OLED displays still have some disadvantages such as high cost caused by low yield rate and short lifetime, which seriously affects the competitiveness of OLEDs in fields of computer display screens, televisions, and the like. Stacked OLEDs, due to the thick device structures, can improve the yield rate of the production line and multiply the efficiency and lifetime of devices and thus have become the main technology of large-size OLED display screens, and the field of stacked OLEDs has been paid more and more attention.

In order to improve the performance of stacked devices, the charge generation layer (CGL) is subjected to various optimization, with reference to, for example, U.S. Pat. No. 6,717,358B1, US20160141338A1, and CN2019109871570. For example, in patent application CN2019109871570, a stacked organic light-emitting device is disclosed, in which a compound such as compound 1-70 is used as a buffer layer and forms a charge generation layer together with metal Yb, that is, a buffer layer material with a deep LUMO energy level is deposited on the metal layer to form a charge generation layer. In another aspect, the carrier injection and balance can be improved by optimizing the collocation of the charge generation layer and adjacent compounds, so as to improve the overall performance of the device. For example, in patent application KR20170062938, the collocation of the P-type charge generation layer and the hole transporting layer in contact with the P-type charge generation layer is optimized in energy levels and hole mobility, so as to reduce the voltage, improve the efficiency, and prolong the lifetime.

In addition, the performance of stacked devices can be improved by optimizing the performance of single light-emitting units. In patent application CN201911209540X, a P-type material with a deep LUMO energy level and a hole transporting material with a deep HOMO energy level are co-deposited to form a hole injection layer, and then the hole transporting material is used as a hole transporting layer on which an emissive layer is directly deposited. Since the energy levels are more matched, film layers and materials are reduced so that the voltage of the device is reduced, the lifetime is prolonged, and the process is simplified.

However, there has not been a public report about a stacked device in which a material with a deep LUMO level is combined with a material with a deep HOMO level as the hole transporting structure of the light-emitting unit and such a material with a deep LUMO level is used as the buffer layer in the charge generation layer.

SUMMARY

The present disclosure aims to provide a new stacked organic electroluminescent device to solve at least part of the above-mentioned problems.

According to an embodiment of the present disclosure, disclosed is an organic electroluminescent device, which includes:

a first electrode, a second electrode, and at least two light-emitting units disposed between the first electrode and the second electrode, wherein each light-emitting unit comprises at least one emissive layer;

wherein at least one light-emitting unit comprises a first organic layer comprising a first organic material and a second organic material;

wherein a charge generation layer is disposed between at least one group of adjacent two light-emitting units, and the charge generation layer comprises a buffer layer, wherein the buffer layer comprises a third organic material;

wherein the LUMO energy level of the first organic material is greater than or equal to the LUMO energy level of the third organic material, and the LUMO energy level of the third organic material is greater than 4.90 eV;

wherein the HOMO energy level of the second organic material is greater than 4.99 eV.

According to an embodiment of the present disclosure, disclosed is a display assembly which comprises the organic electroluminescent device described in the above-mentioned embodiment.

The present disclosure provides a stacked organic electroluminescent device. At least one light-emitting unit includes an organic layer including a specific combination of a P-type material with a deep LUMO energy level and a hole transporting material with a deep HOMO energy level, which can offer better device performance and a more simplified fabrication process. Meanwhile, a P-type material is used as the buffer layer of the charge generation layer between the light-emitting units, which can further improve the device performance and increase the stability of the device.

DETAILED DESCRIPTION

Figure 1:
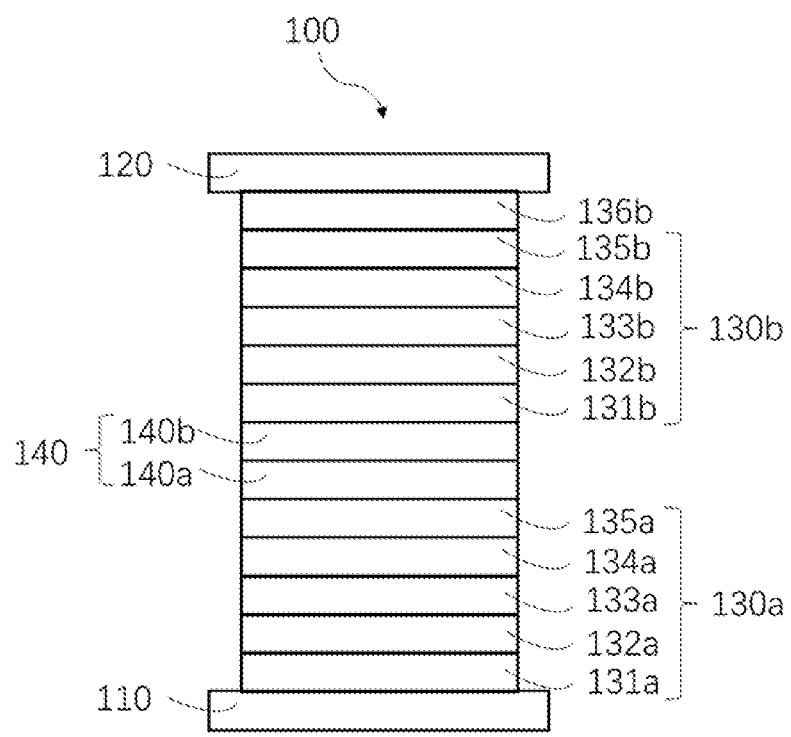
FIG. 1 is a schematic diagram of a stacked organic electroluminescent device disclosed by the present disclosure.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, the term "OLED device" includes an anode layer, a cathode layer, and one or more organic layers disposed between the anode layer and the cathode layer. An "OLED device" may be a bottom-emission device, that is, it emits light from the side of the substrate, or may be a top-emission device, that is, it emits light from the side of the encapsulation layer, or may be a transparent device, that is, it emits light from both the substrate and the encapsulation layer.

As used herein, the term "OLED light-emitting panel" includes a substrate, an anode layer, a cathode layer, one or more organic layers disposed between the anode layer and the cathode layer, an encapsulation layer, and at least one anode contact and at least one cathode contact extending to the outside of the encapsulation layer for external access.

As used herein, the term "module" refers to an electrical device with only one set of external electric drive apparatus.

As used herein, the term "encapsulation layer" may be a thin-film encapsulation with a thickness of less than 100 micrometers, which includes one or more thin films directly disposed on the device, or may be cover glass adhered to the substrate.

As used herein, the term "flexible printed circuit (FPC)" refers to any circuit whose flexible substrate is coated with any one or any combination of the following, including, but not limited to, conductive lines, resistors, capacitors, inductors, transistors, microelectromechanical systems (MEMS), and the like. The flexible substrate of a flexible printed circuit may be plastic, thin glass, thin metal foil coated with an insulating layer, fabric, leather, paper, and the like. A flexible printed circuit board is generally less than 1 mm in thickness, more preferably, less than 0.7 mm in thickness.

As used herein, the term "light extraction layer" may refer to a light diffusion film, or other microstructures having a light extraction effect, or a thin film coating having a light out-coupling effect. The light extraction layer may be arranged on the surface of the substrate of an OLED, or at other suitable positions, such as between the substrate and the anode, or between the organic layer and the cathode, between the cathode and the encapsulation, on the surface of the encapsulation layer, and so on.

As used herein, the term "independently driven" refers to that the operating points of two or more light-emitting panels are separately controlled. Although these light-emitting panels can be connected to the same controller or power line, there can be circuitry to divide the drive routes and power each panel without affecting each other.

As used herein, light-emitting units should not be limited by terms "first light-emitting unit", "second light-emitting unit", and the like. Those terms are only used to distinguish one light-emitting unit from another light-emitting unit.

As used herein, the work function of a metal refers to the minimum energy required to move an electron from the interior of an object just to the surface of the object. All "work functions of the metal" herein are represented by the absolute value (positive value), that is, the greater the numerical value, the more the energy required to pull an electron to the vacuum level, and as described herein, the magnitude of the "work function of the metal" refers to the magnitude of the absolute value. For example, "the work function of the metal is greater than 5 eV" refers to that the energy required to pull an electron to the vacuum level is greater than 5 eV.

As used herein, the HOMO energy level and the LUMO mentioned herein are calculated by using the Gaussian 09 software, B3LYP method and 6-311g (d) basis set. Herein, all "HOMO" and "LUMO" energy levels are represented by absolute values (positive values), and the greater the numerical value, the deeper the energy level. For example, the LUMO energy level of Compound HATCN

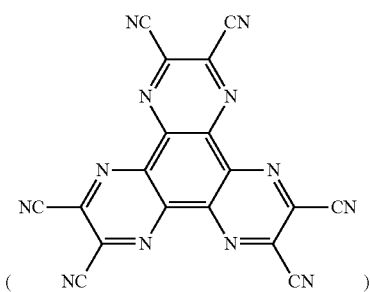

is calculated to be 4.81 eV by the above-mentioned method.

As used herein, the "charge generation layer" is a layer disposed between two light-emitting units having the function of providing electrons and holes. Preferably, the charge generation layer is composed of a metal layer and a buffer layer, wherein the metal layer is in contact with an electron transporting layer or an electron injection layer of one light-emitting unit, and the buffer layer is in contact with a hole injection layer or a hole transporting layer of an adjacent light-emitting unit. The "charge generation layer" may be a part of the charge generation layer or may be a charge generation layer. When the "charge generation layer" is a part of the charge generation layer, it can form a charge generation layer with a P-type material having the function of generating holes in a light-emitting unit, wherein the metal material is used as an N-type material to generate electrons, a buffer layer is used to optimize the interface, and the P-type material is a hole injection layer material for the next light-emitting unit. When the "charge generation layer" is a charge generation layer, the metal material is used as an N-type material to generate electrons, and the buffer layer is used as a P-type material to generate holes, especially when the buffer layer is thick and forms a continuous film or a nearly continuous film.

As used herein, the "buffer layer" is a layer having the function of optimizing the interface, optionally, a layer having the function of generating holes, and is a part of the charge generation layer. When the "charge generation layer" is a part of the charge generation layer, the "buffer layer" has the function of optimizing the interface, reducing interface defects, and ensuring the smooth transporting of carriers. When the "charge generation layer" is a charge generation layer, the material of the "buffer layer" is used as a P-type material having the function of generating holes as well as the function of optimizing the interface. The material of the buffer layer herein is an organic material, preferably an organic material with a LUMO energy level greater than 4.90 eV, more preferably a compound having a structure represented by Formula 1 or a quinone compound and derivatives thereof.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, an n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-m ethylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylsilyl, dimethyl ethyl silyl, dimethylisopropylsilyl, t-butyldimethylsilyl, triethylsilyl, triisopropylsilyl, trimethylsilylmethyl, trimethylsilylethyl, and trimethylsilylisopropyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 heteroatoms, where at least one hetero-atom is selected from the group consisting of a nitrogen atom, an oxygen atom, a sulfur atom, a selenium atom, a silicon atom, a phosphorus atom, a germanium atom, and a boron atom. A heteroaromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl group substituted with an alkyl group. Alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl group substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylgermanyl, diphenylbiphenylgermanyl, phenyl diethylgermanyl, diphenylethylgermanyl, phenyldimethylgermanyl, diphenylmethylgermanyl, phenyldisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic, as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

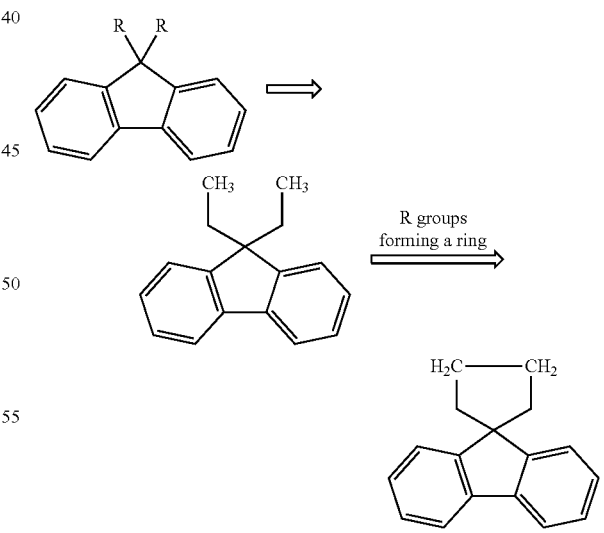

The expression that adjacent substituents can be optionally joined to form a ring is also intended to mean that two substituents bonded to carbon atoms which are directly bonded to each other are joined to each other via a chemical bond to form a ring, which can be exemplified by the following formula:

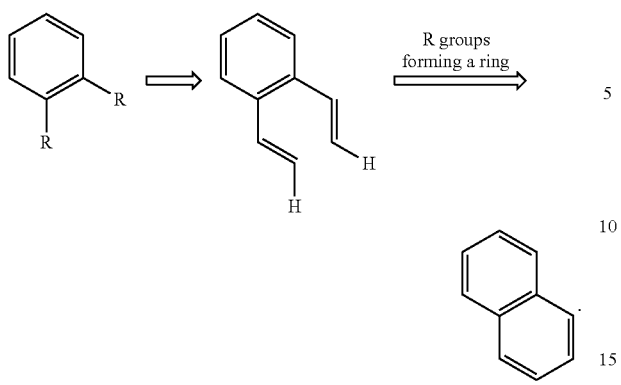

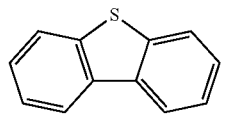

The expression that adjacent substituents can be optionally joined to form a ring is also intended to mean that two substituents bonded to a further distant carbon atom are joined to each other via a chemical bond to form a ring, which can be exemplified by the following formula:

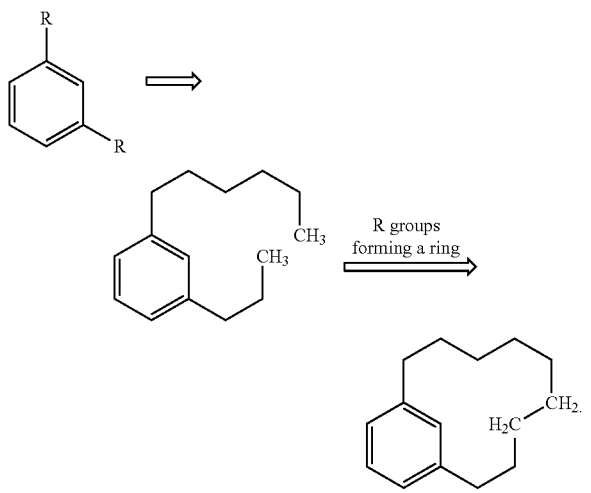

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

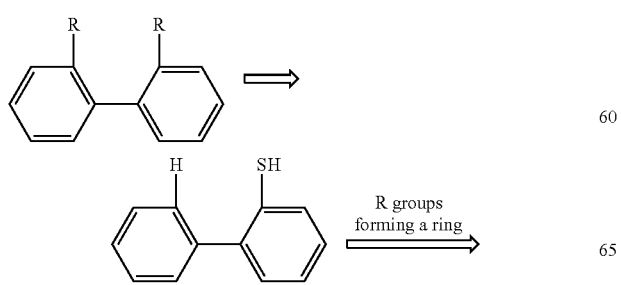

According to an embodiment of the present disclosure, an organic electroluminescent device is disclosed. The organic electroluminescent device comprises:

a first electrode, a second electrode, and at least two light-emitting units disposed between the first electrode and the second electrode, wherein each light-emitting unit comprises at least one emissive layer;

wherein at least one two light-emitting unit comprises a first organic layer including a first organic material and a second organic material;

wherein a charge generation layer is disposed between at least one group of adjacent two light-emitting units, and the charge generation layer comprises a buffer layer, wherein the buffer layer comprises a third organic material;

wherein the LUMO energy level of the first organic material is greater than or equal to the LUMO energy level of the third organic material, and the LUMO energy level of the third organic material is greater than 4.90 eV;

wherein the HOMO energy level of the second organic material is greater than 4.99 eV.

According to an embodiment of the present disclosure, wherein the first organic material comprised in the first organic layer is a P-type material, wherein the third organic material comprised in the buffer layer is a P-type material.

According to an embodiment of the present disclosure, wherein the first organic material comprised in the first organic layer has a structure represented by one of Formula 1, Formula 2, and Formula 3, wherein the third organic material comprised in the buffer layer has a structure represented by one of Formula 1, Formula 2, and Formula 3:

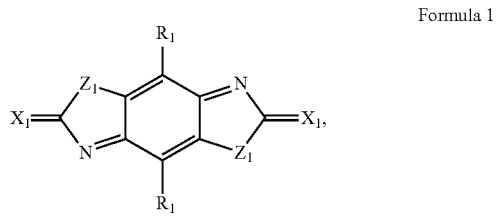

Formula 1 in Formula 1, $X_1$ is, at each occurrence identically or differently, selected from $NR_1'$, $CR_1'R_1'''$, O, S or Se;

$Z_1$ is, at each occurrence identically or differently, selected from O, S or Se;

each $R_1$ can be identical or different, and at least one of $R_1$, $R_1'$, $R_1''$, and $R_1'''$ is a group having at least one electron-withdrawing group;

in Formula 1, adjacent substituents can be optionally joined to form a ring;

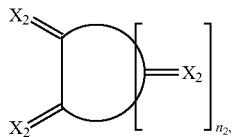

Formula 2 in Formula 2,
$n_2$ is an integer from 1 to 4;
$X_2$ is, at each occurrence identically or differently, selected from $NR_2'$, $CR_2''R_2'''$, O, S or Se;
in Formula 2, adjacent substituents can be optionally joined to form a ring;

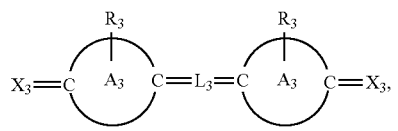

Formula 3 in Formula 3,
$L_3$ is, at each occurrence identically or differently, selected from

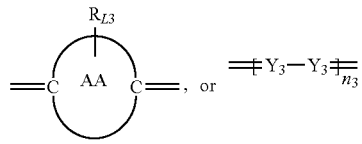

or a combination thereof;
ring AA is a conjugated structure of 4 to 30 ring atoms having at least one intra-ring double bond;
$n_3$ is, at each occurrence identically or differently, selected from integers from 0 to 10;
$Y_3$ is, at each occurrence identically or differently, selected from the group consisting of $CR_{L3}$ and N;
ring $A_3$ is, at each occurrence identically or differently, a 5-membered heterocyclic ring, and the 5-membered heterocyclic ring comprises an intra-ring double bond, at least one N atom, and at least one heteroatom $W_3$; the $W_3$ is, at each occurrence identically or differently, selected from the group consisting of O, S, Se, and $NR_{N3}$;
$X_3$ is, at each occurrence identically or differently, selected from the group consisting of O, S, Se, $NR_3'$, and $CR_3''R_3'''$;
$R_3$ and $R_{L3}$ represent, at each occurrence identically or differently, mono-substitution, multiple substitutions, or non-substitution;
when $L_3$ is selected from

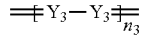

and $n_3=0$, at least one of substituents $R_3$ and $R_{N3}$ is a group having at least one electron-withdrawing group;
when $X_3$ is selected from $NR_3'$ or $CR_3''R_3'''$, at least one of $R_3'$, $R_3''$, and $R_3'''$ is a group having at least one electron-withdrawing group;

adjacent substituents $R_3''$, $R_3'''$ can be optionally joined to form a ring;
adjacent substituents $R_3$, $R_{L3}$ can be optionally joined to form a ring; when adjacent substituents $R_{L3}$ are joined to form a ring, the resulting ring has at least 4 ring atoms; and when adjacent substituents $R_3$ are joined to form a ring, the resulting ring has at least 6 ring atoms;
$R_1$, $R_1'$, $R_1''$, $R_1'''$, $R_2'$, $R_2''$, $R_2'''$, $R_3$, $R_3'$, $R_3''$, $R_3'''$, $R_{L3}$, and $R_{N3}$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a hydroxyl group, a sulfanyl group, substituted or unsubstituted alkyl having 1 to 20 carbon atoms, substituted or unsubstituted cycloalkyl with 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, and combinations thereof.

Herein, the expression that "in Formula 1, adjacent substituents can be optionally joined to form a ring" is intended to mean that adjacent substituents $R_1''$ and $R_1'''$ can be joined to form a ring. Apparently, adjacent substituents $R_1''$ and $R_1'''$ may not be joined to form a ring.

Herein, the expression that "in Formula 2, adjacent substituents can be optionally joined to form a ring" is intended to mean that adjacent substituents $R_2''$ and $R_2'''$ can be joined to form a ring. Apparently, adjacent substituents $R_2''$ and $R_2'''$ may not be joined to form a ring.

Herein, the expression that "adjacent substituents $R_3''$, $R_3'''$ can be optionally joined to form a ring" is intended to mean that adjacent substituents $R_3''$ and $R_3'''$ can be joined to form a ring. Apparently, adjacent substituents $R_3''$ and $R_3'''$ may not be joined to form a ring.

Herein, the expression that "adjacent substituents $R_3$, $R_{L3}$ can be optionally joined to form a ring" is intended to mean that for groups of adjacent substituents, for example, two substituents $R_3$ and two substituents $R_{L3}$, any one or more of these substituent groups can be joined to form a ring. Apparently, these groups of adjacent substituents may not be joined to form a ring.

According to an embodiment of the present disclosure, wherein the first organic material comprised in the first organic layer has a structure represented by Formula 1.

According to an embodiment of the present disclosure, wherein $X_1$ in the Formula 1 is, at each occurrence identically or differently, selected from $CR_1''R_1'''$ or $NR_1'''$, and $R_1'$, $R_1''$, and $R_1'''$ each are a group having at least one electron-withdrawing group;

$X_2$ in the Formula 2 is, at each occurrence identically or differently, selected from $CR_2''R_2'''$ or $NR_2'$, and $R_2'$, $R_2''$, and $R_2'''$ each are a group having at least one electron-withdrawing group;

$X_3$ in the Formula 3 is, at each occurrence identically or differently, selected from $CR_3''R_3'''$ or $NR_3'$, and $R_3'$, $R_3''$, and $R_3'''$ each are a group having at least one electron-withdrawing group.

According to an embodiment of the present disclosure, wherein $R_1$, $R_1'$, $R_1''$, and $R_1'''$ in Formula 1 each are a group having at least one electron-withdrawing group.

According to an embodiment of the present disclosure, wherein at least one of $R_3$, $R_{L3}$, and $R_{N3}$ in Formula 3 is a group having at least one electron-withdrawing group.

According to an embodiment of the present disclosure, wherein $R_3$, $R_3'$, $R_3''$, $R_3'''$, $R_{L3}$, and $R_{N3}$ in Formula 3 each are a group having at least one electron-withdrawing group.

According to an embodiment of the present disclosure, wherein the electron-withdrawing group has a Hammett constant of ≥0.05, preferably ≥0.3, and more preferably ≥0.5. In the present disclosure, the electron-withdrawing group has a Hammett substituent constant value of ≥0.05, preferably ≥0.3, and more preferably ≥0.5, and the electron withdrawing ability is relatively strong, which can significantly reduce the LUMO energy level of the compound and improve the charge mobility. It should be noted that the Hammett substituent constant value includes a Hammett para substituent constant and/or meta substituent constant, and as long as one of the para constant and meta constant is greater than or equal to 0.05, this group can be used as the group selected by the present disclosure.

According to an embodiment of the present disclosure, wherein the electron-withdrawing group is selected from the group consisting of: halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, an aza-aromatic group, and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, and an aza-aromatic group: alkyl having 1 to 20 carbon atoms, cycloalkyl having 3 to 20 ring carbon atoms, heteroalkyl having 1 to 20 carbon atoms, arylalkyl having 7 to 30 carbon atoms, alkoxy having 1 to 20 carbon atoms, aryloxy having 6 to 30 carbon atoms, alkenyl having 2 to 20 carbon atoms, alkynyl having 2 to 20 carbon atoms, aryl having 6 to 30 carbon atoms, heteroaryl having 3 to 30 carbon atoms, alkylsilyl having 3 to 20 carbon atoms, arylsilyl having 6 to 20 carbon atoms, and combinations thereof.

According to an embodiment of the present disclosure, the electron-withdrawing group is selected from the group consisting of: F, $CF_3$, $OCF_3$, $SF_5$, $SO_2CF_3$, cyano, isocyano, SCN, OCN, pyrimidinyl, triazinyl, and combinations thereof.

According to an embodiment of the present disclosure, wherein attached to two sides of $L_3$ in Formula 3 is, at each occurrence identically or differently, selected from any of the following structures:

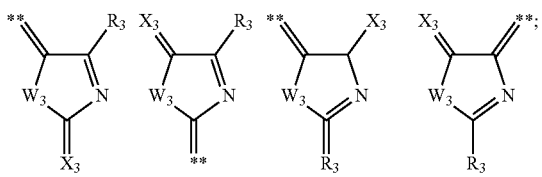

wherein $X_3$ is, at each occurrence identically or differently, selected from the group consisting of O, S, Se, $NR_3'$, and $CR_3''R_3'''$;

$W_3$ is, at each occurrence identically or differently, selected from the group consisting of O, S, Se, and $NR_{N3}$;

$R_3$, $R_3'$, $R_3''$, $R_3'''$, and $R_{N3}$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a hydroxyl group, a sulfanyl group, substituted or unsubstituted alkyl having 1 to 20 carbon atoms, substituted or unsubstituted cycloalkyl with 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, and combinations thereof;

"**" represents a position where the structure is attached to $L_3$ in Formula 3.

According to an embodiment of the present disclosure, wherein the first organic material and the third organic material are each independently selected from a structure represented by one of Formula 2-1 and Formula 3-1 to Formula 3-18:

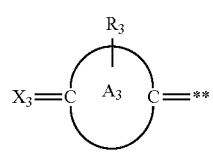

Formula 2-1

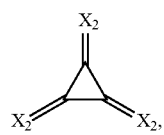

Formula 3-1
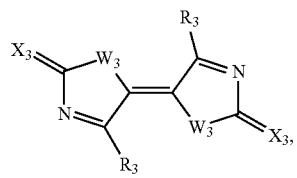

Formula 3-2
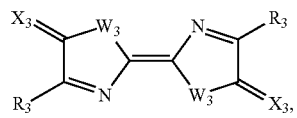

Formula 3-3
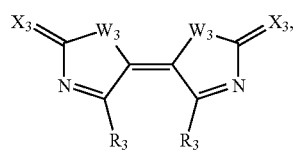

Formula 3-4
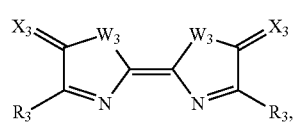

Formula 3-5
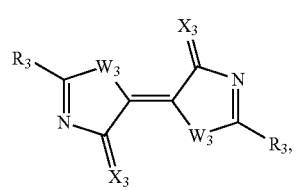

Formula 3-6
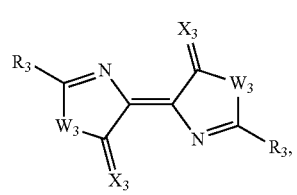

Formula 3-7
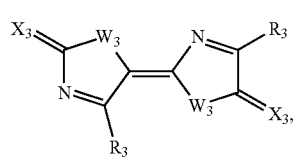

Formula 3-8
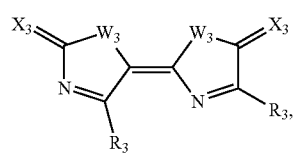

Formula 3-9
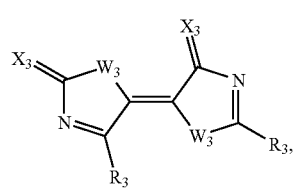

Formula 3-10
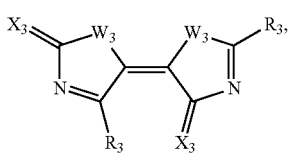

Formula 3-11
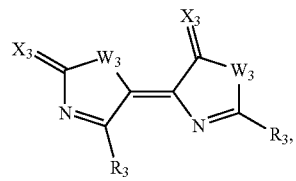

Formula 3-12
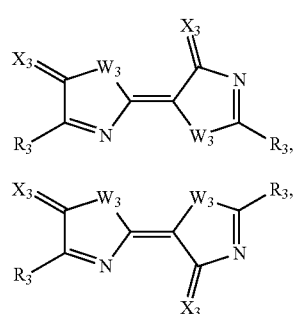

Formula 3-13

Formula 3-14

Formula 3-15
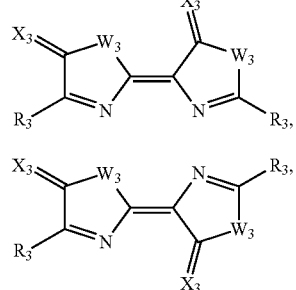

Formula 3-16
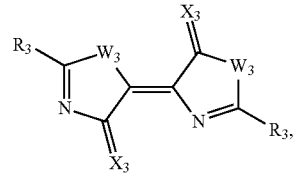

Formula 3-17
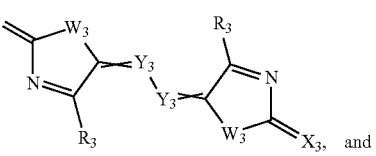

and

Formula 3-18
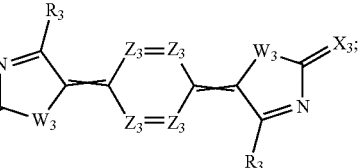

wherein $X_2$ is, at each occurrence identically or differently, selected from $NR_2'$, $CR_2''R_2'''$, O, S or Se;

$X_3$ is, at each occurrence identically or differently, selected from the group consisting of O, S, Se, $NR_3'$, and $CR_3''R_3'''$;

$W_3$ is, at each occurrence identically or differently, selected from the group consisting of O, S, Se, and $NR_{N3}$;

$Y_3$ is, at each occurrence identically or differently, selected from the group consisting of $CR_{L3}$ and N;

$Z_3$ is, at each occurrence identically or differently, selected from the group consisting of $CR_{L3}$ and N;

$R_2'$, $R_2''$, $R_2'''$, $R_3$, $R_3'$, $R_3''$, $R_3'''$, $R_{L3}$, and $R_{N3}$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a hydroxyl group, a sulfanyl group, substituted or unsubstituted alkyl having 1 to 20 carbon atoms, substituted or unsubstituted cycloalkyl with 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, and combinations thereof.

According to an embodiment of the present disclosure, wherein in Formula 1, $X_1$, $X_2$, and $X_3$ are, at each occurrence identically or differently, selected from the group consisting of the following structures:

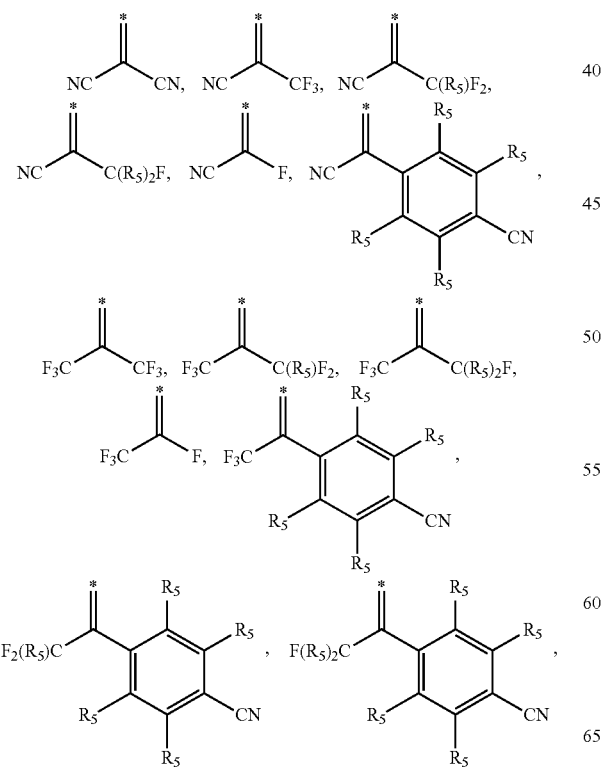

-continued

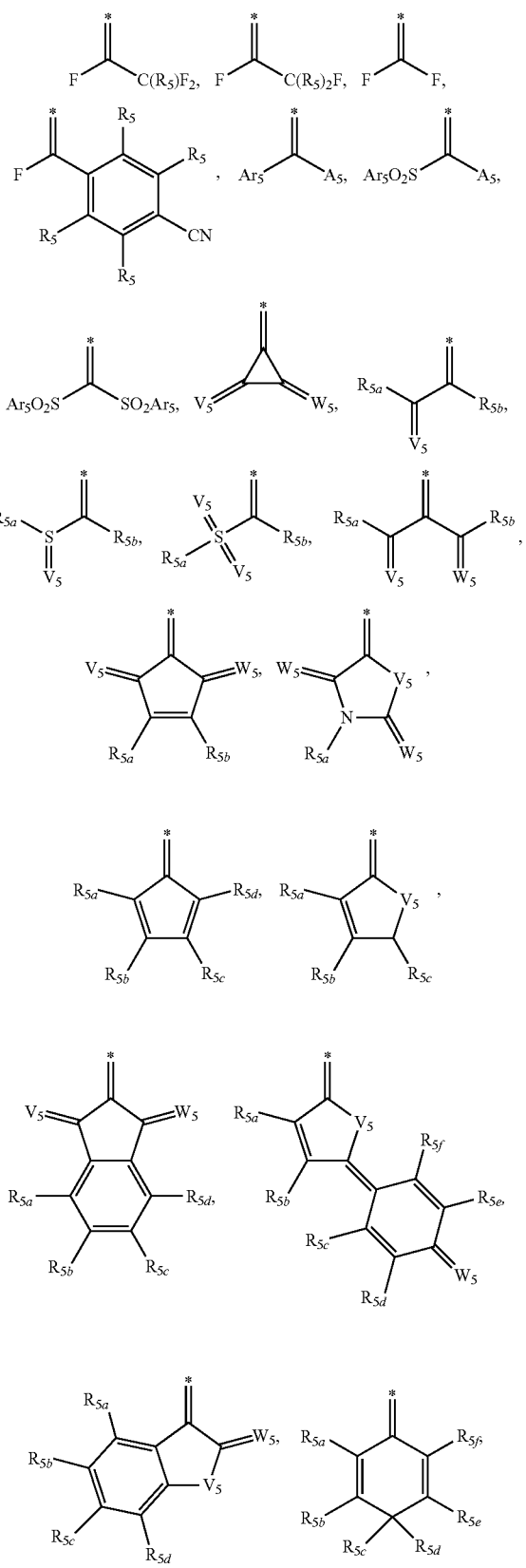

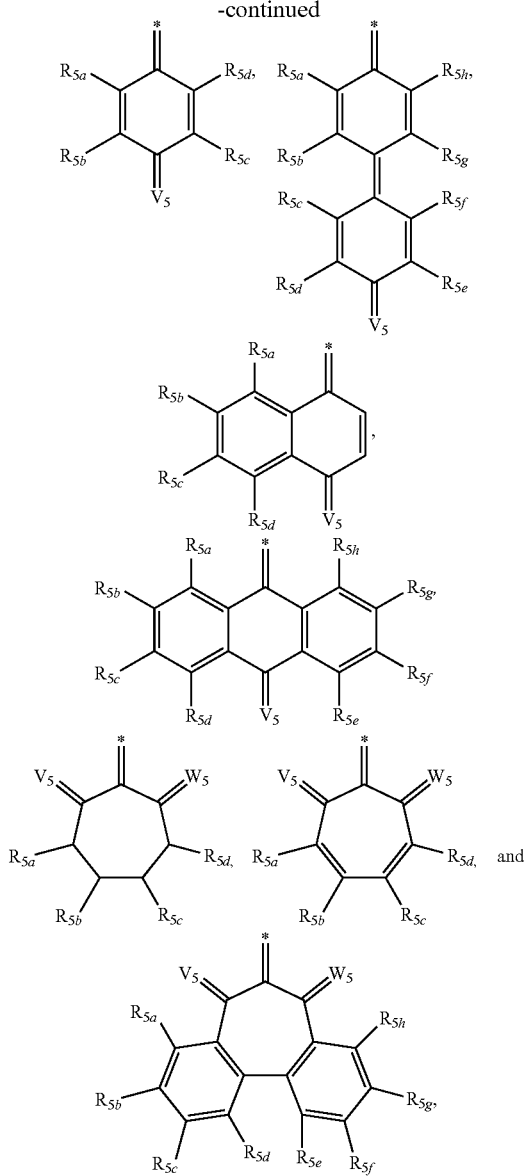

wherein $V_5$ and $W_5$ are, at each occurrence identically or differently, selected from $CR_{5v}R_{5w}$, $NR_{5v}$, O, S or Se;
wherein $Ar_5$ is, at each occurrence identically or differently, selected from substituted or unsubstituted aryl having 6 to 30 carbon atoms or a substituted or unsubstituted heteroaryl having 3 to 30 carbon atoms;
wherein $R_5$, $A_5$, $R_{5a}$, $R_{5b}$, $R_{5c}$, $R_{5d}$, $R_{5e}$, $R_{5f}$, $R_{5g}$, $R_{5h}$, $R_{5v}$, and $R_{5w}$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a hydroxyl group, a sulfanyl group, substituted or unsubstituted alkyl having 1 to 20 carbon atoms, substituted or unsubstituted cycloalkyl with 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, and combinations thereof;
wherein $A_5$ is a group having at least one electron-withdrawing group, and for any of the above structures, when one or more of $R_{5a}$, $R_{5b}$, $R_{5c}$, $R_{5d}$, $R_{5e}$, $R_{5f}$, $R_{5g}$, $R_{5h}$, $R_{5v}$, and $R_{5w}$ occur, at least one of $R_{5a}$, $R_{5b}$, $R_{5c}$, $R_{5d}$, $R_{5e}$, $R_{5f}$, $R_{5g}$, $R_{5h}$, $R_{5v}$, and $R_{5w}$ is a group having at least one electron-withdrawing group;
adjacent substituents $R_5$, $R_{5a}$, $R_{5b}$, $R_{5c}$, $R_{5d}$, $R_{5e}$, $R_{5f}$, $R_{5g}$, $R_{5h}$, $R_{5v}$, and $R_{5w}$ can be optionally joined to form a ring;
wherein "*" represents a position where the group is joined to a dehydrobenzodioxazole ring, a dehydrobenzodithiazole ring or a dehydrobenzodiselenazole in Formula 1, or a position where the group is joined to a radialene in Formula 2, or a position where the group is joined to ring $A_3$ in Formula 3.

Herein, the expression that "adjacent substituents $R_5$, $R_{5a}$, $R_{5b}$, $R_{5c}$, $R_{5d}$, $R_{5e}$, $R_{5f}$, $R_{5g}$, $R_{5h}$, $R_{5v}$, and $R_{5w}$ can be optionally joined to form a ring" is intended to mean that for groups of adjacent substituents, for example, two substituents $R_5$, substituents $R_{5a}$ and $R_{5b}$, substituents $R_{5b}$ and $R_{5c}$, substituents $R_{5c}$ and $R_{5d}$, substituents $R_{5d}$ and $R_{5e}$, substituents $R_{5e}$ and $R_{5f}$, substituents $R_{5f}$ and $R_{5g}$, substituents $R_{5g}$ and $R_{5h}$, substituents $R_{5a}$ and $R_{5v}$, substituents $R_{5b}$ and $R_{5v}$, substituents $R_{5c}$ and $R_{5v}$, substituents $R_{5d}$ and $R_{5v}$, substituents $R_{5e}$ and $R_{5v}$, substituents $R_{5h}$ and $R_{5v}$, substituents $R_{5a}$ and $R_{5w}$, substituents $R_{5b}$ and $R_{5w}$, substituents $R_{5c}$ and $R_{5w}$, substituents $R_{5d}$ and $R_{5w}$, substituents $R_{5e}$ and $R_{5w}$, substituents $R_{5h}$ and $R_{5w}$, and substituents $R_{5v}$ and $R_{5w}$, any one or more of these substituent groups can be joined to form a ring. Apparently, these groups of adjacent substituents may not be joined to form a ring.

According to an embodiment of the present disclosure, $R_5$ is, at each occurrence identically or differently, selected from the group consisting of: F, $CF_3$, $OCF_3$, $SF_5$, $SO_2CF_3$, cyano, isocyano, SCN, OCN, pentafluorophenyl, 4-cyanotetrafluorophenyl, tetrafluoropyridyl, pyrimidinyl, triazinyl, and combinations thereof.

According to an embodiment of the present disclosure, the group having at least one electron-withdrawing group is selected from the group consisting of: F, $CF_3$, $OCF_3$, $SF_5$, $SO_2CF_3$, cyano, isocyano, SCN, OCN, pentafluorophenyl, 4-cyanotetrafluorophenyl, tetrafluoropyridyl, pyrimidinyl, triazinyl, and combinations thereof.

According to an embodiment of the present disclosure, wherein $X_1$, $X_2$, and $\kappa_3$ are, at each occurrence identically or differently, selected from the group consisting of the following structures:

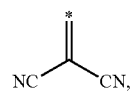

X-1

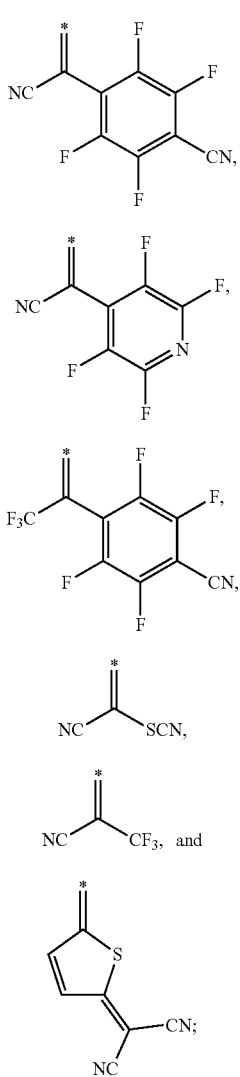

wherein "*" represents a position where the group is joined to a dehydrobenzodioxazole ring, a dehydrobenzodithiazole ring or a dehydrobenzodiselenazole in Formula 1, or a position where the group is joined to a radialene in Formula 2, or a position where the group is joined to ring $A_3$ in Formula 3.

According to an embodiment of the present disclosure, wherein the $X_1$ and $X_3$ are Formula X-1.

According to an embodiment of the present disclosure, wherein $R_1$ and $R_3$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, unsubstituted alkyl having 1 to 20 carbon atoms, unsubstituted cycloalkyl having 3 to 20 ring carbon atoms, unsubstituted alkoxy having 1 to 20 carbon atoms, unsubstituted alkenyl having 2 to 20 carbon atoms, unsubstituted aryl having 6 to 30 carbon atoms, unsubstituted heteroaryl having 3 to 30 carbon atoms, and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, and a phosphoroso group: alkyl having 1 to 20 carbon atoms, cycloalkyl having 3 to 20 ring carbon atoms, alkoxy having 1 to 20 carbon atoms, alkenyl having 2 to 20 carbon atoms, aryl having 6 to 30 carbon atoms, heteroaryl having 3 to 30 carbon atoms, and combinations thereof.

According to an embodiment of the present disclosure, wherein $R_1$ and $R_3$ are, at each occurrence identically or differently, selected from the group consisting of: hydrogen, deuterium, methyl, isopropyl, $NO_2$, $SO_2CH_3$, $SCF_3$, $C_2F_5$, $OC_2F_5$, $OCH_3$, diphenylmethylsilyl, phenyl, methoxyphenyl, p-methylphenyl, 2,6-diisopropylphenyl, biphenyl, polyfluorophenyl, difluopyridyl, nitrophenyl, dimethylthiazolyl, vinyl substituted by one or more of CN or $CF_3$, ethynyl substituted by one of CN or $CF_3$, dimethylphosphoroso, diphenylphosphoroso, F, $CF_3$, $OCF_3$, $SF_5$, $SO_2CF_3$, cyano, isocyano, SCN, OCN, trifluoromethylphenyl, trifluoromethoxyphenyl, bis(trifluoromethyl)phenyl, bis(trifluoromethoxyl)phenyl, 4-cyanotetrafluorophenyl, phenyl or biphenyl substituted by one or more of F, CN or $CF_3$, tetrafluoropyridyl, pyrimidinyl, triazinyl, diphenylboryl, oxaboraanthyl, and combinations thereof.

According to an embodiment of the present disclosure, wherein $R_1$ and $R_3$ are, at each occurrence identically or differently, selected from the group consisting of B1 to B88, and for the specific structures of B1 to B88, reference is made to claim 9.

According to an embodiment of the present disclosure, wherein two $R_1$ in Formula 1 are identical, or two $R_3$ in Formula 3 are identical.

According to an embodiment of the present disclosure, wherein $Z_1$ and $W_3$ are, at each occurrence identically or differently, selected from O, S or Se.

According to an embodiment of the present disclosure, wherein $Z_1$ and $W_3$ are, at each occurrence identically or differently, selected from O or S.

According to an embodiment of the present disclosure, wherein $Z_1$ and $W_3$ are O.

According to an embodiment of the present disclosure, wherein $n_2$ in Formula 2 is equal to 1; $n_3$ in Formula 3 is equal to 0.

According to an embodiment of the present disclosure, wherein the first organic material and the third organic material are each independently selected from the group consisting of Compound 1-1 to Compound 1-348, Compound 2-1 to Compound 2-37, and Compound 3-1 to Compound 3-696, and for specific structures of Compound 1-1 to Compound 1-348, Compound 2-1 to Compound 2-37, and Compound 3-1 to Compound 3-696, reference is made to claim 12.

According to an embodiment of the present disclosure, wherein the second organic material comprised in the first organic layer has a structure represented by Formula 4:

Formula 4

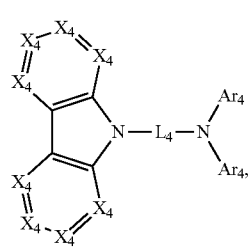

in Formula 4, $X_4$ is, at each occurrence identically or differently, selected from $CR_4$ or N;

$L_4$ is, at each occurrence identically or differently, selected from substituted or unsubstituted arylene having 6 to 30 carbon atoms, substituted or unsubstituted heteroarylene having 3 to 30 carbon atoms, or combinations thereof;

$Ar_4$ is, at each occurrence identically or differently, selected from substituted or unsubstituted aryl having 6 to 30 carbon atoms, substituted or unsubstituted heteroaryl having 3 to 30 carbon atoms, or combinations thereof;

$R_4$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

in Formula 4, adjacent substituents can be optionally joined to form a ring.

Herein, the expression that "in Formula 4, adjacent substituents can be optionally joined to form a ring" is intended to mean that adjacent substituents $R_4$ can be joined to form a ring. Apparently, adjacent substituents $R_4$ may not be joined to form a ring.

According to an embodiment of the present disclosure, wherein $L_4$ is, at each occurrence identically or differently, selected from substituted or unsubstituted phenylene, substituted or unsubstituted biphenylene, substituted or unsubstituted terphenylene, substituted or unsubstituted naphthylene, substituted or unsubstituted fluorenylene, substituted or unsubstituted silafluorenylene, substituted or unsubstituted carbazolylene, substituted or unsubstituted dibenzofuranylene, substituted or unsubstituted dibenzothiophenylene, substituted or unsubstituted dibenzoselenophenylene, substituted or unsubstituted phenanthrylene, substituted or unsubstituted triphenylenylene, substituted or unsubstituted pyridinylene, substituted or unsubstituted spirodifluorenylene, substituted or unsubstituted anthrylene, substituted or unsubstituted pyrenylene, or combinations thereof.

According to an embodiment of the present disclosure, $L_4$ is selected from substituted or unsubstituted phenylene or substituted or unsubstituted biphenylene.

According to an embodiment of the present disclosure, $L_4$ is phenylene or biphenylene.

According to an embodiment of the present disclosure, wherein $X_4$ is, at each occurrence identically or differently, selected from $CR_4$, and $R_4$ is, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms or substituted or unsubstituted heteroaryl having 3 to 30 carbon atoms.

According to an embodiment of the present disclosure, wherein $Ar_4$ is, at each occurrence identically or differently, selected from substituted or unsubstituted aryl having 6 to 20 carbon atoms or substituted or unsubstituted heteroaryl having 3 to 20 carbon atoms.

According to an embodiment of the present disclosure, $Ar_4$ is selected from phenyl, biphenyl, terphenyl, naphthyl, fluorenyl, dibenzothiophenyl, spirodifluorenyl, pyridyl or pyrimidinyl.

According to an embodiment of the present disclosure, wherein the second organic material is selected from the group consisting of Compound H-1 to Compound H-176, and for specific structures of Compound H-1 to Compound H-176, reference is made to claim 14.

According to an embodiment of the present disclosure, wherein the LUMO energy level of the first organic material is greater than or equal to 5.36 eV.

According to an embodiment of the present disclosure, wherein the LUMO energy level of the first organic material is greater than or equal to 5.49 eV.

According to an embodiment of the present disclosure, wherein the LUMO energy level of the first organic material is greater than or equal to 5.69 eV.

According to an embodiment of the present disclosure, wherein the HOMO energy level of the second organic material is greater than or equal to 5.21 eV.

According to an embodiment of the present disclosure, wherein the LUMO energy level of the third organic material is greater than or equal to 5.36 eV.

According to an embodiment of the present disclosure, wherein the LUMO energy level of the third organic material is greater than or equal to 5.49 eV.

According to an embodiment of the present disclosure, wherein the LUMO energy level of the third organic material is greater than or equal to 5.69 eV.

According to an embodiment of the present disclosure, wherein the charge generation layer further comprises a metal layer.

According to an embodiment of the present disclosure, wherein a metal in the metal layer is selected from the group consisting of: Yb, Li, Na, K, Rb, Cs, Fr, Be, Mg, Ca, Sr, Ba, Ra, La, Ce, Pr, Nd, Sm, Eu, Tb, Th, Dy, Ho, Er, Em, Gd, Lu, Y, Mn, Ag, and combinations thereof.

According to an embodiment of the present disclosure, wherein the metal layer is formed by deposition of one elemental metal or is formed by co-deposition of two or more elemental metals.

Herein, the metal of the metal layer may be an elemental metal, that is, a metal having a purity greater than 99%, such as metal Yb having a purity greater than 99%. The metal of the metal layer may also be formed by co-deposition of two or more metals, wherein the purity of each metal is grated than 99%. The expression that the purity of each metal is greater than 99% is intended to mean that when the metal in the metal layer is a single metal, the purity of this metal is greater than 99%; when the metal in the metal layer is multiple metals, the purity of each metal during the deposition is greater than 99%.

According to an embodiment of the present disclosure, wherein the light-emitting unit further comprises a second organic layer disposed between the first organic layer and the emissive layer, the second organic layer comprises the second organic material, and the second organic layer is in contact with the emissive layer.

According to an embodiment of the present disclosure, wherein the first organic material and the third organic material are an identical compound.

According to an embodiment of the present disclosure, wherein, among the light-emitting units, at least two light-emitting units each comprise the first organic material and the second organic material, and the first organic material comprised in the at least two light-emitting units is identical, and the second organic material comprised in the at least two light-emitting units is identical.

According to an embodiment of the present disclosure, wherein the first organic layer is in contact with an anode, or the first organic layer is in contact with the buffer layer.

According to an embodiment of the present disclosure, wherein the weight proportion of the first organic material comprised in the first organic layer is not greater than 5% of the entire first organic layer.

According to an embodiment of the present disclosure, wherein the weight proportion of the first organic material comprised in the first organic layer is not greater than 3% of the entire first organic layer.

According to an embodiment of the present disclosure, wherein the weight proportion of the first organic material comprised in the first organic layer is not greater than 2% of the entire first organic layer.

According to an embodiment of the present disclosure, wherein the weight proportion of the first organic material comprised in the first organic layer is not greater than 1% of the entire first organic layer.

According to an embodiment of the present disclosure, a display assembly is further disclosed. The display assembly comprises the organic electroluminescent device described in any of the above-mentioned embodiments.

The schematic diagram of the stacked or monolayer organic electroluminescent device provided by the embodiment of the present disclosure is illustrative but non-limiting, the diagrams are not necessarily drawn to scale, and some layer structures in the diagrams can be added or omitted as required. The substrate of the devices can be manufactured on various substrates, such as glass, plastic and metal. The properties and functions of various layers, as well as example materials, are described in more detail in U.S. Pat. No. 7,279,704 B2 at cols. 6-10, the content of which is incorporated by reference herein in its entirety.

The device fabricated in accordance with the embodiments of the present disclosure can be incorporated into a variety of consumer products that have one or more of the electronic component modules (or units) of the device. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

In the present disclosure, a P-type material having a deep LUMO energy level (for example, Compound 1-70, whose LUMO energy level is around 5.49 eV) and a hole transporting material with a deep HOMO energy level (for example Compound H-24, whose HOMO energy level is around 5.21 eV) are co-deposited to form a hole injection layer, and then this hole transporting material is used as a hole transporting layer on which an emissive layer and an electron transporting layer are directly deposited. Since the energy levels are more matched, film layers and materials are reduced so that the voltage of the device is reduced, the lifetime is prolonged, and the process is simplified. In a monolayer device, which such a simple structure, minimal organic materials, that is, six types of organic materials, can be used, including a P-type material layer, hole injection layer, host material, luminescent material, electron transporting material, and electron injection material, while in the structure of the existing commercial devices, at least seven types of materials are required, including a P-type material layer, hole injection layer, Prime layer (or electron blocking layer), host material, luminescent material, electron transporting material, and electron injection material. If a hole blocking layer is added, seven types of organic materials are required in the simple structure disclosed in the present disclosure while eight types of organic materials are required in the structure of existing commercial devices.

In particular, the advantages of such a simple structure in stacked devices are more significant. This is because the current efficiency of stacked devices is doubled compared with that of monolayer devices. However, the voltage also increases correspondingly, and if the voltage of a single light-emitting unit can be reduced, the voltage of the whole stacked device can be reduced exponentially. Meanwhile, stacked devices are especially suitable for applications with higher requirements for device lifetime, such as large-size televisions or lighting, so the prolonging of the lifetime of a single light-emitting layer can also prolong the lifetime of the whole stacked device. Further, in the charge generation layer used in stacked devices, a P-type material with a deep LUMO energy level can also be used as the buffer layer, and such a material can then be used as a doped material and then co-deposited with a hole transporting material with a deep HOMO energy level to form a hole injection layer of the next unit. In this manner, the demand for deposition sources can be greatly reduced in process and preparation, the preparation efficiency can be improved due to the process simplification, and the defects generated at the interface can be reduced due to the reduction of materials used, thereby further prolonging the lifetime.

Herein, the HOMO energy levels of some hole transporting materials are listed in the following table.

| Material | HOMO (eV) | LUMO (eV) |
| --- | --- | --- |
| Compound HT | 4.99 | 1.30 |
| Compound H-124 | 5.21 | 1.35 |
| Compound H-176 | 5.21 | 1.40 |

Herein, the LUMO energy levels of some P-type materials are listed in the following table.

| Material | HOMO (eV) | LUMO (eV) |
| --- | --- | --- |
| Compound HATCN | — | 4.81 |
| Compound 2-12 | — | 5.49 |
| Compound 1-70 | — | 5.69 |
| Compound 3-68 | — | 5.36 |

EXAMPLE

Hereinafter, the present disclosure will be described in more detail with reference to the following examples. The compounds used in the following examples can be easily obtained by those skilled in the art, so synthesis methods of these compounds will not be repeated herein. For example, these compounds can be found in Chinese patent applications CN201911046002.3 and CN2020106981266, the contents of which are incorporated by reference herein their entireties. Apparently, the following examples are only for illustrative purposes and are not intended to limit the scope of the present disclosure. Based on the following examples, those skilled in the art can obtain other examples of the present disclosure by conducting improvements on the following examples.

Example 1-1: Preparation of a Two-Layer Red Stacked Organic Electroluminescent Device 100, As Shown in FIG. 1

First, a glass substrate having a thickness of 0.7 mm, on which an Indium Tin Oxide (ITO) anode 110 with a thickness of 120 mm had been patterned, was washed with deionized water and detergent, and then the surface of the ITO anode was treated with oxygen plasma and UV ozone. Then, the substrate was dried in a glovebox to remove moisture, loaded on a support, and transferred into a vacuum chamber. Organic layers specified below were sequentially deposited through vacuum thermal evaporation on the ITO anode layer at a rate of 0.1 to 10 Angstroms per second at a vacuum degree of about $10^{-6}$ torr. A first light-emitting unit 130a was first deposited in the following sequence: Compound H-124 and Compound 1-70 were deposited simultaneously to form a hole injection layer 131a (HIL, with a weight ratio of 97:3, 100 Å), Compound H-124 was deposited to form a hole transporting layer 132a (HTL, 450 Å), Compound RH and Compound RD were deposited simultaneously to form a red emissive layer 133a (EML, with a weight ratio of 98:2, 400 Å), Compound HB was deposited to form a hole blocking layer 134a (HBL, 50 Å), and Compound ET and Liq were co-deposited to form an electron transporting layer 135a (ETL, with a weight ratio of 40:60, 350 Å). After that, sequentially, metal Yb (50 Å) was deposited as a metal layer 140a of a charge generation layer 140, and Compound 1-70 (30 Å) was deposited as a buffer layer 140b of the charge generation layer 140. Then the second light-emitting unit 130b was deposited in the following sequence: Compound H-124 and Compound 1-70 were deposited simultaneously to form a hole injection layer 131b (HIL, with a weight ratio of 97:3, 100 Å), Compound H-124 was deposited to form a hole transporting layer 132b (HTL, 750 Å), Compound RH and Compound RD were deposited simultaneously to form a red emissive layer 133b (EML, with a weight ratio of 98:2, 400 Å), Compound HB was deposited to form a hole blocking layer 134b (HBL, 50 Å), and Compound ET and Liq were co-deposited to form an electron transporting layer 135b (ETL, with a weight ratio of 40:60, 350 Å). Finally, Liq with a thickness of 10 Å was deposited as an electron injection layer 136b (EIL), and aluminum with a thickness of 120 nm was deposited as a cathode 120. The device was then transferred back to the glove box and encapsulated with a glass lid to complete the fabrication of the device.

It is noted that the above device structure is only for an illustrative propose and is not limited to the present disclosure. For example, the second light-emitting unit 130b may use luminescent materials of other colors and host compounds as well as corresponding mating transporting materials and device structures. However, preferably, the second light-emitting unit also adopts the simple structure of the first light-emitting unit.

The structures of Compound H-124, Compound 1-70, Compound RH, Compound RD, Compound HB, Compound ET, and Liq are as follows:

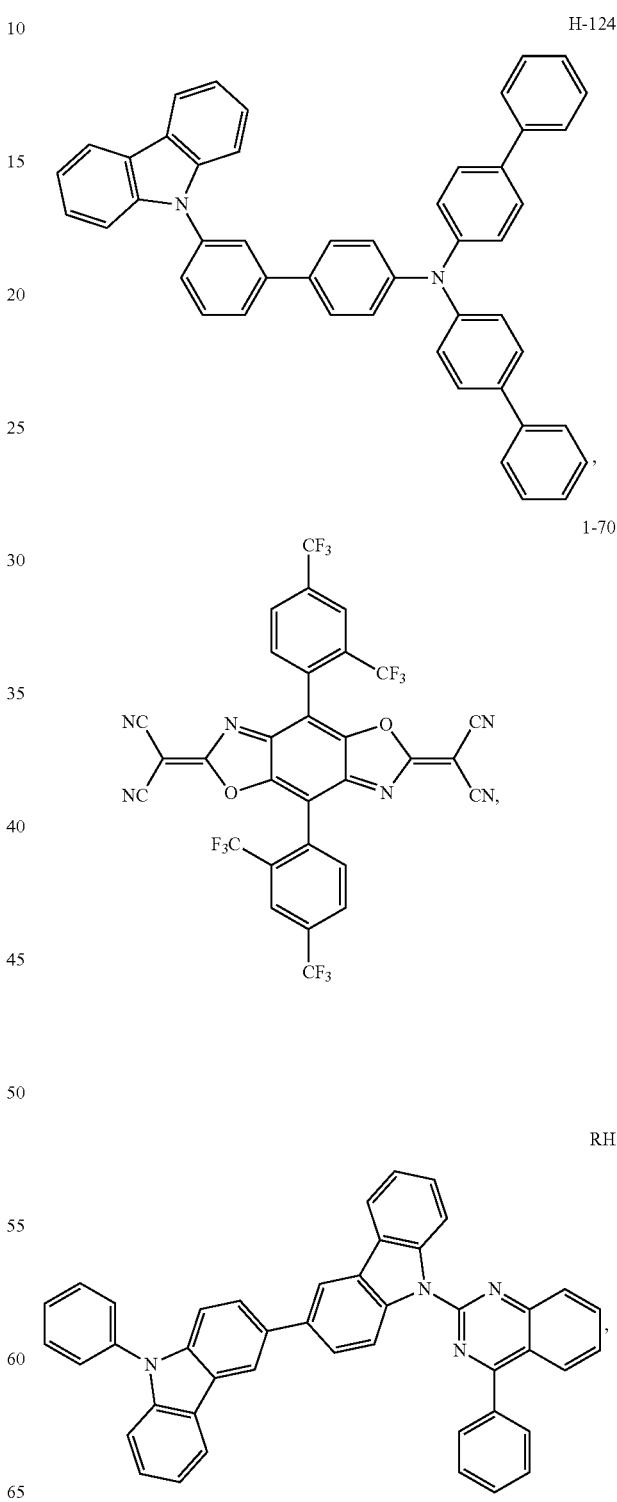

RD

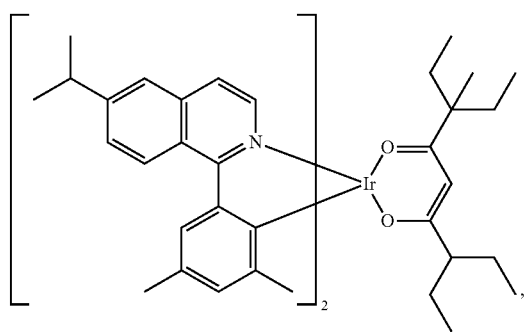

HB

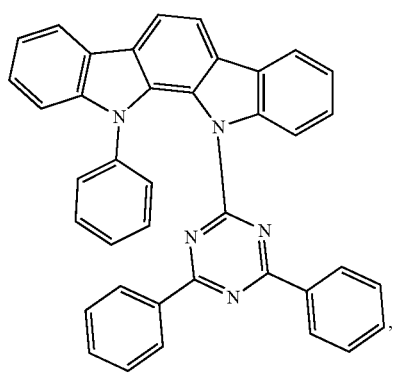

ET

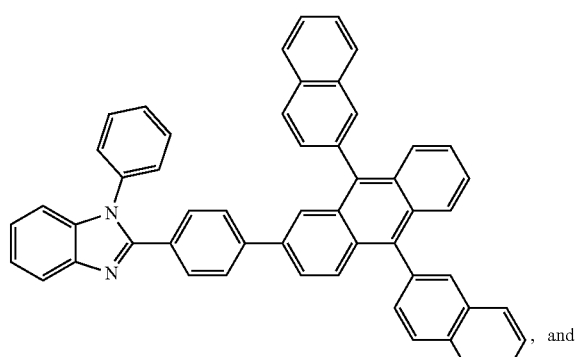
, and

Liq

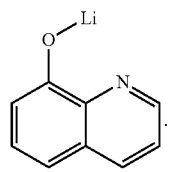
.

Comparative Example 1-1: this comparative example adopts the same preparation method as in Example 1-1, except that: 1) in the first light-emitting unit, the hole injection layer of the first light-emitting unit in Example 1-1 was replaced with a hole injection layer formed by simultaneously depositing Compound HT and Compound 1-70 (HIL, with a weight ratio of 97:3, 100 Å), and the hole transporting layer of the first light-emitting unit in Example 1-1 was replaced with a hole transporting layer formed by depositing Compound HT (HTL, 400 Å) and a second hole transporting layer formed by depositing Compound H-124 before the deposition of the emissive layer (HTL2, 50 Å); 2) in the second light-emitting unit, the hole injection layer of the second light-emitting unit in Example 1-1 was replaced with a hole injection layer formed by simultaneously depositing Compound HT and Compound 1-70 (HIL, with a weight ratio of 97:3, 100 Å), and the hole transporting layer of the second light-emitting unit in Example 1-1 was replaced with a hole transporting layer formed by depositing Compound HT (HTL, 700 Å) and a second hole transporting layer formed by depositing Compound H-124 before the deposition of the emissive layer (HTL2, 50 Å). The structure of Compound HT is as follows:

HT

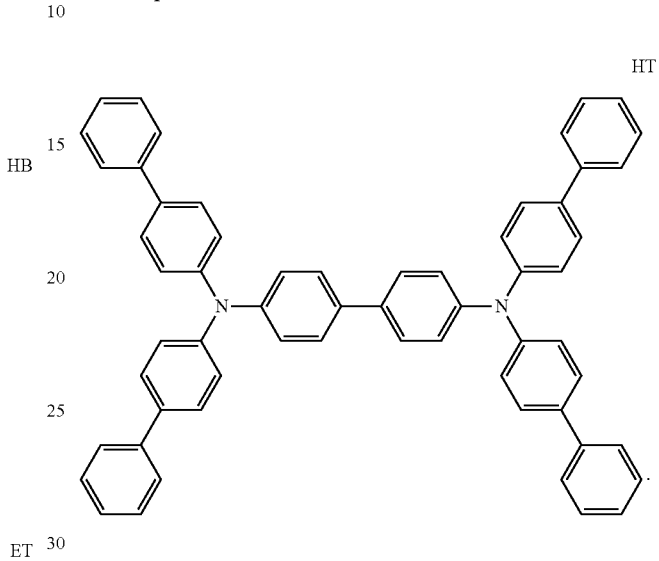

Figure 2:
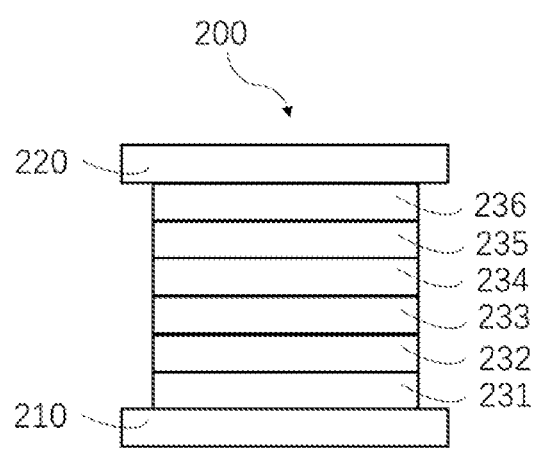
FIG. 2 is a schematic diagram of a monolayer organic electroluminescent device disclosed by the present disclosure.

Comparative Example 1-2: Preparation of a Red Monolayer Organic Electroluminescent Device 200, As Shown in FIG. 2

First, a glass substrate having a thickness of 0.7 mm, on which an ITO anode 210 with a thickness of 120 mm had been patterned, was washed with deionized water and detergent, and then the surface of the ITO anode was treated with oxygen plasma and UV ozone. Then, the substrate was dried in a glovebox to remove moisture, loaded on a support and transferred into a vacuum chamber. Organic layers specified below were sequentially deposited through vacuum thermal evaporation on the ITO anode layer at a rate of 0.1 to 10 Angstroms per second at a vacuum degree of about $10^{-6}$ torr. Compound H-124 and Compound 1-70 were deposited simultaneously to form a hole injection layer 231 (HIL, with a weight ratio of 97:3, 100 Å), Compound H-124 was deposited to form a hole transporting layer 232 (HTL, 450 Å), Compound RH and Compound RD were deposited simultaneously to form an emissive layer 233 (EML, with a weight ratio of 98:2, 400 Å), Compound HB was deposited to form a hole blocking layer 234 (HBL, 50 Å), and Compound ET and Liq were co-deposited to form an electron transporting layer 235 (ETL, with a weight ratio of 40:60, 350 Å). Finally, Liq with a thickness of 10 Å was deposited as an electron injection layer 236 (EIL), and aluminum with a thickness of 120 nm was deposited as a cathode 220. The device was then transferred back to the glove box and encapsulated with a glass lid to complete the fabrication of the device.

Comparative Example 1-3: this comparative example adopts the same preparation method as in Comparative Example 1-2, except that the hole injection layer in Comparative Example 1-2 was replaced with a hole injection layer formed by simultaneously depositing Compound HT and Compound 1-70 (HIL, with a weight ratio of 97:3, 100

Å), and the hole transporting layer in Comparative Example 1-2 was replaced with a hole transporting layer formed by depositing Compound HT (HTL, 400 Å) and a second hole transporting layer formed by depositing Compound H-124 before the deposition of the emissive layer (HTL2, 50 Å).

TABLE 1

Part structure of devices of Example 1-1 and Comparative Examples 1-1, 1-2, and 1-3

| Device No. | First light-emitting unit | | | Buffer layer | Second light-emitting unit | | |
|---|---|---|---|---|---|---|---|
| | HIL | HTL | HTL2 | | HIL | HTL | HTL2 |
| Example 1-1 | H-124:1-70 | H-124 | | 1-70 | H-124:1-70 | H-124 | |
| Comparative Example 1-1 | HT1-70 | HT | H-124 | 1-70 | HT1-70 | HT | H-124 |
| Comparative Example 1-2 | H-124:1-70 | H-124 | | — | — | — | — |
| Comparative Example 1-3 | HT1-70 | HT | H-124 | — | — | — | — |

The performance of devices of Example 1-1 and Comparative Examples 1-1, 1-2, and 1-3 is listed in Table 2. The chromaticity coordinates, voltage and efficiency were measured at the current density of 10 mA/cm$^2$, and the lifetime (LT95) of the device was the lifetime data at the brightness of 7000 cd/m$^2$, which was calculated from the measured time for the brightness to decay to 95% of initial brightness under the driving of 80 mA/cm$^2$ with an attenuation factor of 2.0.

TABLE 2

Performance of devices of Example 1-1 and Comparative Examples 1-1, 1-2, and 1-3

| | At 10 mA/cm$^2$ | | | | At 7000 cd/m$^2$ |
|---|---|---|---|---|---|
| Device No. | CIEx | CIEy | Voltage [V] | Efficiency EQE [%] | LT95 [h] |
| Example 1-1 | 0.684 | 0.315 | 9.0 | 48.0 | 2251 |
| Comparative Example 1-1 | 0.684 | 0.315 | 9.1 | 48.3 | 1801 |
| Comparative Example 1-2 | 0.682 | 0.317 | 4.5 | 23.3 | 597 |
| Comparative Example 1-3 | 0.682 | 0.317 | 4.6 | 23.7 | 567 |

Figure 3:
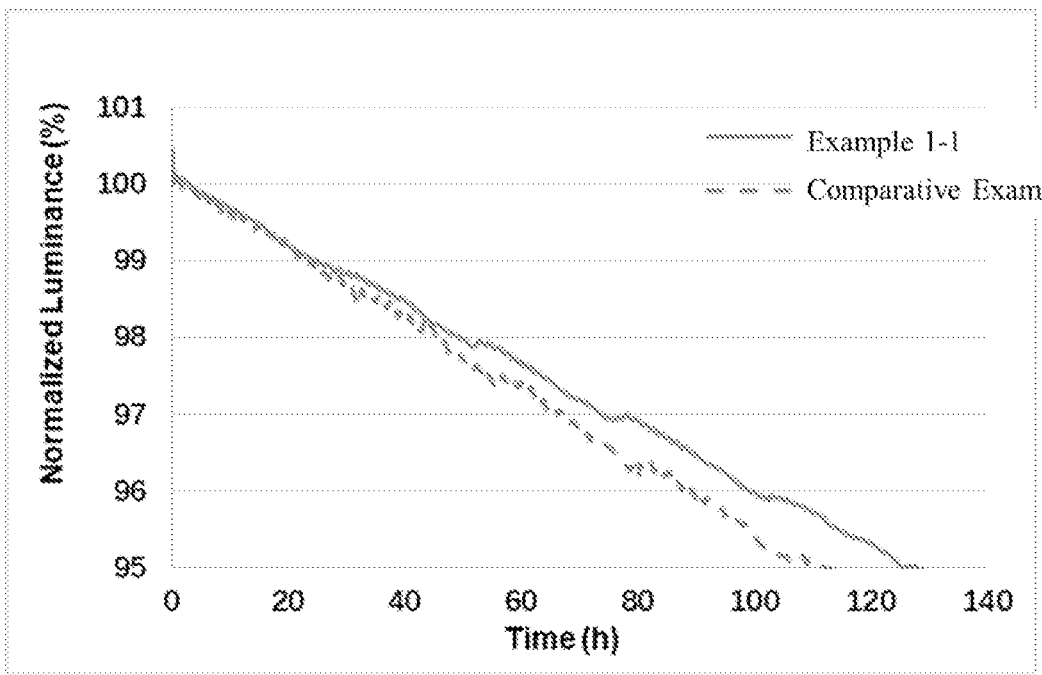
FIG. 3 is a lifetime curve of devices of Example 1-1 and Comparative Example 1-1 measured at J=80 mA/cm$^2$.

Example 1-1 provided a red stacked organic light-emitting device, wherein in the first and second light-emitting units, Compound 1-70 with a LUMO energy level of 5.69 eV was used as the P-type material and doped into the hole transporting material Compound H-124 with a HOMO energy level of 5.21 eV. Comparative Example 1-1 also provided a red stacked organic light-emitting device, wherein in the first and second light-emitting units, Compound 1-70 with a LUMO energy level of 5.69 eV was used as the P-type material and doped into the hole transporting material Compound HT with a HOMO energy level of 4.99 eV, and Compound H-124 was deposited to form the second hole transporting layer (HTL2, 50 Å) before the deposition of the emissive layer. The color, voltage, and efficiency of the two light-emitting devices were basically equivalent, but the lifetime of the device of Example 1-1 was increased by nearly 25% compared with the lifetime of the device of Comparative Example 1-1, as shown in FIG. 3. Comparative Examples 1-2 and 1-3 each provided a red monolayer organic light-emitting device. In Comparative Example 1-2, Compound 1-70 with a LUMO energy level of 5.69 eV was used as the P-type material and doped into the hole transporting material Compound H-124 with a HOMO energy level of 5.21 eV. In Comparative Example 1-3, Compound 1-70 with a LUMO energy level of 5.69 eV was used as the P-type material and doped into the hole transporting material Compound HT with a HOMO energy level of 4.99 eV, and Compound H-124 was deposited to form the second hole transporting layer (HTL2, 50 Å) before the deposition of the emissive layer. The color, voltage, and efficiency of the two light-emitting devices were basically equivalent, but the lifetime of the device of Comparative Example 1-2 was increased by 5% compared with the lifetime of the device of Comparative Example 1-3. It is shown that the combination of the hole transporting material with a deep HOMO energy level and the P-type material with a deep LUMO energy level facilitates the injection and transporting of holes and enables the transporting of carriers to be more balanced; meanwhile, due to the reduction of hole transporting interface layers, the deposition process is simplified, and finally, the lifetime of the device is prolonged. Moreover, the lifetime of red monolayer devices was increased by 5% while the lifetime of red stacked devices was increased by 25%, which shows that in the stacked structure combining the hole transporting material with a deep HOMO energy level and the P-type material with a deep LUMO energy level, the lifetime is more significantly prolonged due to the exponential reduction of interfaces.

Example 2-1: Preparation of Another Red Stacked Organic Electroluminescent Device This example adopts the same preparation method as in Example 1-1, except that: 1) in the first light-emitting unit, the hole injection layer of the first light-emitting unit in Example 1-1 was replaced with a hole injection layer formed by simultaneously depositing Compound H-176 and Compound 1-70 (HIL, with a weight ratio of 97:3, 100 Å), and the hole transporting layer of the first light-emitting unit in Example 1-1 was replaced with a hole transporting layer formed by depositing Compound H-176 (HTL, 450 Å); 2) in the second light-emitting unit, the hole injection layer of the second light-emitting unit in Example 1-1 was replaced with a hole injection layer formed by simultaneously depositing Compound H-176 and Compound 1-70 (HIL, with a weight ratio of 97:3, 100 Å), and the hole transporting layer of the second light-emitting unit in Example 1-1 was replaced with a hole transporting layer formed by depositing Compound H-176 (HTL, 750 Å). The structure of Compound H-176 is as follows:

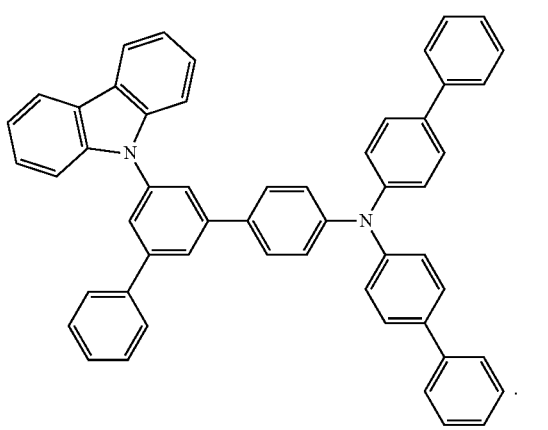

H-176 layer formed by simultaneously depositing Compound H-176 and Compound 1-70 (HIL, with a weight ratio of 97:3, 100 Å), and the hole transporting layer in Comparative Example 1-2 was replaced with a hole transporting layer formed by depositing Compound H-176 (HTL, 450 Å).

Comparative Example 2-3: this comparative example adopts the same preparation method as in Comparative Example 2-2, except that the hole injection layer in Comparative Example 2-2 was replaced with a hole injection layer formed by simultaneously depositing Compound HT and Compound 1-70 (HIL, with a weight ratio of 97:3, 100 Å), and the hole transporting layer in Comparative Example 2-2 was replaced with a hole transporting layer formed by depositing Compound HT (HTL, 400 Å) and a second hole transporting layer formed by depositing Compound H-176 before the deposition of the emissive layer (HTL2, 50 Å).

TABLE 3

Part structure of devices of Example 2-1 and Comparative Examples 2-1, 2-2, and 2-3

| Device No. | First light-emitting unit | | | Buffer layer | Second light-emitting unit | | |
|---|---|---|---|---|---|---|---|
| | HIL | HTL | HTL2 | | HIL | HTL | HTL2 |
| Example 2-1 | H-176:1-70 | H-176 | | 1-70 | H-176:1-70 | H-176 | |
| Comparative Example 2-1 | HT1-70 | HT | H-176 | 1-70 | HT1-70 | HT | H-176 |
| Comparative Example 2-2 | H-176:1-70 | H-176 | | — | — | — | — |
| Comparative Example 2-3 | HT1-70 | HT | H-176 | — | — | — | — |

Comparative Example 2-1: this comparative example adopts the same preparation method as in Example 2-1, except that: 1) in the first light-emitting unit, the hole injection layer of the first light-emitting unit in Example 2-1 was replaced with a hole injection layer formed by simultaneously depositing Compound HT and Compound 1-70 (HIL, with a weight ratio of 97:3, 100 Å), and the hole transporting layer of the first light-emitting unit in Example 2-1 was replaced with a hole transporting layer formed by depositing Compound HT (HTL, 400 Å) and a second hole transporting layer formed by depositing Compound H-176 before the deposition of the emissive layer (HTL2, 50 Å); 2) in the second light-emitting unit, the hole injection layer of the second light-emitting unit in Example 2-1 was replaced with a hole injection layer formed by simultaneously depositing Compound HT and Compound 1-70 (HIL, with a weight ratio of 97:3, 100 Å), and the hole transporting layer of the second light-emitting unit in Example 2-1 was replaced with a hole transporting layer formed by depositing Compound HT (HTL, 700 Å) and a second hole transporting layer formed by depositing Compound H-176 before the deposition of the emissive layer (HTL2, 50 Å).

Comparative Example 2-2: this comparative example adopts the same preparation method as in Comparative Example 1-2, except that the hole injection layer in Comparative Example 1-2 was replaced with a hole injection The performance of devices of Example 2-1 and Comparative Examples 2-1, 2-2, and 2-3 is listed in Table 4. The chromaticity coordinates, voltage and efficiency were measured at the current density of 10 mA/cm$^2$, and the lifetime (LT95) of the device was the lifetime data at the brightness of 7000 cd/m$^2$, which was calculated from the measured time for the brightness to decay to 95% of initial brightness under the driving of 80 mA/cm$^2$ with an attenuation factor of 2.0.

TABLE 4

Performance of devices of Example 2-1 and Comparative Examples 2-1, 2-2, and 2-3

| | At 10 mA/cm$^2$ | | | | At 7000 cd/m$^2$ |
|---|---|---|---|---|---|
| Device No. | CIEx | CIEy | Voltage [V] | Efficiency EQE [%] | LT95 [h] |
| Example 2-1 | 0.684 | 0.315 | 9.1 | 49.3 | 2194 |
| Comparative Example 2-1 | 0.684 | 0.315 | 9.1 | 48.3 | 1801 |
| Comparative Example 2-2 | 0.681 | 0.318 | 4.6 | 23.9 | 651 |
| Comparative Example 2-3 | 0.682 | 0.317 | 4.5 | 23.9 | 545 |

Figure 4:
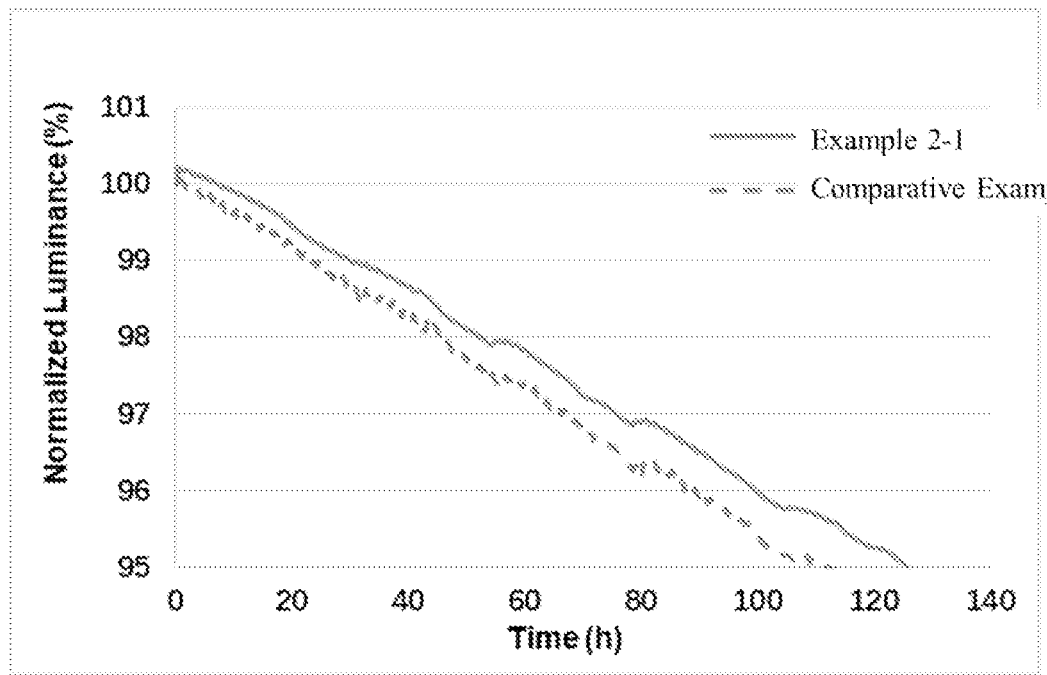
FIG. 4 is a lifetime curve of devices of Example 2-1 and Comparative Example 2-1 measured at J=80 mA/cm$^2$.

Example 2-1 provided another red stacked organic light-emitting device, wherein in the first and second light-emitting units, Compound 1-70 with a LUMO energy level of 5.69 eV was used as the P-type material and doped into the hole transporting material Compound H-176 with a HOMO energy level of 5.21 eV. Comparative Example 2-1 also provided a red stacked organic light-emitting device, wherein in the first and second light-emitting units, Compound 1-70 with a LUMO energy level of 5.69 eV was used as the P-type material and doped into the hole transporting material Compound HT with a HOMO energy level of 4.99 eV, and Compound H-176 was deposited to form the second hole transporting layer (HTL2, 50 Å) before the deposition of the emissive layer. The color and voltage of the two light-emitting devices were basically equivalent, but the lifetime of the device of Example 2-1 was increased by nearly 22% compared with the lifetime of the device of Comparative Example 2-1, as shown in FIG. 4, and the external quantum efficiency (EQE) of the device of Example 2-1 was increased by 2%. Comparative Examples 2-2 and 2-3 each provided a red monolayer organic light-emitting device. In Comparative Example 2-2, Compound 1-70 with a LUMO energy level of 5.69 eV was used as the P-type material and doped into the hole transporting material Compound H-176 with a HOMO energy level of 5.21 eV. In Comparative Example 2-3, Compound 1-70 with a LUMO energy level of 5.69 eV was used as the P-type material and doped into the hole transporting material Compound HT with a HOMO energy level of 4.99 eV, and Compound H-176 was deposited to form the second hole transporting layer (HTL2, 50 Å) before the deposition of the emissive layer. The color, voltage, and efficiency of the two light-emitting devices were basically equivalent, but the lifetime of the device of Comparative Example 2-2 was increased by 19% compared with the lifetime of the device of Comparative Example 2-3. Therefore, it is also shown that the combination of the hole transporting material with a deep HOMO energy level and the P-type material with a deep LUMO energy level facilitates the injection and transporting of holes and enables the transporting of carriers to be more balanced; meanwhile, due to the reduction of hole transporting interface layers, the deposition process is simplified, and finally the lifetime of the device is prolonged. Similarly, the lifetime of red monolayer devices was increased by 19% while the lifetime of red stacked devices was increased by 22%, which shows that the combination of the hole transporting material with a deep HOMO energy level and the P-type material with a deep LUMO energy level can more significantly prolong the lifetime of the device with the stacked structure.

Example 3-1: Preparation of Another Red Stacked Organic Electroluminescent Device This example adopts the same preparation method as in Example 1-1, except that: 1) in the first light-emitting unit, the hole injection layer of the first light-emitting unit in Example 1-1 was replaced with a hole injection layer formed by simultaneously depositing Compound H-176 and Compound 1-70 (HIL, with a weight ratio of 97:3, 100 Å), and the hole transporting layer of the first light-emitting unit in Example 1-1 was replaced with a hole transporting layer formed by depositing Compound H-176 (HTL, 450 Å); 2) in the second light-emitting unit, the hole injection layer of the second light-emitting unit in Example 1-1 was replaced with a hole injection layer formed by simultaneously depositing Compound H-176 and Compound 1-70 (HIL, with a weight ratio of 97:3, 100 Å), and the hole transporting layer of the second light-emitting unit in Example 1-1 was replaced with a hole transporting layer formed by depositing Compound H-176 (HTL, 750 Å); 3) in the buffer layer, Compound 1-70 was replaced with Compound 3-68. The structure of Compound 3-68 is as follows:

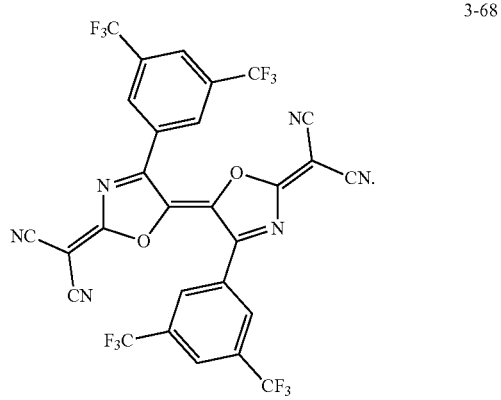 [SMILES: N#CC(C#N)=c1nc(-c2cc(C(F)(F)F)cc(C(F)(F)F)c2)/c(=c2\oc(=C(C#N)C#N)nc2-c2cc(C(F)(F)F)cc(C(F)(F)F)c2)o1]

3-68

Comparative Example 3-1: this comparative example adopts the same preparation method as in Example 3-1, except that: 1) in the first light-emitting unit, the hole injection layer of the first light-emitting unit in Example 3-1 was replaced with a hole injection layer formed by simultaneously depositing Compound HT and Compound 1-70 (HIL, with a weight ratio of 97:3, 100 Å), and the hole transporting layer of the first light-emitting unit in Example 3-1 was replaced with a hole transporting layer formed by depositing Compound HT (HTL, 400 Å) and a second hole transporting layer formed by depositing Compound H-176 before the deposition of the emissive layer (HTL2, 50 Å); 2) in the second light-emitting unit, the hole injection layer of the second light-emitting unit in Example 3-1 was replaced with a hole injection layer formed by simultaneously depositing Compound HT and Compound 1-70 (HIL, with a weight ratio of 97:3, 100 Å), and the hole transporting layer of the second light-emitting unit in Example 3-1 was replaced with a hole transporting layer formed by depositing Compound HT (HTL, 700 Å) and a second hole transporting layer formed by depositing Compound H-176 before the deposition of the emissive layer (HTL2, 50 Å).

TABLE 5

| Part structure of devices of Example 3-1 and Comparative Example 3-1 | | | | | | | |
|---|---|---|---|---|---|---|---|
| | First light-emitting unit | | | Buffer | Second light-emitting unit | | |
| Device No. | HIL | HTL | HTL2 | layer | HIL | HTL | HTL2 |
| Example 3-1 | H-176:1-70 | H-176 | | 3-68 | H-176:1-70 | H-176 | |
| Comparative Example 3-1 | HT1-70 | HT | H-176 | 3-68 | HT1-70 | HT | H-176 |

The performance of devices of Example 3-1 and Comparative Example 3-1 is listed in Table 6. The chromaticity coordinates, voltage and efficiency were measured at the current density of 10 mA/cm$^2$, and the lifetime (LT95) of the device was the lifetime data at the brightness of 7000 cd/m$^2$, which was calculated from the measured time for the brightness to decay to 95% of initial brightness under the driving of 80 mA/cm$^2$ with an attenuation factor of 2.0.

TABLE 6

Performance of devices of Example 3-1 and Comparative Example 3-1

| Device No. | At 10 mA/cm$^2$ | | | | At 7000 cd/m$^2$ |
| --- | --- | --- | --- | --- | --- |
| | CIEx | CIEy | Voltage [V] | Efficiency EQE [%] | LT95 [h] |
| Example 3-1 | 0.684 | 0.315 | 8.9 | 50.4 | 2589 |
| Comparative Example 3-1 | 0.684 | 0.315 | 8.7 | 49.6 | 1893 |

Figure 5:
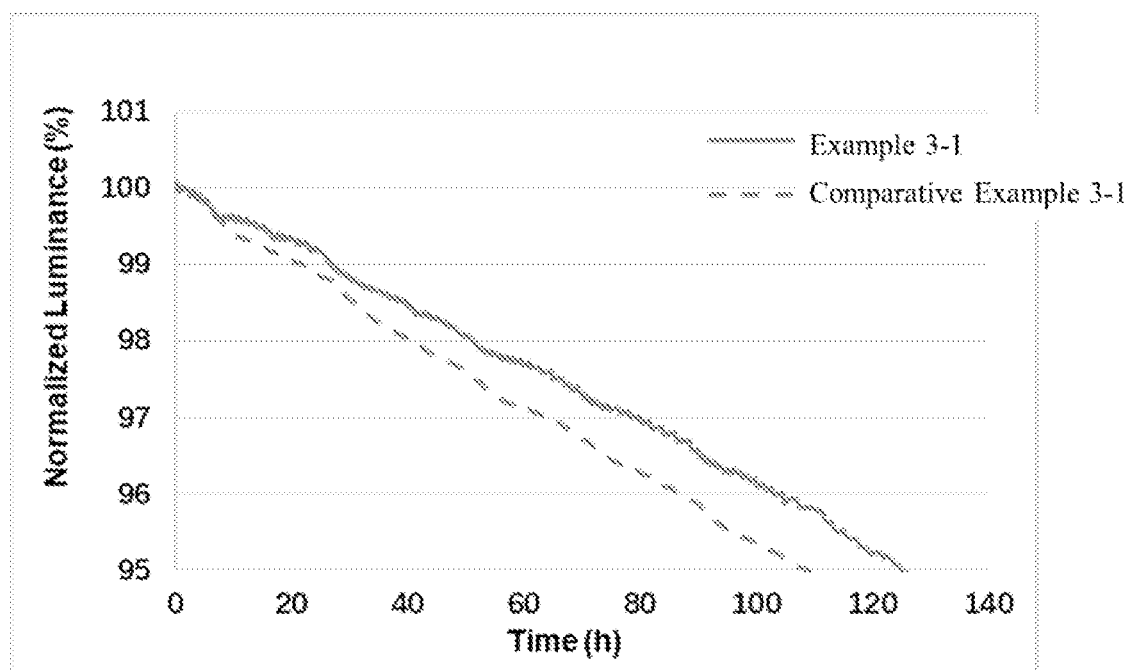
FIG. 5 is a lifetime curve of devices of Example 3-1 and Comparative Example 3-1 measured at J=80 mA/cm$^2$.

Example 3-1 provided another red stacked organic light-emitting device, wherein in the first and second light-emitting units, Compound 1-70 with a LUMO energy level of 5.69 eV was used as the P-type material and doped into the hole transporting material Compound H-176 with a HOMO energy level of 5.21 eV, and in the organic layer of the charge generation layer, Compound 3-68 with a LUMO energy level of 5.36 eV was used as the buffer layer. Comparative Example 3-1 also provided a red series stacked organic light-emitting device, wherein in the first and second light-emitting units, Compound 1-70 with a LUMO energy level of 5.69 eV was used as the P-type material and doped into the hole transporting material Compound HT with a HOMO energy level of 4.99 eV, Compound H-176 was deposited to form the second hole transporting layer (HTL2, 50 Å) before the deposition of the emissive layer, and Compound 3-68 was used as the buffer layer in the organic layer of the charge generation layer. Compared with the device of Comparative Example 3-1, the color and voltage of the device of Example 3-1 were basically equivalent to those of the device of Comparative Example 3-1, the efficiency was slightly increased, but the lifetime was increased by 37% under the same conditions, as shown in FIG. 5. It is also shown that the combination of the hole transporting material with a deep HOMO energy level and the P-type material with a deep LUMO energy level can greatly prolong the lifetime of the device with the stacked structure.

As can be seen from the above data, in one aspect, in the simple device structure, in order to match the HOMO energy level of the emissive layer, a transporting material with a deep HOMO energy level is required to be used and the HOMO energy level needs to be greater than 4.99 eV, preferably greater than or equal to 5.21 eV. In another aspect, for a compound with a deep HOMO energy level, a P-type material with a deep LUMO energy level is required to be combined with such a compound as a hole injection layer, and the LUMO energy level needs to be greater than 4.90 eV, preferably greater than or equal to 5.36 eV, more preferably greater than or equal to 5.69 eV, because when a P-type material with a shallow LUMO energy level is combined with a material with a deep HOMO energy level as the hole injection layers, the matching performance is poor, and the hole injection ability is weak, which leads to the increase of the device voltage and the increase of the voltage of the whole device when the light-emitting units in the stacked device adopt this type of device structure. In practical application, when a hole transporting compound is combined with a P-type material as the hole injection layer, the weight ratio of the P-type material to the hole injection layer is generally not greater than 5% while the ratio adopted in the present disclosure is 3%; for a hole transporting compound with a deep HOMO energy level, when a material with a deep LUMO energy level is combined, the ratio of such a material is 3% or 2%, and when a material with a shallow LUMO energy level is combined, the ratio of such a material is also 3% or 2%, which will lead to the increase of the device voltage due to poor hole injection. To sum up, compared with the conventional device with a stacked structure as shown in Comparative Examples 1-1, 2-1, and 3-1, with the use of the simple stacked structure as shown in the devices of Examples 1-1, 2-1, and 3-1, the lifetime the devices with the simple stacked structure of the present disclosure can be greatly prolonged while keeping the voltage basically unchanged and maintaining or slightly increasing the efficiency to a certain extent, and such devices have more advantages in device application.

It should be understood that various embodiments described herein are merely examples and not intended to limit the scope of the present disclosure. Therefore, it is apparent to those skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. An organic electroluminescent device, comprising:
a first electrode,
a second electrode, and
at least two light-emitting units disposed between the first electrode and the second electrode, wherein each light-emitting unit comprises at least one emissive layer;
wherein at least one light-emitting unit comprises a first organic layer comprising a first organic material and a second organic material;
wherein a charge generation layer is disposed between at least one group of adjacent two light-emitting units, and the charge generation layer comprises a buffer layer, wherein the buffer layer comprises a third organic material;
wherein the lowest unoccupied molecular orbital (LUMO) energy level of the first organic material is greater than or equal to the LUMO energy level of the third organic material, and the LUMO energy level of the third organic material is greater than 4.90 eV;
wherein the highest occupied molecular orbital (HOMO) energy level of the second organic material is greater than 4.99 eV.

2. The organic electroluminescent device according to claim 1, wherein the first organic material comprised in the first organic layer is a P-type material, wherein the third organic material comprised in the buffer layer is a P-type material.

3. The organic electroluminescent device according to claim 1, wherein the first organic material comprised in the first organic layer has a structure represented by one of Formula 1, Formula 2, and Formula 3, wherein the third organic material comprised in the buffer layer has a structure represented by one of Formula 1, Formula 2, and Formula 3:

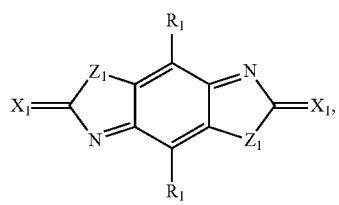

Formula 1 in Formula 1, $X_1$ is, at each occurrence identically or differently, selected from $NR_1'$, $CR_1''R_1'''$, O, S or Se;

$Z_1$ is, at each occurrence identically or differently, selected from O, S or Se;

each $R_1$ can be identical or different, and at least one of $R_1$, $R_1'$, $R_1''$, and $R_1'''$ is a group having at least one electron-withdrawing group;

in Formula 1, adjacent substituents can be optionally joined to form a ring;

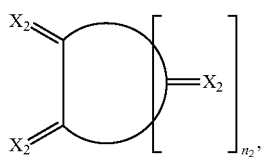

Formula 2 in Formula 2, $n_2$ is an integer from 1 to 4;

$X_2$ is, at each occurrence identically or differently, selected from $NR_2'$, $CR_2''R_2'''$, O, S or Se;

in Formula 2, adjacent substituents can be optionally joined to form a ring;

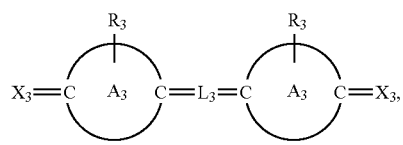

Formula 3 in Formula 3, $L_3$ is, at each occurrence identically or differently, selected from

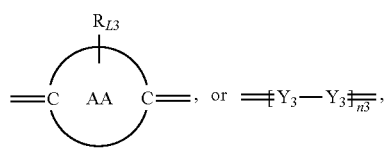

or a combination thereof;

ring AA is a conjugated structure of 4 to 30 ring atoms having at least one intra-ring double bond;

$n_3$ is, at each occurrence identically or differently, selected from integers from 0 to 10;

$Y_3$ is, at each occurrence identically or differently, selected from the group consisting of $CR_{L3}$ and N;

ring $A_3$ is, at each occurrence identically or differently, a 5-membered heterocyclic ring, and the 5-membered heterocyclic ring comprises an intra-ring double bond, at least one N atom, and at least one heteroatom $W_3$; the $W_3$ is, at each occurrence identically or differently, selected from the group consisting of O, S, Se, and $NR_{N3}$;

$X_3$ is, at each occurrence identically or differently, selected from the group consisting of O, S, Se, $NR_3'$, and $CR_3''R_3'''$;

$R_3$ and $R_{L3}$ represent, at each occurrence identically or differently, mono-substitution, multiple substitutions, or non-substitution;

when $L_3$ is selected from

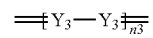

and $n_3=0$, at least one of substituents $R_3$ and $R_{N3}$ is a group having at least one electron-withdrawing group;

when $X_3$ is selected from $NR_3'$ or $CR_3''R_3'''$, at least one of $R_3'$, $R_3''$, and $R_3'''$ is a group having at least one electron-withdrawing group;

adjacent substituents $R_3''$, $R_3'''$ can be optionally joined to form a ring;

adjacent substituents $R_3$, $R_{L3}$ can be optionally joined to form a ring; when adjacent substituents $R_{L3}$ are joined to form a ring, the resulting ring has at least 4 ring atoms; and when adjacent substituents $R_3$ are joined to form a ring, the resulting ring has at least 6 ring atoms;

$R_1$, $R_1'$, $R_1''$, $R_1'''$, $R_2'$, $R_2''$, $R_2'''$, $R_3$, $R_3'$, $R_3''$, $R_3'''$, $R_{L3}$, and $R_{N3}$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, a hydroxyl group, a sulfanyl group, substituted or unsubstituted alkyl having 1 to 20 carbon atoms, substituted or unsubstituted cycloalkyl with 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, and combinations thereof;

preferably, wherein the first organic material comprised in the first organic layer has a structure represented by Formula 1.

4. The organic electroluminescent device according to claim 3, wherein $X_1$ in Formula 1 is, at each occurrence identically or differently, selected from $CR_1''R_1'''$ or $NR_1'$, and $R_1'$, $R_1''$, and $R_1'''$ each are a group having at least one electron-withdrawing group; preferably, $R_1$, $R_1'$, $R_1''$, and $R_1'''$ in Formula 1 each are a group having at least one electron-withdrawing group;

$X_2$ in Formula 2 is, at each occurrence identically or differently, selected from $CR_2''R_2'''$ or $NR_2'$, and $R_2'$, $R_2''$, and $R_2'''$ each are a group having at least one electron-withdrawing group;

$X_3$ in Formula 3 is, at each occurrence identically or differently, selected from $CR_3''R_3'''$ or $NR_3'$, and $R_3'$, $R_3''$, and $R_3'''$ each are a group having at least one electron-withdrawing group;

preferably, at least one of $R_3$, $R_{L3}$, and $R_{N3}$ in Formula 3 is a group having at least one electron-withdrawing group; more preferably, $R_3$, $R_3'$, $R_3''$, $R_3'''$, $R_{L3}$, and $R_{N3}$ in Formula 3 each are a group having at least one electron-withdrawing group.

5. The organic electroluminescent device according to claim 3, wherein

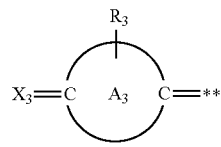

attached to two sides of $L_3$ in Formula 3 is, at each occurrence identically or differently, selected from any of the following structures:

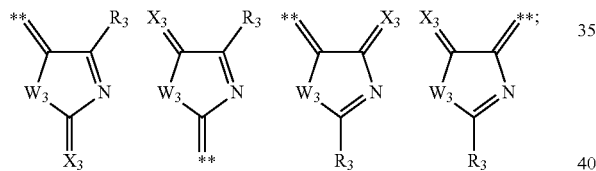

wherein $X_3$, $W_3$, and $R_3$ have the same meanings as defined in claim 3;

"**\*\***" represents a position where the structure is attached to $L_3$ in Formula 3.

6. The organic electroluminescent device according to claim 3, wherein the first organic material and the third organic material are each independently selected from a structure represented by one of Formula 2-1 and Formula 3-1 to Formula 3-18:

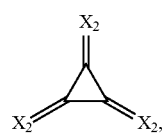

Formula 2-1

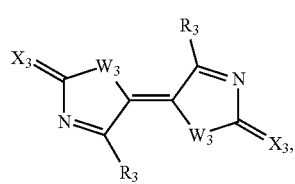

Formula 3-1

-continued

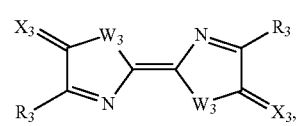

Formula 3-2

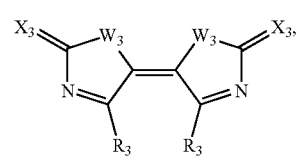

Formula 3-3

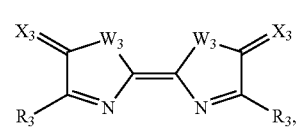

Formula 3-4

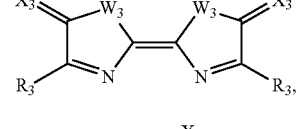

Formula 3-5

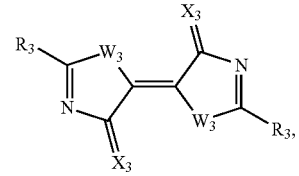

Formula 3-6

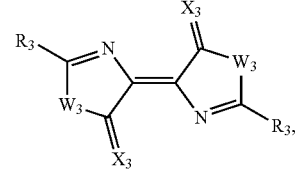

Formula 3-7

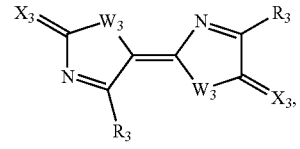

Formula 3-8

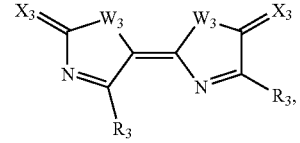

Formula 3-9

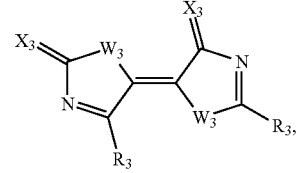

Formula 3-10

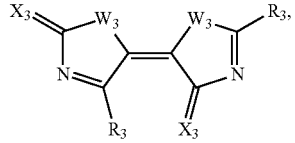

Formula 3-11

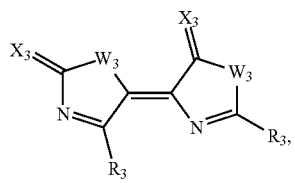

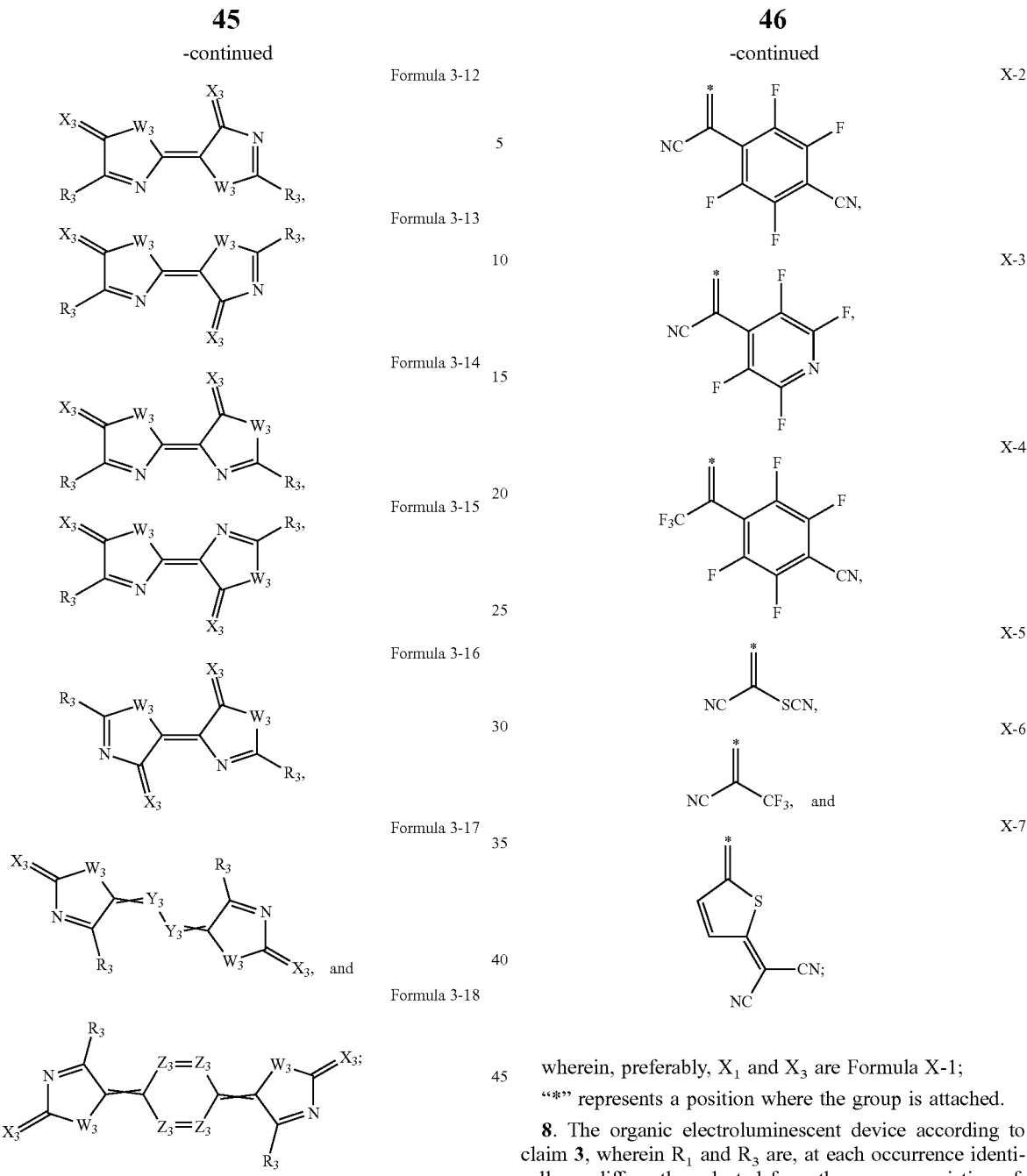

wherein $X_2$, $X_3$, $W_3$, $R_3$, and $Y_3$ have the same meanings as defined in claim 3;

$Z_3$ is, at each occurrence identically or differently, selected from the group consisting of $CR_{L3}$ and N, and $R_{L3}$ has the same meaning as defined in claim 3.

7. The organic electroluminescent device according to claim 3, wherein $X_1$, $X_2$, and $X_3$ are, at each occurrence identically or differently, selected from the group consisting of the following structures:

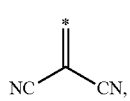

X-1 wherein, preferably, $X_1$ and $X_3$ are Formula X-1;

"*" represents a position where the group is attached.

8. The organic electroluminescent device according to claim 3, wherein $R_1$ and $R_3$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, unsubstituted alkyl having 1 to 20 carbon atoms, unsubstituted cycloalkyl having 3 to 20 ring carbon atoms, unsubstituted alkoxy having 1 to 20 carbon atoms, unsubstituted alkenyl having 2 to 20 carbon atoms, unsubstituted aryl having 6 to 30 carbon atoms, unsubstituted heteroaryl having 3 to 30 carbon atoms, and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, and a phosphoroso group: alkyl having 1 to 20 carbon atoms, cycloalkyl having 3 to 20 ring carbon atoms, alkoxy having 1 to 20 carbon atoms, alkenyl having 2 to 20 carbon atoms, aryl having 6 to 30 carbon atoms, heteroaryl having 3 to 30 carbon atoms, and combinations thereof;

preferably, $R_1$ and $R_3$ are, at each occurrence identically or differently, selected from the group consisting of: hydrogen, deuterium, methyl, isopropyl, $NO_2$, $SO_2CH_3$, $SCF_3$, $C_2F_5$, $OC_2F_5$, $OCH_3$, diphenylmethylsilyl, phenyl, methoxyphenyl, p-methylphenyl, 2,6-diisopropylphenyl, biphenyl, polyfluorophenyl, difluopyridyl, nitrophenyl, dimethylthiazolyl, vinyl substituted by one or more of CN or $CF_3$, ethynyl substituted by one of CN or $CF_3$, dimethylphosphoroso, diphenylphosphoroso, F, $CF_3$, $OCF_3$, $SF_5$, $SO_2CF_3$, cyano, isocyano, SCN, OCN, trifluoromethylphenyl, trifluoromethoxyphenyl, bis(trifluoromethyl)phenyl, bis(trifluoromethoxyl)phenyl, 4-cyanotetrafluorophenyl, phenyl or biphenyl substituted by one or more of F, CN or $CF_3$, tetrafluoropyridyl, pyrimidinyl, triazinyl, diphenylboryl, oxaboraanthyl, and combinations thereof.

9. The organic electroluminescent device according to claim 3, wherein $R_1$ and $R_3$ are, at each occurrence identically or differently, selected from the group consisting of the following structures:

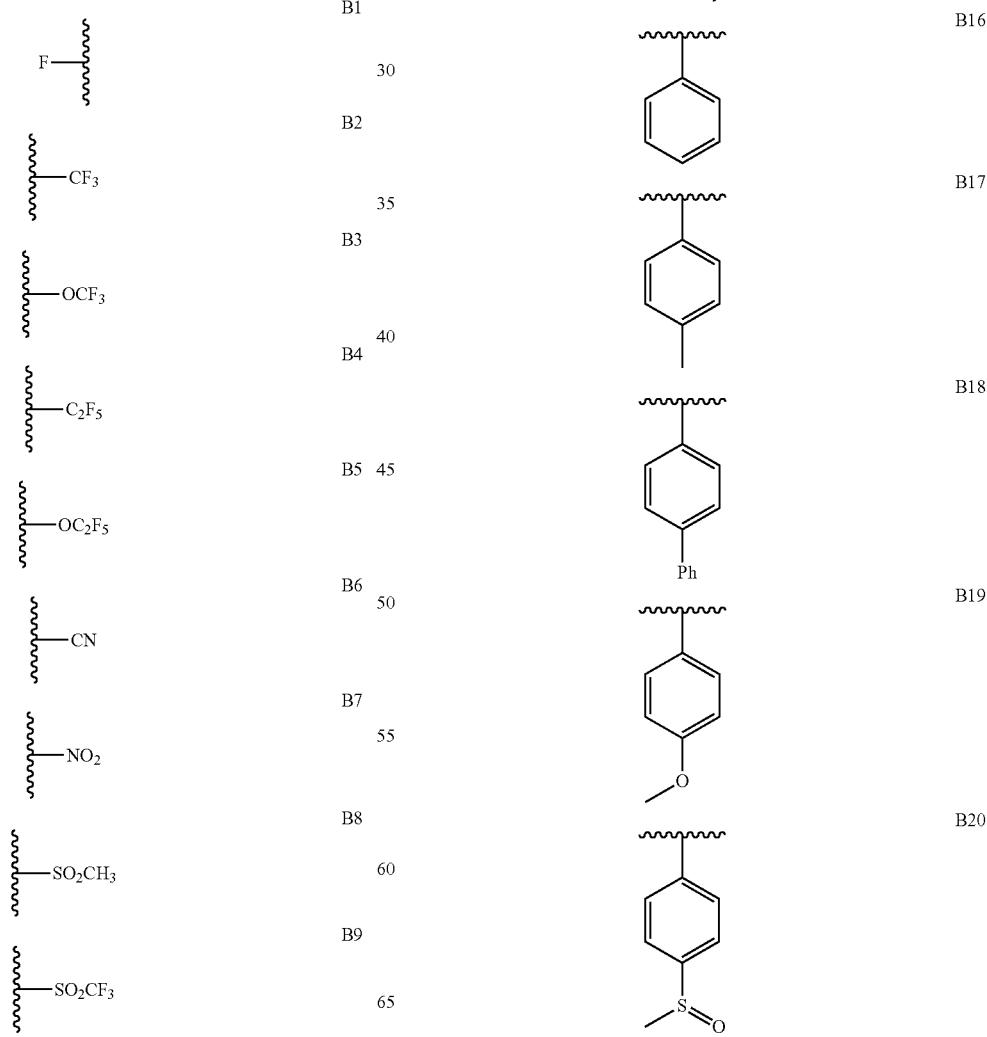

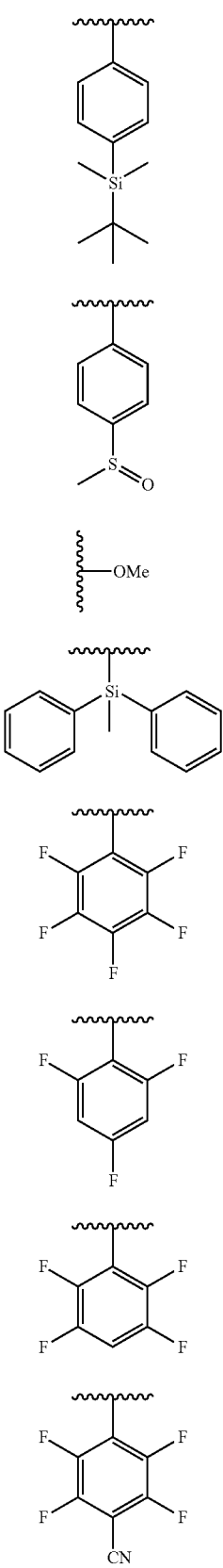

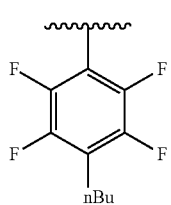 B37
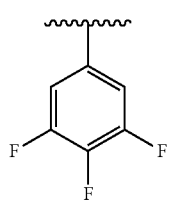 B38
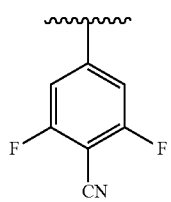 B39
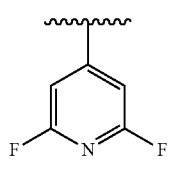 B40
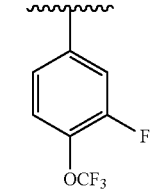 B41
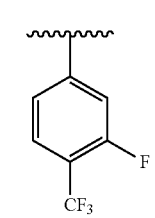 B42
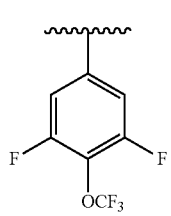 B43
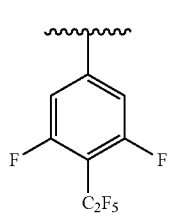 B44
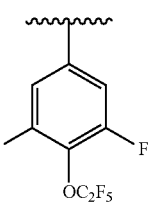 B45
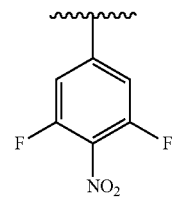 B46
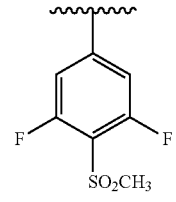 B47
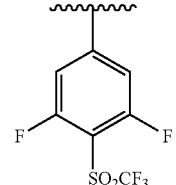 B48
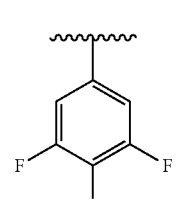 B49
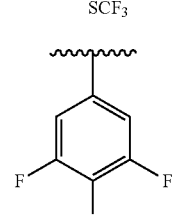 B50
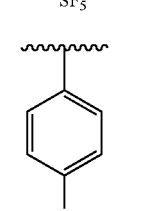 B51
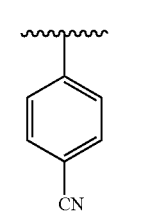 B52

-continued
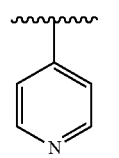 B53
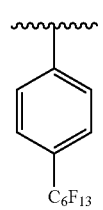 B54
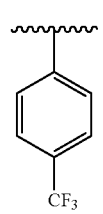 B55
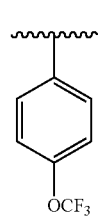 B56
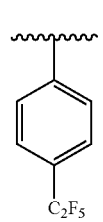 B57
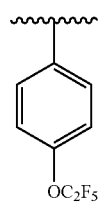 B58
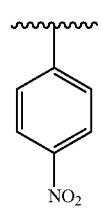 B59
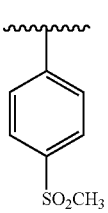 B60
-continued
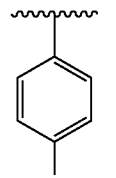 B61
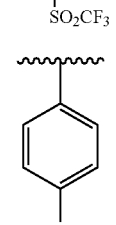 B62
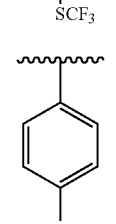 B63
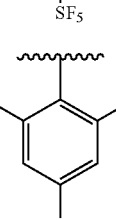 B64
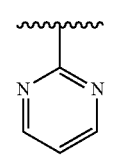 B65
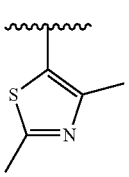 B66
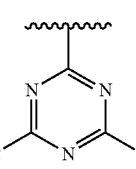 B67
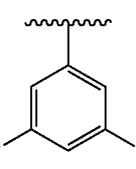 B68
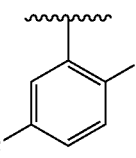 B69

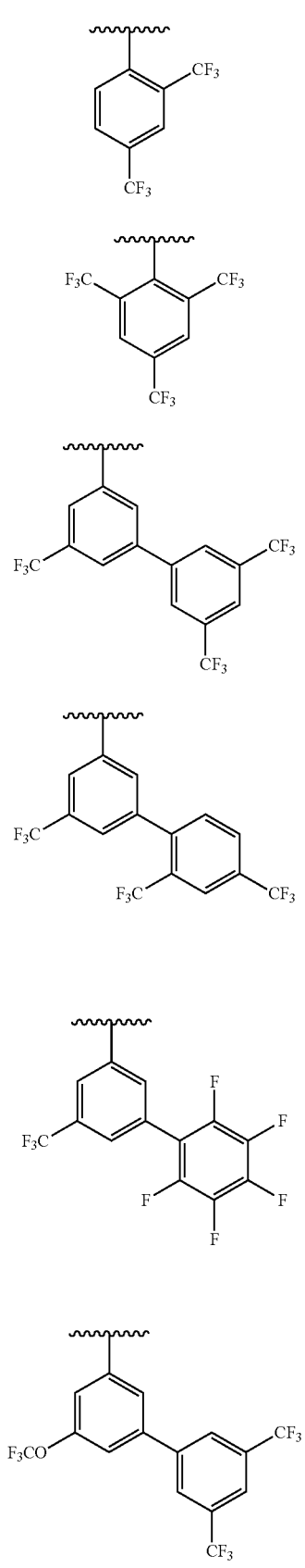

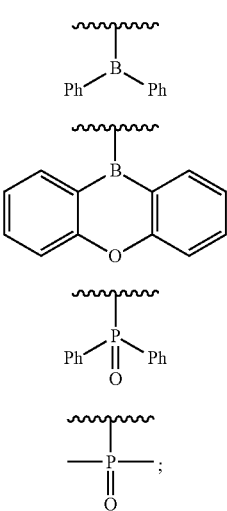

B85

B86

B87

B88 preferably, two $R_1$ in Formula 1 are identical, or two $R_3$ in Formula 3 are identical;

" 〰 " represents a position where the group is attached.

10. The organic electroluminescent device according to claim 3, wherein $Z_1$ and $W_3$ are, at each occurrence identically or differently, selected from O, S or Se; preferably, $Z_1$ and $W_3$ are, at each occurrence identically or differently, selected from O or S; more preferably, $Z_1$ and $W_3$ are O.

11. The organic electroluminescent device according to claim 3, wherein $n_2$ in Formula 2 is equal to 1; $n_3$ in Formula 3 is equal to 0.

12. The organic electroluminescent device according to claim 1, wherein the first organic material and the third organic material are each independently selected from the group consisting of Compound 1-1 to Compound 1-348, Compound 2-1 to Compound 2-37, and Compound 3-1 to Compound 3-696;

wherein Compound 1-1 to Compound 1-348 have a structure represented by Formula 1:

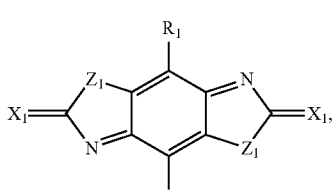

Formula 1 in Formula 1, two $Z_1$ have an identical structure, two $X_1$ have an identical structure, two $R_1$ have an identical structure, and $Z_1$, $X_1$, and $R_1$ are respectively selected from atoms or groups shown in the following table:

| Compound No. | $Z_1$ | $X_1$ | $R_1$ | Compound No. | $Z_1$ | $X_1$ | $R_1$ |
|---|---|---|---|---|---|---|---|
| 1-1 | O | X-1 | B1 | 1-2 | O | X-1 | B2 |
| 1-3 | O | X-1 | B3 | 1-4 | O | X-1 | B4 |
| 1-5 | O | X-1 | B5 | 1-6 | O | X-1 | B6 |
| 1-7 | O | X-1 | B7 | 1-8 | O | X-1 | B8 |
| 1-9 | O | X-1 | B9 | 1-10 | O | X-1 | B10 |
| 1-11 | O | X-1 | B11 | 1-12 | O | X-1 | B12 |
| 1-13 | O | X-1 | B13 | 1-14 | O | X-1 | B14 |
| 1-15 | O | X-1 | B15 | 1-16 | O | X-1 | B16 |
| 1-17 | O | X-1 | B17 | 1-18 | O | X-1 | B18 |
| 1-19 | O | X-1 | B19 | 1-20 | O | X-1 | B20 |
| 1-21 | O | X-1 | B21 | 1-22 | O | X-1 | B22 |
| 1-23 | O | X-1 | B23 | 1-24 | O | X-1 | B24 |
| 1-25 | O | X-1 | B25 | 1-26 | O | X-1 | B26 |
| 1-27 | O | X-1 | B27 | 1-28 | O | X-1 | B28 |
| 1-29 | O | X-1 | B29 | 1-30 | O | X-1 | B30 |
| 1-31 | O | X-1 | B31 | 1-32 | O | X-1 | B32 |
| 1-33 | O | X-1 | B33 | 1-34 | O | X-1 | B34 |
| 1-35 | O | X-1 | B35 | 1-36 | O | X-1 | B36 |
| 1-37 | O | X-1 | B37 | 1-38 | O | X-1 | B38 |
| 1-39 | O | X-1 | B39 | 1-40 | O | X-1 | B40 |
| 1-41 | O | X-1 | B41 | 1-42 | O | X-1 | B42 |
| 1-43 | O | X-1 | B43 | 1-44 | O | X-1 | B44 |
| 1-45 | O | X-1 | B45 | 1-46 | O | X-1 | B46 |
| 1-47 | O | X-1 | B47 | 1-48 | O | X-1 | B48 |
| 1-49 | O | X-1 | B49 | 1-50 | O | X-1 | B50 |
| 1-51 | O | X-1 | B51 | 1-52 | O | X-1 | B52 |
| 1-53 | O | X-1 | B53 | 1-54 | O | X-1 | B54 |
| 1-55 | O | X-1 | B55 | 1-56 | O | X-1 | B56 |
| 1-57 | O | X-1 | B57 | 1-58 | O | X-1 | B58 |
| 1-59 | O | X-1 | B59 | 1-60 | O | X-1 | B60 |
| 1-61 | O | X-1 | B61 | 1-62 | O | X-1 | B62 |
| 1-63 | O | X-1 | B63 | 1-64 | O | X-1 | B64 |
| 1-65 | O | X-1 | B65 | 1-66 | O | X-1 | B66 |
| 1-67 | O | X-1 | B67 | 1-68 | O | X-1 | B68 |
| 1-69 | O | X-1 | B69 | 1-70 | O | X-1 | B70 |
| 1-71 | O | X-1 | B71 | 1-72 | O | X-1 | B72 |
| 1-73 | O | X-1 | B73 | 1-74 | O | X-1 | B74 |
| 1-75 | O | X-1 | B75 | 1-76 | O | X-1 | B76 |
| 1-77 | O | X-1 | B77 | 1-78 | O | X-1 | B78 |
| 1-79 | O | X-1 | B79 | 1-80 | O | X-1 | B80 |
| 1-81 | O | X-1 | B81 | 1-82 | O | X-1 | B82 |
| 1-83 | O | X-1 | B83 | 1-84 | O | X-1 | B84 |
| 1-85 | O | X-1 | B85 | 1-86 | O | X-1 | B86 |
| 1-87 | O | X-1 | B87 | 1-88 | O | X-1 | B88 |
| 1-89 | S | X-1 | B1 | 1-90 | S | X-1 | B2 |
| 1-91 | S | X-1 | B3 | 1-92 | S | X-1 | B4 |
| 1-93 | S | X-1 | B5 | 1-94 | S | X-1 | B6 |
| 1-95 | S | X-1 | B7 | 1-96 | S | X-1 | B8 |
| 1-97 | S | X-1 | B9 | 1-98 | S | X-1 | B10 |
| 1-99 | S | X-1 | B11 | 1-100 | S | X-1 | B12 |
| 1-101 | S | X-1 | B13 | 1-102 | S | X-1 | B14 |
| 1-103 | S | X-1 | B15 | 1-104 | S | X-1 | B16 |
| 1-105 | S | X-1 | B17 | 1-106 | S | X-1 | B18 |
| 1-107 | S | X-1 | B19 | 1-108 | S | X-1 | B20 |
| 1-109 | S | X-1 | B21 | 1-110 | S | X-1 | B22 |
| 1-111 | S | X-1 | B23 | 1-112 | S | X-1 | B24 |
| 1-113 | S | X-1 | B25 | 1-114 | S | X-1 | B26 |
| 1-115 | S | X-1 | B27 | 1-116 | S | X-1 | B28 |
| 1-117 | S | X-1 | B29 | 1-118 | S | X-1 | B30 |
| 1-119 | S | X-1 | B31 | 1-120 | S | X-1 | B32 |
| 1-121 | S | X-1 | B33 | 1-122 | S | X-1 | B34 |
| 1-123 | S | X-1 | B35 | 1-124 | S | X-1 | B36 |
| 1-125 | S | X-1 | B37 | 1-126 | S | X-1 | B38 |
| 1-127 | S | X-1 | B39 | 1-128 | S | X-1 | B40 |
| 1-129 | S | X-1 | B41 | 1-130 | S | X-1 | B42 |
| 1-131 | S | X-1 | B43 | 1-132 | S | X-1 | B44 |
| 1-133 | S | X-1 | B45 | 1-134 | S | X-1 | B46 |
| 1-135 | S | X-1 | B47 | 1-136 | S | X-1 | B48 |
| 1-137 | S | X-1 | B49 | 1-138 | S | X-1 | B50 |
| 1-139 | S | X-1 | B51 | 1-140 | S | X-1 | B52 |
| 1-141 | S | X-1 | B53 | 1-142 | S | X-1 | B54 |
| 1-143 | S | X-1 | B55 | 1-144 | S | X-1 | B56 |
| 1-145 | S | X-1 | B57 | 1-146 | S | X-1 | B58 |
| 1-147 | S | X-1 | B59 | 1-148 | S | X-1 | B60 |
| 1-149 | S | X-1 | B61 | 1-150 | S | X-1 | B62 |
| 1-151 | S | X-1 | B63 | 1-152 | S | X-1 | B64 |
| 1-153 | S | X-1 | B65 | 1-154 | S | X-1 | B66 |
| 1-155 | S | X-1 | B67 | 1-156 | S | X-1 | B68 |
| 1-157 | S | X-1 | B69 | 1-158 | S | X-1 | B70 |
| 1-159 | S | X-1 | B71 | 1-160 | S | X-1 | B72 |
| 1-161 | S | X-1 | B73 | 1-162 | S | X-1 | B74 |
| 1-163 | S | X-1 | B75 | 1-164 | S | X-1 | B76 |

| Compound No. | Z₁ | X₁ | R₁ | Compound No. | Z₁ | X₁ | R₁ |
|---|---|---|---|---|---|---|---|
| 1-165 | S | X-1 | B77 | 1-166 | S | X-1 | B78 |
| 1-167 | S | X-1 | B79 | 1-168 | S | X-1 | B80 |
| 1-169 | S | X-1 | B81 | 1-170 | S | X-1 | B82 |
| 1-171 | S | X-1 | B83 | 1-172 | S | X-1 | B84 |
| 1-173 | S | X-1 | B85 | 1-174 | S | X-1 | B86 |
| 1-175 | S | X-1 | B87 | 1-176 | S | X-1 | B88 |
| 1-177 | Se | X-1 | B1 | 1-178 | Se | X-1 | B2 |
| 1-179 | Se | X-1 | B3 | 1-180 | Se | X-1 | B4 |
| 1-181 | Se | X-1 | B5 | 1-182 | Se | X-1 | B6 |
| 1-183 | Se | X-1 | B7 | 1-184 | Se | X-1 | B8 |
| 1-185 | Se | X-1 | B9 | 1-186 | Se | X-1 | B10 |
| 1-187 | Se | X-1 | B11 | 1-188 | Se | X-1 | B12 |
| 1-189 | Se | X-1 | B13 | 1-190 | Se | X-1 | B14 |
| 1-191 | Se | X-1 | B15 | 1-192 | Se | X-1 | B16 |
| 1-193 | Se | X-1 | B17 | 1-194 | Se | X-1 | B18 |
| 1-195 | Se | X-1 | B19 | 1-196 | Se | X-1 | B20 |
| 1-197 | Se | X-1 | B21 | 1-198 | Se | X-1 | B22 |
| 1-199 | Se | X-1 | B23 | 1-200 | Se | X-1 | B24 |
| 1-201 | Se | X-1 | B25 | 1-202 | Se | X-1 | B26 |
| 1-203 | Se | X-1 | B27 | 1-204 | Se | X-1 | B28 |
| 1-205 | Se | X-1 | B29 | 1-206 | Se | X-1 | B30 |
| 1-207 | Se | X-1 | B31 | 1-208 | Se | X-1 | B32 |
| 1-209 | Se | X-1 | B33 | 1-210 | Se | X-1 | B34 |
| 1-211 | Se | X-1 | B35 | 1-212 | Se | X-1 | B36 |
| 1-213 | Se | X-1 | B37 | 1-214 | Se | X-1 | B38 |
| 1-215 | Se | X-1 | B39 | 1-216 | Se | X-1 | B40 |
| 1-217 | Se | X-1 | B41 | 1-218 | Se | X-1 | B42 |
| 1-219 | Se | X-1 | B43 | 1-220 | Se | X-1 | B44 |
| 1-221 | Se | X-1 | B45 | 1-222 | Se | X-1 | B46 |
| 1-223 | Se | X-1 | B47 | 1-224 | Se | X-1 | B48 |
| 1-225 | Se | X-1 | B49 | 1-226 | Se | X-1 | B50 |
| 1-227 | Se | X-1 | B51 | 1-228 | Se | X-1 | B52 |
| 1-229 | Se | X-1 | B53 | 1-230 | Se | X-1 | B54 |
| 1-231 | Se | X-1 | B55 | 1-232 | Se | X-1 | B56 |
| 1-233 | Se | X-1 | B57 | 1-234 | Se | X-1 | B58 |
| 1-235 | Se | X-1 | B59 | 1-236 | Se | X-1 | B60 |
| 1-237 | Se | X-1 | B61 | 1-238 | Se | X-1 | B62 |
| 1-239 | Se | X-1 | B63 | 1-240 | Se | X-1 | B64 |
| 1-241 | Se | X-1 | B65 | 1-242 | Se | X-1 | B66 |
| 1-243 | Se | X-1 | B67 | 1-244 | Se | X-1 | B68 |
| 1-245 | Se | X-1 | B69 | 1-246 | Se | X-1 | B70 |
| 1-247 | Se | X-1 | B71 | 1-248 | Se | X-1 | B72 |
| 1-249 | Se | X-1 | B73 | 1-250 | Se | X-1 | B74 |
| 1-251 | Se | X-1 | B75 | 1-252 | Se | X-1 | B76 |
| 1-253 | Se | X-1 | B77 | 1-254 | Se | X-1 | B78 |
| 1-255 | Se | X-1 | B79 | 1-256 | Se | X-1 | B80 |
| 1-257 | Se | X-1 | B81 | 1-258 | Se | X-1 | B82 |
| 1-259 | Se | X-1 | B83 | 1-260 | Se | X-1 | B84 |
| 1-261 | Se | X-1 | B85 | 1-262 | Se | X-1 | B86 |
| 1-263 | Se | X-1 | B87 | 1-264 | Se | X-1 | B88 |
| 1-265 | O | X-2 | B1 | 1-266 | O | X-2 | B6 |
| 1-267 | O | X-2 | B10 | 1-268 | O | X-2 | B16 |
| 1-269 | O | X-2 | B25 | 1-270 | O | X-2 | B28 |
| 1-271 | O | X-2 | B29 | 1-272 | O | X-2 | B30 |
| 1-273 | O | X-2 | B38 | 1-274 | O | X-2 | B39 |
| 1-275 | O | X-2 | B40 | 1-276 | O | X-2 | B41 |
| 1-277 | O | X-2 | B43 | 1-278 | O | X-2 | B52 |
| 1-279 | O | X-2 | B56 | 1-280 | O | X-2 | B67 |
| 1-281 | O | X-2 | B68 | 1-282 | O | X-2 | B69 |
| 1-283 | O | X-2 | B70 | 1-284 | O | X-2 | B71 |
| 1-285 | O | X-2 | B72 | 1-286 | O | X-2 | B74 |
| 1-287 | O | X-2 | B79 | 1-288 | O | X-2 | B80 |
| 1-289 | O | X-2 | B82 | 1-290 | O | X-2 | B83 |
| 1-291 | O | X-2 | B86 | 1-292 | O | X-2 | B88 |
| 1-293 | S | X-2 | B1 | 1-294 | S | X-2 | B6 |
| 1-295 | S | X-2 | B10 | 1-296 | S | X-2 | B16 |
| 1-297 | S | X-2 | B25 | 1-298 | S | X-2 | B28 |
| 1-299 | S | X-2 | B29 | 1-300 | S | X-2 | B30 |
| 1-301 | S | X-2 | B38 | 1-302 | S | X-2 | B39 |
| 1-303 | S | X-2 | B40 | 1-304 | S | X-2 | B41 |
| 1-305 | S | X-2 | B43 | 1-306 | S | X-2 | B52 |
| 1-307 | S | X-2 | B56 | 1-308 | S | X-2 | B67 |
| 1-309 | S | X-2 | B68 | 1-310 | S | X-2 | B69 |
| 1-311 | S | X-2 | B70 | 1-312 | S | X-2 | B71 |
| 1-313 | S | X-2 | B72 | 1-314 | S | X-2 | B74 |
| 1-315 | S | X-2 | B79 | 1-316 | S | X-2 | B80 |
| 1-317 | S | X-2 | B82 | 1-318 | S | X-2 | B83 |
| 1-319 | S | X-2 | B86 | 1-320 | S | X-2 | B88 |
| 1-321 | Se | X-2 | B1 | 1-322 | Se | X-2 | B6 |
| 1-323 | Se | X-2 | B10 | 1-324 | Se | X-2 | B16 |
| 1-325 | Se | X-2 | B25 | 1-326 | Se | X-2 | B28 |
| 1-327 | Se | X-2 | B29 | 1-328 | Se | X-2 | B30 |
| 1-329 | Se | X-2 | B38 | 1-330 | Se | X-2 | B39 |
| 1-331 | Se | X-2 | B40 | 1-332 | Se | X-2 | B41 |
| 1-333 | Se | X-2 | B43 | 1-334 | Se | X-2 | B52 |
| 1-335 | Se | X-2 | B56 | 1-336 | Se | X-2 | B67 |
| 1-337 | Se | X-2 | B68 | 1-338 | Se | X-2 | B69 |
| 1-339 | Se | X-2 | B70 | 1-340 | Se | X-2 | B71 |
| 1-341 | Se | X-2 | B72 | 1-342 | Se | X-2 | B74 |
| 1-343 | Se | X-2 | B79 | 1-344 | Se | X-2 | B80 |
| 1-345 | Se | X-2 | B82 | 1-346 | Se | X-2 | B83 |
| 1-347 | Se | X-2 | B86 | 1-348 | Se | X-2 | B88 | wherein Compound 2-1 to Compound 2-37 have the following structures:

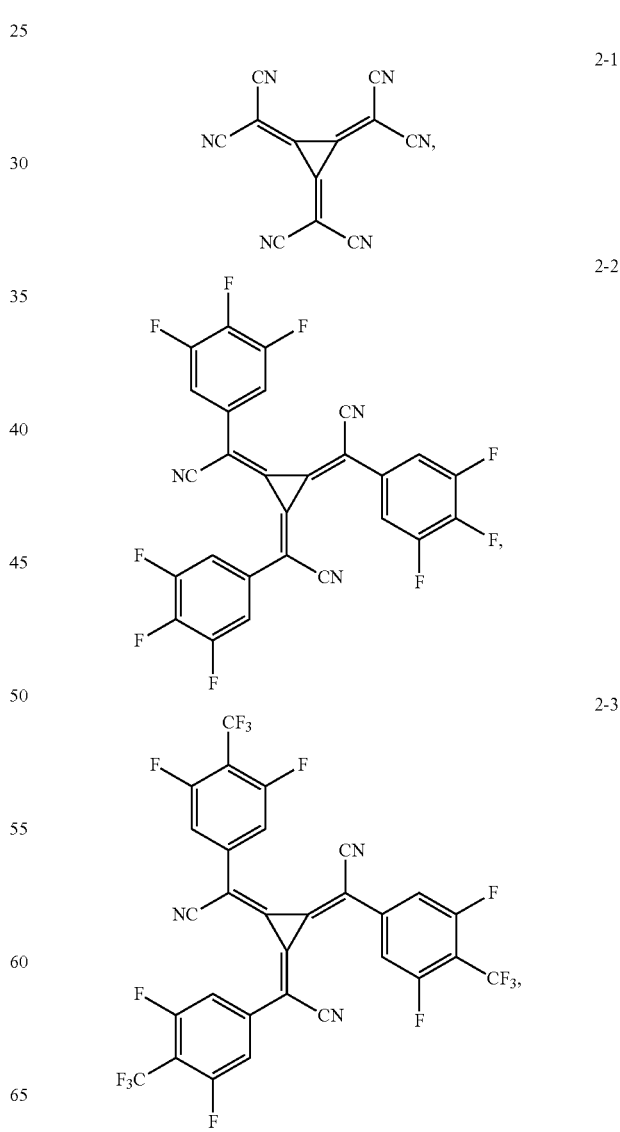

-continued
2-4
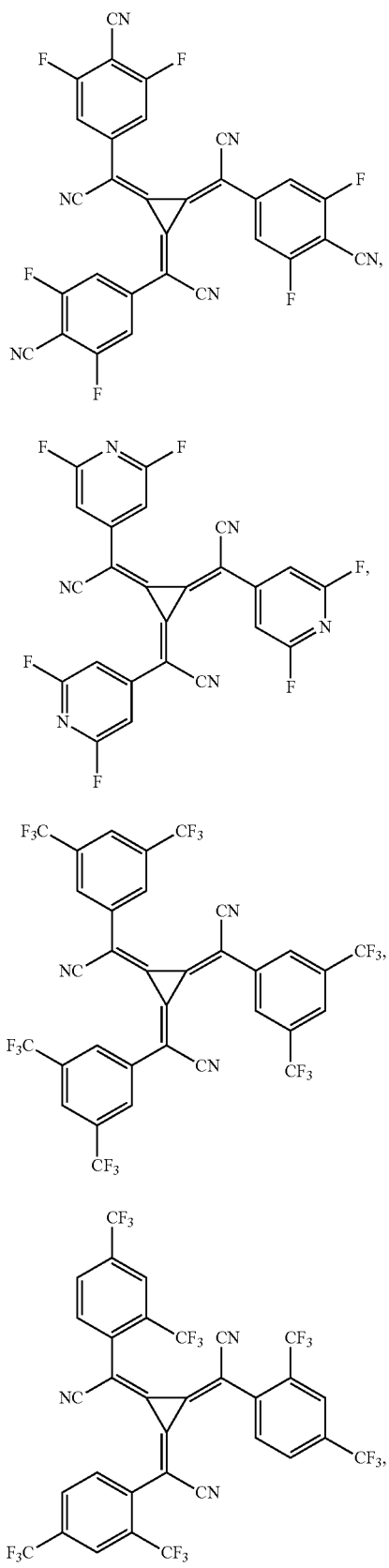
2-5
2-6
2-7
-continued
2-8
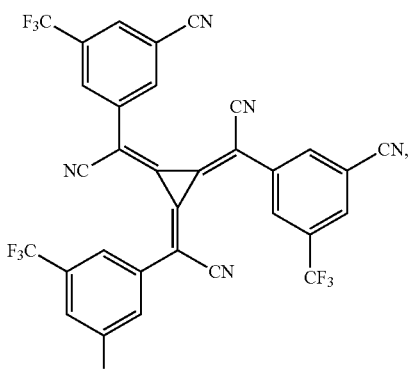
2-9
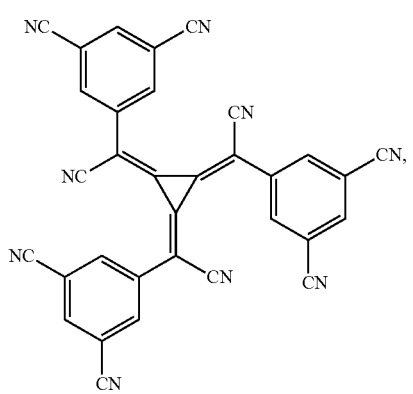
2-10
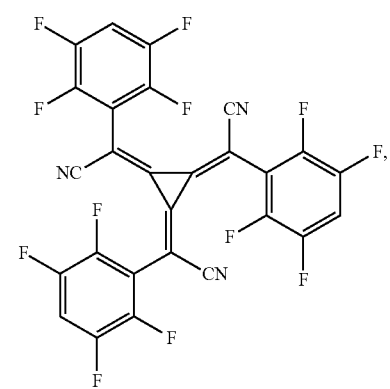
2-11
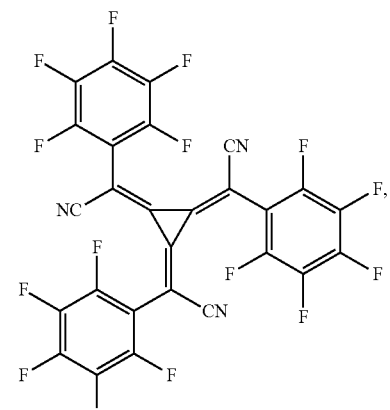

2-12
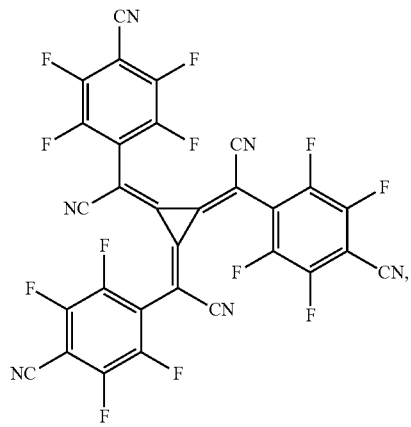
2-13
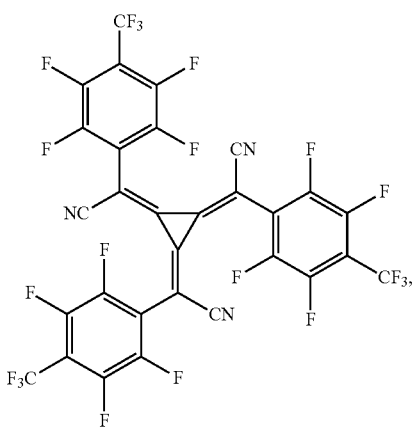
2-14
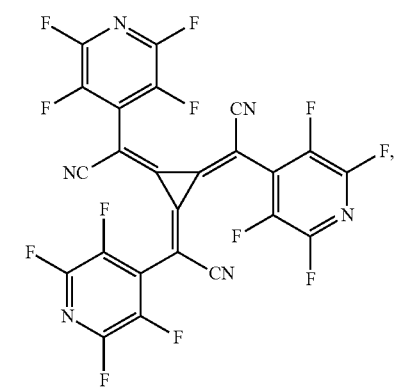
2-15
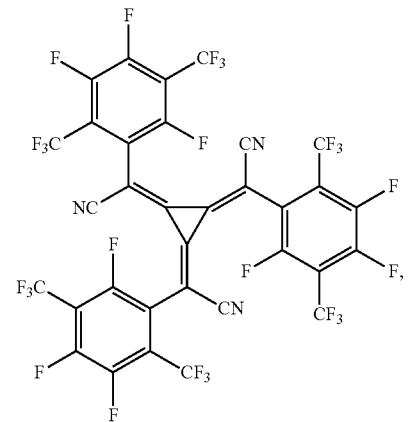
2-16
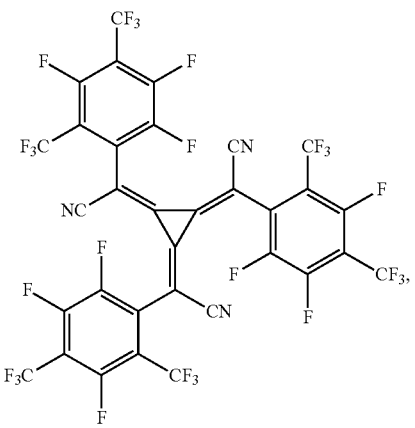
2-17
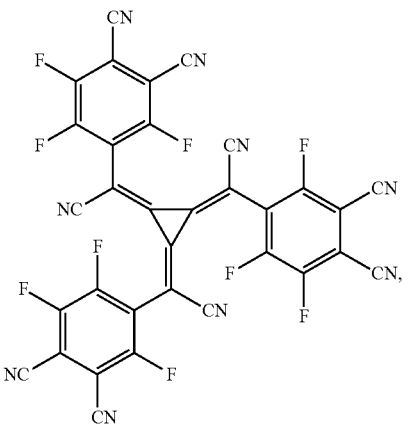
2-18
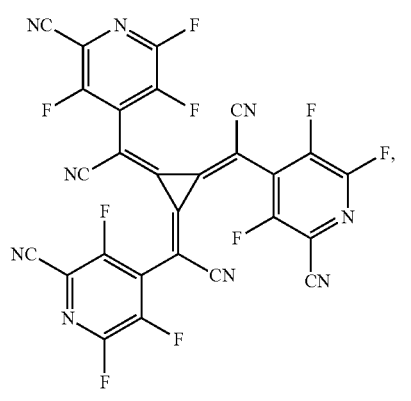
2-19
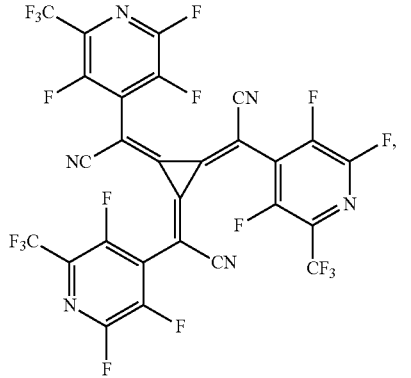

2-20
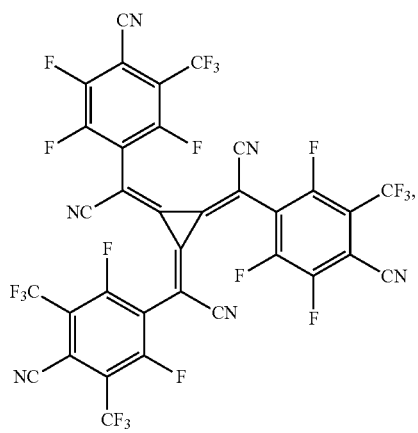
2-21
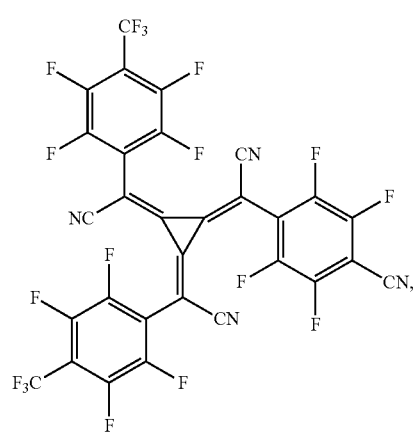
2-22
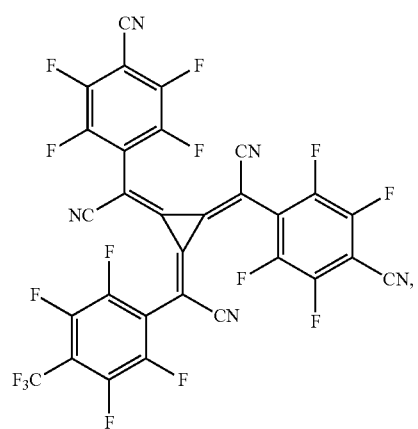
2-23
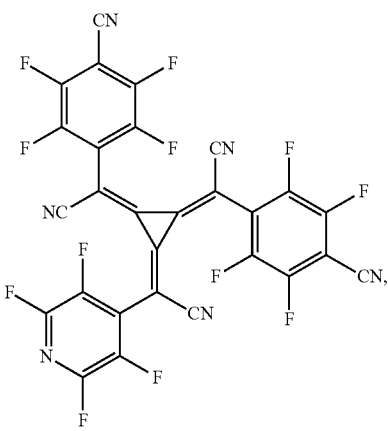
2-24
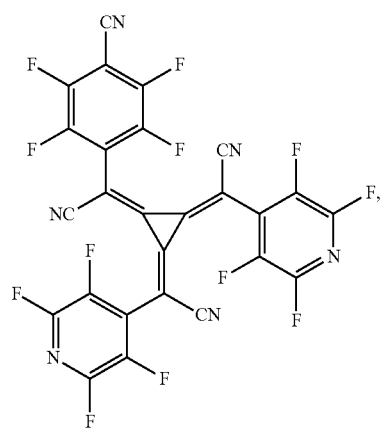
2-25
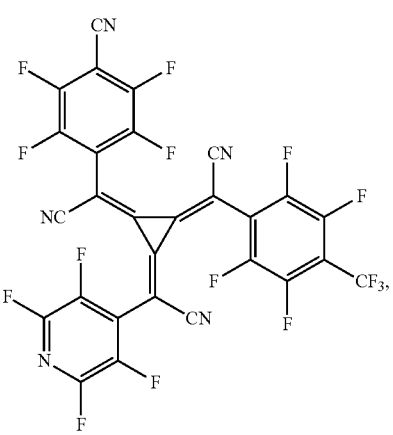

-continued
2-26
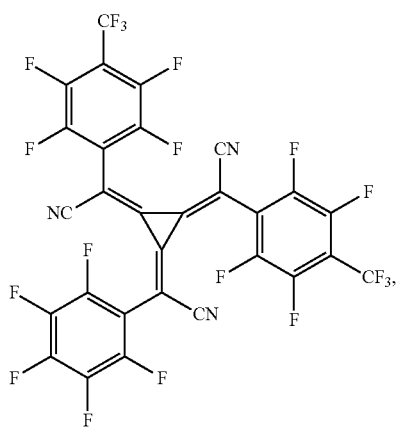
2-27
2-28
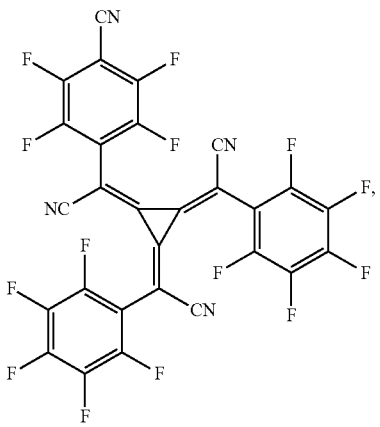
-continued
2-30
2-31
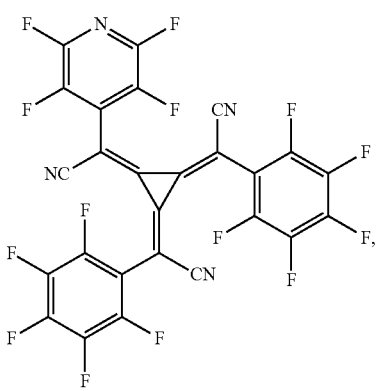
2-29
2-32
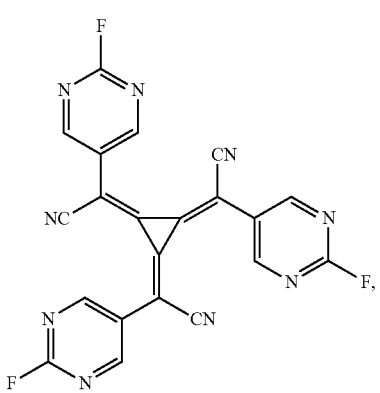
2-33
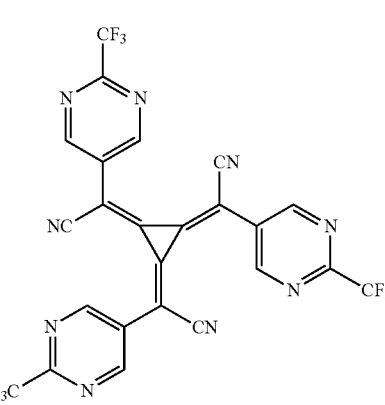

-continued

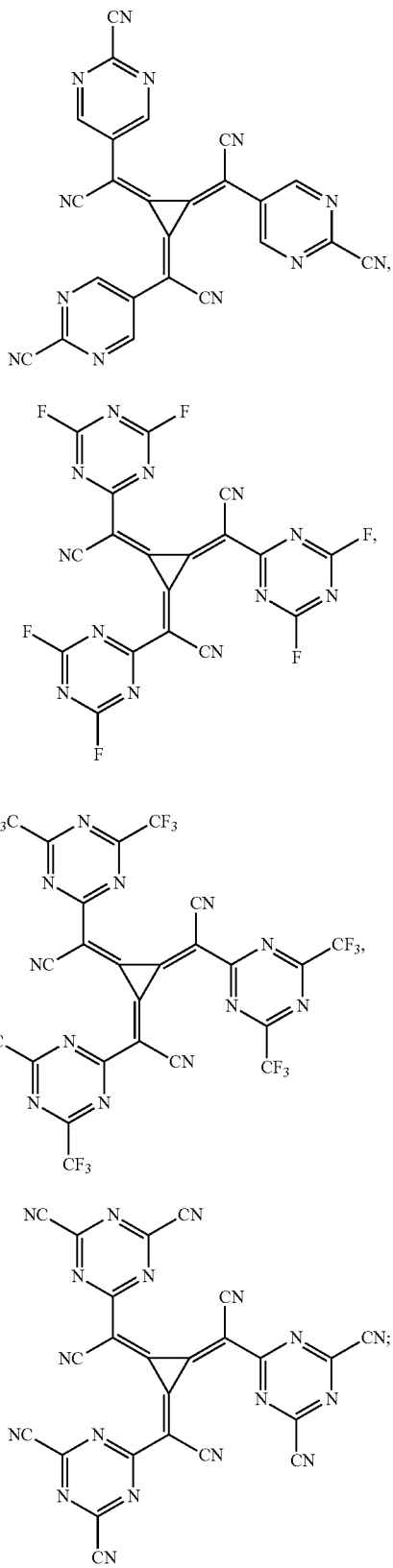

2-34

2-35

2-36

2-37 wherein Compound 3-1 to Compound 3-348 have a structure represented by Formula 3-1:

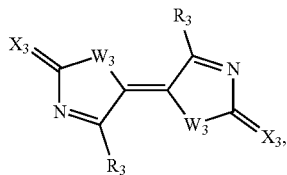

Formula 3-1 in Formula 3-1, two $X_3$ have an identical structure, two $W_3$ have an identical structure, two $R_3$ have an identical structure, and $X_3$, $W_3$, and $R_3$ are respectively selected from atoms or groups shown in the following table:

| Compound No. | $W_3$ | $X_3$ | $R_3$ | Compound No. | $W_3$ | $X_3$ | $R_3$ |
|---|---|---|---|---|---|---|---|
| 3-1 | O | X-1 | B1 | 3-2 | O | X-1 | B2 |
| 3-3 | O | X-1 | B3 | 3-4 | O | X-1 | B4 |
| 3-5 | O | X-1 | B5 | 3-6 | O | X-1 | B6 |
| 3-7 | O | X-1 | B7 | 3-8 | O | X-1 | B8 |
| 3-9 | O | X-1 | B9 | 3-10 | O | X-1 | B10 |
| 3-11 | O | X-1 | B11 | 3-12 | O | X-1 | B12 |
| 3-13 | O | X-1 | B13 | 3-14 | O | X-1 | B14 |
| 3-15 | O | X-1 | B15 | 3-16 | O | X-1 | B16 |
| 3-17 | O | X-1 | B17 | 3-18 | O | X-1 | B18 |
| 3-19 | O | X-1 | B19 | 3-20 | O | X-1 | B20 |
| 3-21 | O | X-1 | B21 | 3-22 | O | X-1 | B22 |
| 3-23 | O | X-1 | B23 | 3-24 | O | X-1 | B24 |
| 3-25 | O | X-1 | B25 | 3-26 | O | X-1 | B26 |
| 3-27 | O | X-1 | B27 | 3-28 | O | X-1 | B28 |
| 3-29 | O | X-1 | B29 | 3-30 | O | X-1 | B30 |
| 3-31 | O | X-1 | B31 | 3-32 | O | X-1 | B32 |
| 3-33 | O | X-1 | B33 | 3-34 | O | X-1 | B34 |
| 3-35 | O | X-1 | B35 | 3-36 | O | X-1 | B36 |
| 3-37 | O | X-1 | B37 | 3-38 | O | X-1 | B38 |
| 3-39 | O | X-1 | B39 | 3-40 | O | X-1 | B40 |
| 3-41 | O | X-1 | B41 | 3-42 | O | X-1 | B42 |
| 3-43 | O | X-1 | B43 | 3-44 | O | X-1 | B44 |
| 3-45 | O | X-1 | B45 | 3-46 | O | X-1 | B46 |
| 3-47 | O | X-1 | B47 | 3-48 | O | X-1 | B48 |
| 3-49 | O | X-1 | B49 | 3-50 | O | X-1 | B50 |
| 3-51 | O | X-1 | B51 | 3-52 | O | X-1 | B52 |
| 3-53 | O | X-1 | B53 | 3-54 | O | X-1 | B54 |
| 3-55 | O | X-1 | B55 | 3-56 | O | X-1 | B56 |
| 3-57 | O | X-1 | B57 | 3-58 | O | X-1 | B58 |
| 3-59 | O | X-1 | B59 | 3-60 | O | X-1 | B60 |
| 3-61 | O | X-1 | B61 | 3-62 | O | X-1 | B62 |
| 3-63 | O | X-1 | B63 | 3-64 | O | X-1 | B64 |
| 3-65 | O | X-1 | B65 | 3-66 | O | X-1 | B66 |
| 3-67 | O | X-1 | B67 | 3-68 | O | X-1 | B68 |
| 3-69 | O | X-1 | B69 | 3-70 | O | X-1 | B70 |
| 3-71 | O | X-1 | B71 | 3-72 | O | X-1 | B72 |
| 3-73 | O | X-1 | B73 | 3-74 | O | X-1 | B74 |
| 3-75 | O | X-1 | B75 | 3-76 | O | X-1 | B76 |
| 3-77 | O | X-1 | B77 | 3-78 | O | X-1 | B78 |
| 3-79 | O | X-1 | B79 | 3-80 | O | X-1 | B80 |
| 3-81 | O | X-1 | B81 | 3-82 | O | X-1 | B82 |
| 3-83 | O | X-1 | B83 | 3-84 | O | X-1 | B84 |
| 3-85 | O | X-1 | B85 | 3-86 | O | X-1 | B86 |
| 3-87 | O | X-1 | B87 | 3-88 | O | X-1 | B88 |
| 3-89 | S | X-1 | B1 | 3-90 | S | X-1 | B2 |
| 3-91 | S | X-1 | B3 | 3-92 | S | X-1 | B4 |
| 3-93 | S | X-1 | B5 | 3-94 | S | X-1 | B6 |
| 3-95 | S | X-1 | B7 | 3-96 | S | X-1 | B8 |
| 3-97 | S | X-1 | B9 | 3-98 | S | X-1 | B10 |
| 3-99 | S | X-1 | B11 | 3-100 | S | X-1 | B12 |
| 3-101 | S | X-1 | B13 | 3-102 | S | X-1 | B14 |
| 3-103 | S | X-1 | B15 | 3-104 | S | X-1 | B16 |
| 3-105 | S | X-1 | B17 | 3-106 | S | X-1 | B18 |
| 3-107 | S | X-1 | B19 | 3-108 | S | X-1 | B20 |
| 3-109 | S | X-1 | B21 | 3-110 | S | X-1 | B22 |
| 3-111 | S | X-1 | B23 | 3-112 | S | X-1 | B24 |
| 3-113 | S | X-1 | B25 | 3-114 | S | X-1 | B26 |
| 3-115 | S | X-1 | B27 | 3-116 | S | X-1 | B28 |
| 3-117 | S | X-1 | B29 | 3-118 | S | X-1 | B30 |

| Compound No. | W₃ | X₃ | R₃ | Compound No. | W₃ | X₃ | R₃ |
| --- | --- | --- | --- | --- | --- | --- | --- |
| 3-119 | S | X-1 | B31 | 3-120 | S | X-1 | B32 |
| 3-121 | S | X-1 | B33 | 3-122 | S | X-1 | B34 |
| 3-123 | S | X-1 | B35 | 3-124 | S | X-1 | B36 |
| 3-125 | S | X-1 | B37 | 3-126 | S | X-1 | B38 |
| 3-127 | S | X-1 | B39 | 3-128 | S | X-1 | B40 |
| 3-129 | S | X-1 | B41 | 3-130 | S | X-1 | B42 |
| 3-131 | S | X-1 | B43 | 3-132 | S | X-1 | B44 |
| 3-133 | S | X-1 | B45 | 3-134 | S | X-1 | B46 |
| 3-135 | S | X-1 | B47 | 3-136 | S | X-1 | B48 |
| 3-137 | S | X-1 | B49 | 3-138 | S | X-1 | B50 |
| 3-139 | S | X-1 | B51 | 3-140 | S | X-1 | B52 |
| 3-141 | S | X-1 | B53 | 3-142 | S | X-1 | B54 |
| 3-143 | S | X-1 | B55 | 3-144 | S | X-1 | B56 |
| 3-145 | S | X-1 | B57 | 3-146 | S | X-1 | B58 |
| 3-147 | S | X-1 | B59 | 3-148 | S | X-1 | B60 |
| 3-149 | S | X-1 | B61 | 3-150 | S | X-1 | B62 |
| 3-151 | S | X-1 | B63 | 3-152 | S | X-1 | B64 |
| 3-153 | S | X-1 | B65 | 3-154 | S | X-1 | B66 |
| 3-155 | S | X-1 | B67 | 3-156 | S | X-1 | B68 |
| 3-157 | S | X-1 | B69 | 3-158 | S | X-1 | B70 |
| 3-159 | S | X-1 | B71 | 3-160 | S | X-1 | B72 |
| 3-161 | S | X-1 | B73 | 3-162 | S | X-1 | B74 |
| 3-163 | S | X-1 | B75 | 3-164 | S | X-1 | B76 |
| 3-165 | S | X-1 | B77 | 3-166 | S | X-1 | B78 |
| 3-167 | S | X-1 | B79 | 3-168 | S | X-1 | B80 |
| 3-169 | S | X-1 | B81 | 3-170 | S | X-1 | B82 |
| 3-171 | S | X-1 | B83 | 3-172 | S | X-1 | B84 |
| 3-173 | S | X-1 | B85 | 3-174 | S | X-1 | B86 |
| 3-175 | S | X-1 | B87 | 3-176 | S | X-1 | B88 |
| 3-177 | Se | X-1 | B1 | 3-178 | Se | X-1 | B2 |
| 3-179 | Se | X-1 | B3 | 3-180 | Se | X-1 | B4 |
| 3-181 | Se | X-1 | B5 | 3-182 | Se | X-1 | B6 |
| 3-183 | Se | X-1 | B7 | 3-184 | Se | X-1 | B8 |
| 3-185 | Se | X-1 | B9 | 3-186 | Se | X-1 | B10 |
| 3-187 | Se | X-1 | B11 | 3-188 | Se | X-1 | B12 |
| 3-189 | Se | X-1 | B13 | 3-190 | Se | X-1 | B14 |
| 3-191 | Se | X-1 | B15 | 3-192 | Se | X-1 | B16 |
| 3-193 | Se | X-1 | B17 | 3-194 | Se | X-1 | B18 |
| 3-195 | Se | X-1 | B19 | 3-196 | Se | X-1 | B20 |
| 3-197 | Se | X-1 | B21 | 3-198 | Se | X-1 | B22 |
| 3-199 | Se | X-1 | B23 | 3-200 | Se | X-1 | B24 |
| 3-201 | Se | X-1 | B25 | 3-202 | Se | X-1 | B26 |
| 3-203 | Se | X-1 | B27 | 3-204 | Se | X-1 | B28 |
| 3-205 | Se | X-1 | B29 | 3-206 | Se | X-1 | B30 |
| 3-207 | Se | X-1 | B31 | 3-208 | Se | X-1 | B32 |
| 3-209 | Se | X-1 | B33 | 3-210 | Se | X-1 | B34 |
| 3-211 | Se | X-1 | B35 | 3-212 | Se | X-1 | B36 |
| 3-213 | Se | X-1 | B37 | 3-214 | Se | X-1 | B38 |
| 3-215 | Se | X-1 | B39 | 3-216 | Se | X-1 | B40 |
| 3-217 | Se | X-1 | B41 | 3-218 | Se | X-1 | B42 |
| 3-219 | Se | X-1 | B43 | 3-220 | Se | X-1 | B44 |
| 3-221 | Se | X-1 | B45 | 3-222 | Se | X-1 | B46 |
| 3-223 | Se | X-1 | B47 | 3-224 | Se | X-1 | B48 |
| 3-225 | Se | X-1 | B49 | 3-226 | Se | X-1 | B50 |
| 3-227 | Se | X-1 | B51 | 3-228 | Se | X-1 | B52 |
| 3-229 | Se | X-1 | B53 | 3-230 | Se | X-1 | B54 |
| 3-231 | Se | X-1 | B55 | 3-232 | Se | X-1 | B56 |
| 3-233 | Se | X-1 | B57 | 3-234 | Se | X-1 | B58 |
| 3-235 | Se | X-1 | B59 | 3-236 | Se | X-1 | B60 |
| 3-237 | Se | X-1 | B61 | 3-238 | Se | X-1 | B62 |
| 3-239 | Se | X-1 | B63 | 3-240 | Se | X-1 | B64 |
| 3-241 | Se | X-1 | B65 | 3-242 | Se | X-1 | B66 |
| 3-243 | Se | X-1 | B67 | 3-244 | Se | X-1 | B68 |
| 3-245 | Se | X-1 | B69 | 3-246 | Se | X-1 | B70 |
| 3-247 | Se | X-1 | B71 | 3-248 | Se | X-1 | B72 |
| 3-249 | Se | X-1 | B73 | 3-250 | Se | X-1 | B74 |
| 3-251 | Se | X-1 | B75 | 3-252 | Se | X-1 | B76 |
| 3-253 | Se | X-1 | B77 | 3-254 | Se | X-1 | B78 |
| 3-255 | Se | X-1 | B79 | 3-256 | Se | X-1 | B80 |
| 3-257 | Se | X-1 | B81 | 3-258 | Se | X-1 | B82 |
| 3-259 | Se | X-1 | B83 | 3-260 | Se | X-1 | B84 |
| 3-261 | Se | X-1 | B85 | 3-262 | Se | X-1 | B86 |
| 3-263 | Se | X-1 | B87 | 3-264 | Se | X-1 | B88 |
| 3-265 | O | X-2 | B1 | 3-266 | O | X-2 | B6 |
| 3-267 | O | X-2 | B10 | 3-268 | O | X-2 | B16 |
| 3-269 | O | X-2 | B25 | 3-270 | O | X-2 | B28 |
| 3-271 | O | X-2 | B29 | 3-272 | O | X-2 | B30 |
| 3-273 | O | X-2 | B38 | 3-274 | O | X-2 | B39 |
| 3-275 | O | X-2 | B40 | 3-276 | O | X-2 | B41 |
| 3-277 | O | X-2 | B43 | 3-278 | O | X-2 | B52 |
| 3-279 | O | X-2 | B56 | 3-280 | O | X-2 | B67 |
| 3-281 | O | X-2 | B68 | 3-282 | O | X-2 | B69 |
| 3-283 | O | X-2 | B70 | 3-284 | O | X-2 | B71 |
| 3-285 | O | X-2 | B72 | 3-286 | O | X-2 | B74 |
| 3-287 | O | X-2 | B79 | 3-288 | O | X-2 | B80 |
| 3-289 | O | X-2 | B82 | 3-290 | O | X-2 | B83 |
| 3-291 | O | X-2 | B86 | 3-292 | O | X-2 | B88 |
| 3-293 | S | X-2 | B1 | 3-294 | S | X-2 | B6 |
| 3-295 | S | X-2 | B10 | 3-296 | S | X-2 | B16 |
| 3-297 | S | X-2 | B25 | 3-298 | S | X-2 | B28 |
| 3-299 | S | X-2 | B29 | 3-300 | S | X-2 | B30 |
| 3-301 | S | X-2 | B38 | 3-302 | S | X-2 | B39 |
| 3-303 | S | X-2 | B40 | 3-304 | S | X-2 | B41 |
| 3-305 | S | X-2 | B43 | 3-306 | S | X-2 | B52 |
| 3-307 | S | X-2 | B56 | 3-308 | S | X-2 | B67 |
| 3-309 | S | X-2 | B68 | 3-310 | S | X-2 | B69 |
| 3-311 | S | X-2 | B70 | 3-312 | S | X-2 | B71 |
| 3-313 | S | X-2 | B72 | 3-314 | S | X-2 | B74 |
| 3-315 | S | X-2 | B79 | 3-316 | S | X-2 | B80 |
| 3-317 | S | X-2 | B82 | 3-318 | S | X-2 | B83 |
| 3-319 | S | X-2 | B86 | 3-320 | S | X-2 | B88 |
| 3-321 | Se | X-2 | B1 | 3-322 | Se | X-2 | B6 |
| 3-323 | Se | X-2 | B10 | 3-324 | Se | X-2 | B16 |
| 3-325 | Se | X-2 | B25 | 3-326 | Se | X-2 | B28 |
| 3-327 | Se | X-2 | B29 | 3-328 | Se | X-2 | B30 |
| 3-329 | Se | X-2 | B38 | 3-330 | Se | X-2 | B39 |
| 3-331 | Se | X-2 | B40 | 3-332 | Se | X-2 | B41 |
| 3-333 | Se | X-2 | B43 | 3-334 | Se | X-2 | B52 |
| 3-335 | Se | X-2 | B56 | 3-336 | Se | X-2 | B67 |
| 3-337 | Se | X-2 | B68 | 3-338 | Se | X-2 | B69 |
| 3-339 | Se | X-2 | B70 | 3-340 | Se | X-2 | B71 |
| 3-341 | Se | X-2 | B72 | 3-342 | Se | X-2 | B74 |
| 3-343 | Se | X-2 | B79 | 3-344 | Se | X-2 | B80 |
| 3-345 | Se | X-2 | B82 | 3-346 | Se | X-2 | B83 |
| 3-347 | Se | X-2 | B86 | 3-348 | Se | X-2 | B88 | wherein Compound 3-349 to Compound 3-696 have a structure represented by Formula 3-2:

$$\text{Formula 3-2}$$

in Formula 3-2, two $X_3$ have an identical structure, two $W_3$ have an identical structure, two $R_3$ have an identical structure, and $X_3$, $W_3$, and $R_3$ are respectively selected from atoms or groups shown in the following table:

| Compound No. | W₃ | X₃ | R₃ | Compound No. | W₃ | X₃ | R₃ |
| --- | --- | --- | --- | --- | --- | --- | --- |
| 3-349 | O | X-1 | B1 | 3-350 | O | X-1 | B2 |
| 3-351 | O | X-1 | B3 | 3-352 | O | X-1 | B4 |
| 3-353 | O | X-1 | B5 | 3-354 | O | X-1 | B6 |
| 3-355 | O | X-1 | B7 | 3-356 | O | X-1 | B8 |
| 3-357 | O | X-1 | B9 | 3-358 | O | X-1 | B10 |
| 3-359 | O | X-1 | B11 | 3-360 | O | X-1 | B12 |
| 3-361 | O | X-1 | B13 | 3-362 | O | X-1 | B14 |
| 3-363 | O | X-1 | B15 | 3-364 | O | X-1 | B16 |
| 3-365 | O | X-1 | B17 | 3-366 | O | X-1 | B18 |
| 3-367 | O | X-1 | B19 | 3-368 | O | X-1 | B20 |
| 3-369 | O | X-1 | B21 | 3-370 | O | X-1 | B22 |
| 3-371 | O | X-1 | B23 | 3-372 | O | X-1 | B24 |

| Compound No. | W₃ | X₃ | R₃ | Compound No. | W₃ | X₃ | R₃ | Compound No. | W₃ | X₃ | R₃ | Compound No. | W₃ | X₃ | R₃ |
|---|---|---|---|---|---|---|---|---|---|---|---|---|---|---|---|
| 3-373 | O | X-1 | B25 | 3-374 | O | X-1 | B26 | 3-525 | Se | X-1 | B1 | 3-526 | Se | X-1 | B2 |
| 3-375 | O | X-1 | B27 | 3-376 | O | X-1 | B28 | 3-527 | Se | X-1 | B3 | 3-528 | Se | X-1 | B4 |
| 3-377 | O | X-1 | B29 | 3-378 | O | X-1 | B30 | 3-529 | Se | X-1 | B5 | 3-530 | Se | X-1 | B6 |
| 3-379 | O | X-1 | B31 | 3-380 | O | X-1 | B32 | 3-531 | Se | X-1 | B7 | 3-532 | Se | X-1 | B8 |
| 3-381 | O | X-1 | B33 | 3-382 | O | X-1 | B34 | 3-533 | Se | X-1 | B9 | 3-534 | Se | X-1 | B10 |
| 3-383 | O | X-1 | B35 | 3-384 | O | X-1 | B36 | 3-535 | Se | X-1 | B11 | 3-536 | Se | X-1 | B12 |
| 3-385 | O | X-1 | B37 | 3-386 | O | X-1 | B38 | 3-537 | Se | X-1 | B13 | 3-538 | Se | X-1 | B14 |
| 3-387 | O | X-1 | B39 | 3-388 | O | X-1 | B40 | 3-539 | Se | X-1 | B15 | 3-540 | Se | X-1 | B16 |
| 3-389 | O | X-1 | B41 | 3-390 | O | X-1 | B42 | 3-541 | Se | X-1 | B17 | 3-542 | Se | X-1 | B18 |
| 3-391 | O | X-1 | B43 | 3-392 | O | X-1 | B44 | 3-543 | Se | X-1 | B19 | 3-544 | Se | X-1 | B20 |
| 3-393 | O | X-1 | B45 | 3-394 | O | X-1 | B46 | 3-545 | Se | X-1 | B21 | 3-546 | Se | X-1 | B22 |
| 3-395 | O | X-1 | B47 | 3-396 | O | X-1 | B48 | 3-547 | Se | X-1 | B23 | 3-548 | Se | X-1 | B24 |
| 3-397 | O | X-1 | B49 | 3-398 | O | X-1 | B50 | 3-549 | Se | X-1 | B25 | 3-550 | Se | X-1 | B26 |
| 3-399 | O | X-1 | B51 | 3-400 | O | X-1 | B52 | 3-551 | Se | X-1 | B27 | 3-552 | Se | X-1 | B28 |
| 3-401 | O | X-1 | B53 | 3-402 | O | X-1 | B54 | 3-553 | Se | X-1 | B29 | 3-554 | Se | X-1 | B30 |
| 3-403 | O | X-1 | B55 | 3-404 | O | X-1 | B56 | 3-555 | Se | X-1 | B31 | 3-556 | Se | X-1 | B32 |
| 3-405 | O | X-1 | B57 | 3-406 | O | X-1 | B58 | 3-557 | Se | X-1 | B33 | 3-558 | Se | X-1 | B34 |
| 3-407 | O | X-1 | B59 | 3-408 | O | X-1 | B60 | 3-559 | Se | X-1 | B35 | 3-560 | Se | X-1 | B36 |
| 3-409 | O | X-1 | B61 | 3-410 | O | X-1 | B62 | 3-561 | Se | X-1 | B37 | 3-562 | Se | X-1 | B38 |
| 3-411 | O | X-1 | B63 | 3-412 | O | X-1 | B64 | 3-563 | Se | X-1 | B39 | 3-564 | Se | X-1 | B40 |
| 3-413 | O | X-1 | B65 | 3-414 | O | X-1 | B66 | 3-565 | Se | X-1 | B41 | 3-566 | Se | X-1 | B42 |
| 3-415 | O | X-1 | B67 | 3-416 | O | X-1 | B68 | 3-567 | Se | X-1 | B43 | 3-568 | Se | X-1 | B44 |
| 3-417 | O | X-1 | B69 | 3-418 | O | X-1 | B70 | 3-569 | Se | X-1 | B45 | 3-570 | Se | X-1 | B46 |
| 3-419 | O | X-1 | B71 | 3-420 | O | X-1 | B72 | 3-571 | Se | X-1 | B47 | 3-572 | Se | X-1 | B48 |
| 3-421 | O | X-1 | B73 | 3-422 | O | X-1 | B74 | 3-573 | Se | X-1 | B49 | 3-574 | Se | X-1 | B50 |
| 3-423 | O | X-1 | B75 | 3-424 | O | X-1 | B76 | 3-575 | Se | X-1 | B51 | 3-576 | Se | X-1 | B52 |
| 3-425 | O | X-1 | B77 | 3-426 | O | X-1 | B78 | 3-577 | Se | X-1 | B53 | 3-578 | Se | X-1 | B54 |
| 3-427 | O | X-1 | B79 | 3-428 | O | X-1 | B80 | 3-579 | Se | X-1 | B55 | 3-580 | Se | X-1 | B56 |
| 3-429 | O | X-1 | B81 | 3-430 | O | X-1 | B82 | 3-581 | Se | X-1 | B57 | 3-582 | Se | X-1 | B58 |
| 3-431 | O | X-1 | B83 | 3-432 | O | X-1 | B84 | 3-583 | Se | X-1 | B59 | 3-584 | Se | X-1 | B60 |
| 3-433 | O | X-1 | B85 | 3-434 | O | X-1 | B86 | 3-585 | Se | X-1 | B61 | 3-586 | Se | X-1 | B62 |
| 3-435 | O | X-1 | B87 | 3-436 | O | X-1 | B88 | 3-587 | Se | X-1 | B63 | 3-588 | Se | X-1 | B64 |
| 3-437 | S | X-1 | B1 | 3-438 | S | X-1 | B2 | 3-589 | Se | X-1 | B65 | 3-590 | Se | X-1 | B66 |
| 3-439 | S | X-1 | B3 | 3-440 | S | X-1 | B4 | 3-591 | Se | X-1 | B67 | 3-592 | Se | X-1 | B68 |
| 3-441 | S | X-1 | B5 | 3-442 | S | X-1 | B6 | 3-593 | Se | X-1 | B69 | 3-594 | Se | X-1 | B70 |
| 3-443 | S | X-1 | B7 | 3-444 | S | X-1 | B8 | 3-595 | Se | X-1 | B71 | 3-596 | Se | X-1 | B72 |
| 3-445 | S | X-1 | B9 | 3-446 | S | X-1 | B10 | 3-597 | Se | X-1 | B73 | 3-598 | Se | X-1 | B74 |
| 3-447 | S | X-1 | B11 | 3-448 | S | X-1 | B12 | 3-599 | Se | X-1 | B75 | 3-600 | Se | X-1 | B76 |
| 3-449 | S | X-1 | B13 | 3-450 | S | X-1 | B14 | 3-601 | Se | X-1 | B77 | 3-602 | Se | X-1 | B78 |
| 3-451 | S | X-1 | B15 | 3-452 | S | X-1 | B16 | 3-603 | Se | X-1 | B79 | 3-604 | Se | X-1 | B80 |
| 3-453 | S | X-1 | B17 | 3-454 | S | X-1 | B18 | 3-605 | Se | X-1 | B81 | 3-606 | Se | X-1 | B82 |
| 3-455 | S | X-1 | B19 | 3-456 | S | X-1 | B20 | 3-607 | Se | X-1 | B83 | 3-608 | Se | X-1 | B84 |
| 3-457 | S | X-1 | B21 | 3-458 | S | X-1 | B22 | 3-609 | Se | X-1 | B85 | 3-610 | Se | X-1 | B86 |
| 3-459 | S | X-1 | B23 | 3-460 | S | X-1 | B24 | 3-611 | Se | X-1 | B87 | 3-612 | Se | X-1 | B88 |
| 3-461 | S | X-1 | B25 | 3-462 | S | X-1 | B26 | 3-613 | O | X-2 | B1 | 3-614 | O | X-2 | B6 |
| 3-463 | S | X-1 | B27 | 3-464 | S | X-1 | B28 | 3-615 | O | X-2 | B10 | 3-616 | O | X-2 | B16 |
| 3-465 | S | X-1 | B29 | 3-466 | S | X-1 | B30 | 3-617 | O | X-2 | B25 | 3-618 | O | X-2 | B28 |
| 3-467 | S | X-1 | B31 | 3-468 | S | X-1 | B32 | 3-619 | O | X-2 | B29 | 3-620 | O | X-2 | B30 |
| 3-469 | S | X-1 | B33 | 3-470 | S | X-1 | B34 | 3-621 | O | X-2 | B38 | 3-622 | O | X-2 | B39 |
| 3-471 | S | X-1 | B35 | 3-472 | S | X-1 | B36 | 3-623 | O | X-2 | B40 | 3-624 | O | X-2 | B41 |
| 3-473 | S | X-1 | B37 | 3-474 | S | X-1 | B38 | 3-625 | O | X-2 | B43 | 3-626 | O | X-2 | B52 |
| 3-475 | S | X-1 | B39 | 3-476 | S | X-1 | B40 | 3-627 | O | X-2 | B56 | 3-628 | O | X-2 | B67 |
| 3-477 | S | X-1 | B41 | 3-478 | S | X-1 | B42 | 3-629 | O | X-2 | B68 | 3-630 | O | X-2 | B69 |
| 3-479 | S | X-1 | B43 | 3-480 | S | X-1 | B44 | 3-631 | O | X-2 | B70 | 3-632 | O | X-2 | B71 |
| 3-481 | S | X-1 | B45 | 3-482 | S | X-1 | B46 | 3-633 | O | X-2 | B72 | 3-634 | O | X-2 | B74 |
| 3-483 | S | X-1 | B47 | 3-484 | S | X-1 | B48 | 3-635 | O | X-2 | B79 | 3-636 | O | X-2 | B80 |
| 3-485 | S | X-1 | B49 | 3-486 | S | X-1 | B50 | 3-637 | O | X-2 | B82 | 3-638 | O | X-2 | B83 |
| 3-487 | S | X-1 | B51 | 3-488 | S | X-1 | B52 | 3-639 | O | X-2 | B86 | 3-640 | O | X-2 | B88 |
| 3-489 | S | X-1 | B53 | 3-490 | S | X-1 | B54 | 3-641 | S | X-2 | B1 | 3-642 | S | X-2 | B6 |
| 3-491 | S | X-1 | B55 | 3-492 | S | X-1 | B56 | 3-643 | S | X-2 | B10 | 3-644 | S | X-2 | B16 |
| 3-493 | S | X-1 | B57 | 3-494 | S | X-1 | B58 | 3-645 | S | X-2 | B25 | 3-646 | S | X-2 | B28 |
| 3-495 | S | X-1 | B59 | 3-496 | S | X-1 | B60 | 3-647 | S | X-2 | B29 | 3-648 | S | X-2 | B30 |
| 3-497 | S | X-1 | B61 | 3-498 | S | X-1 | B62 | 3-649 | S | X-2 | B38 | 3-650 | S | X-2 | B39 |
| 3-499 | S | X-1 | B63 | 3-500 | S | X-1 | B64 | 3-651 | S | X-2 | B40 | 3-652 | S | X-2 | B41 |
| 3-501 | S | X-1 | B65 | 3-502 | S | X-1 | B66 | 3-653 | S | X-2 | B43 | 3-654 | S | X-2 | B52 |
| 3-503 | S | X-1 | B67 | 3-504 | S | X-1 | B68 | 3-655 | S | X-2 | B56 | 3-656 | S | X-2 | B67 |
| 3-505 | S | X-1 | B69 | 3-506 | S | X-1 | B70 | 3-657 | S | X-2 | B68 | 3-658 | S | X-2 | B69 |
| 3-507 | S | X-1 | B71 | 3-508 | S | X-1 | B72 | 3-659 | S | X-2 | B70 | 3-660 | S | X-2 | B71 |
| 3-509 | S | X-1 | B73 | 3-510 | S | X-1 | B74 | 3-661 | S | X-2 | B72 | 3-662 | S | X-2 | B74 |
| 3-511 | S | X-1 | B75 | 3-512 | S | X-1 | B76 | 3-663 | S | X-2 | B79 | 3-664 | S | X-2 | B80 |
| 3-513 | S | X-1 | B77 | 3-514 | S | X-1 | B78 | 3-665 | S | X-2 | B82 | 3-666 | S | X-2 | B83 |
| 3-515 | S | X-1 | B79 | 3-516 | S | X-1 | B80 | 3-667 | S | X-2 | B86 | 3-668 | S | X-2 | B88 |
| 3-517 | S | X-1 | B81 | 3-518 | S | X-1 | B82 | 3-669 | Se | X-2 | B1 | 3-670 | Se | X-2 | B6 |
| 3-519 | S | X-1 | B83 | 3-520 | S | X-1 | B84 | 3-671 | Se | X-2 | B10 | 3-672 | Se | X-2 | B16 |
| 3-521 | S | X-1 | B85 | 3-522 | S | X-1 | B86 | 3-673 | Se | X-2 | B25 | 3-674 | Se | X-2 | B28 |
| 3-523 | S | X-1 | B87 | 3-524 | S | X-1 | B88 | 3-675 | Se | X-2 | B29 | 3-676 | Se | X-2 | B30 |

-continued

| Compound No. | W₃ | X₃ | R₃ | Compound No. | W₃ | X₃ | R₃ |
|---|---|---|---|---|---|---|---|
| 3-677 | Se | X-2 | B38 | 3-678 | Se | X-2 | B39 |
| 3-679 | Se | X-2 | B40 | 3-680 | Se | X-2 | B41 |
| 3-681 | Se | X-2 | B43 | 3-682 | Se | X-2 | B52 |
| 3-683 | Se | X-2 | B56 | 3-684 | Se | X-2 | B67 |
| 3-685 | Se | X-2 | B68 | 3-686 | Se | X-2 | B69 |
| 3-687 | Se | X-2 | B70 | 3-688 | Se | X-2 | B71 |
| 3-689 | Se | X-2 | B72 | 3-690 | Se | X-2 | B74 |
| 3-691 | Se | X-2 | B79 | 3-692 | Se | X-2 | B80 |
| 3-693 | Se | X-2 | B82 | 3-694 | Se | X-2 | B83 |
| 3-695 | Se | X-2 | B86 | 3-696 | Se | X-2 | B88. |

13. The organic electroluminescent device according to claim 1, wherein the second organic material comprised in the first organic layer has a structure represented by Formula 4:

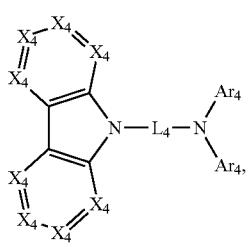

Formula 4 in Formula 4, $X_4$ is, at each occurrence identically or differently, selected from $CR_4$ or N;

$L_4$ is, at each occurrence identically or differently, selected from substituted or unsubstituted arylene having 6 to 30 carbon atoms, substituted or unsubstituted heteroarylene having 3 to 30 carbon atoms, or combinations thereof;

$Ar_4$ is, at each occurrence identically or differently, selected from substituted or unsubstituted aryl having 6 to 30 carbon atoms, substituted or unsubstituted heteroaryl having 3 to 30 carbon atoms, or combinations thereof;

$R_4$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

in Formula 4, adjacent substituents can be optionally joined to form a ring.

14. The organic electroluminescent device according to claim 1, wherein the second organic material is selected from the group consisting of Compound H-1 to Compound H-176:

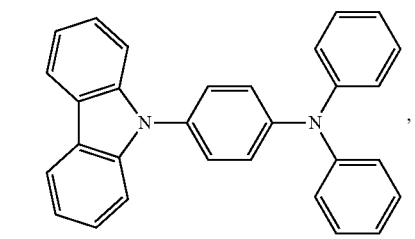

H-1

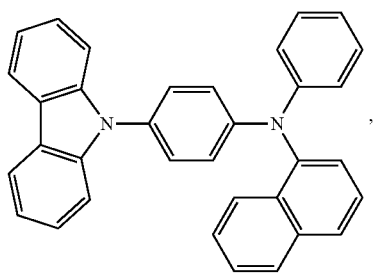

H-2

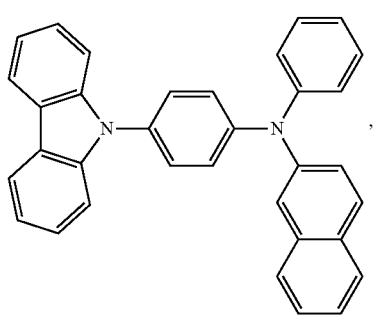

H-3

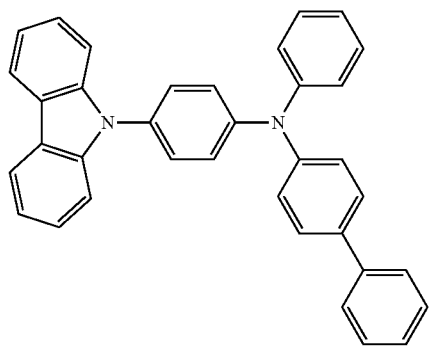

H-4

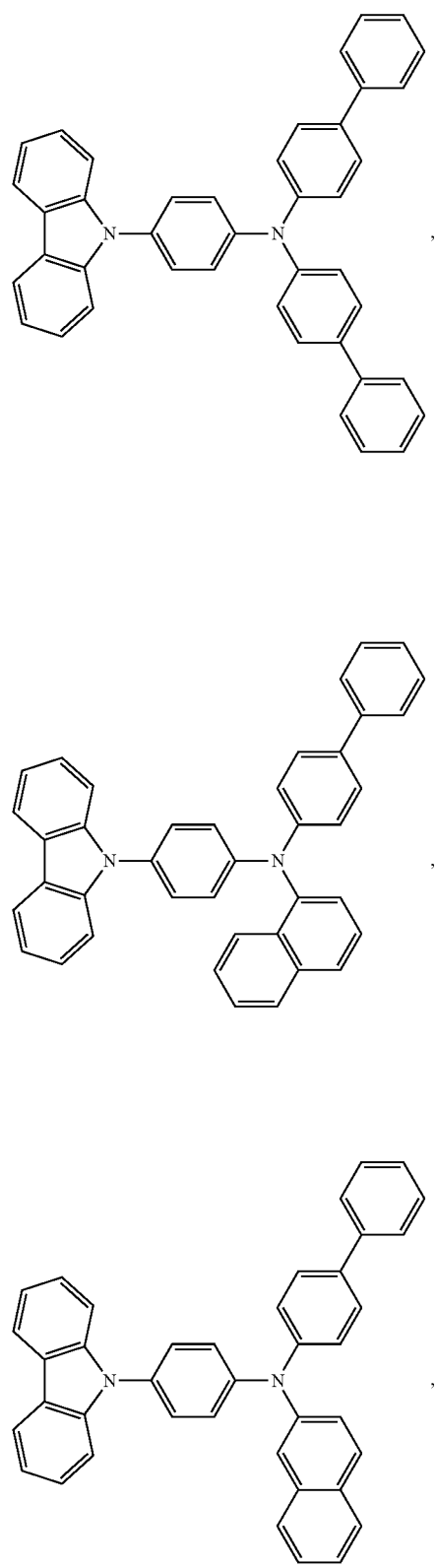
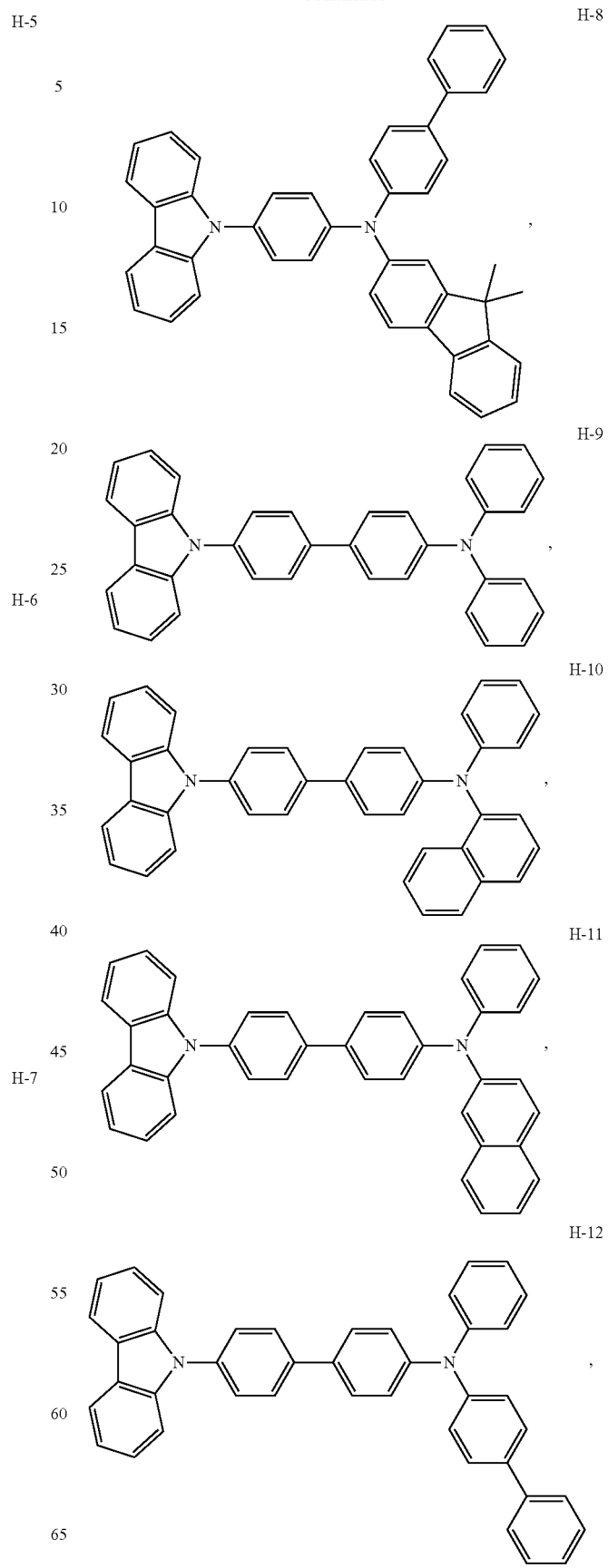

H-13
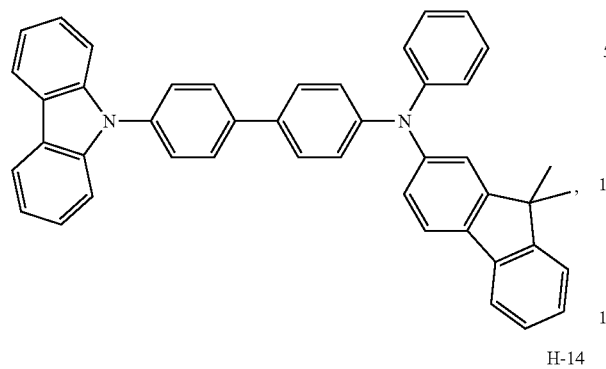
H-18
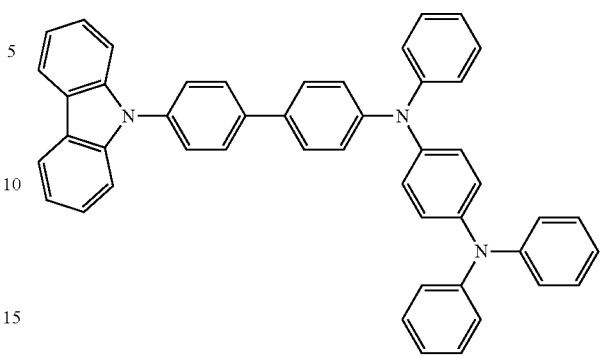
H-14
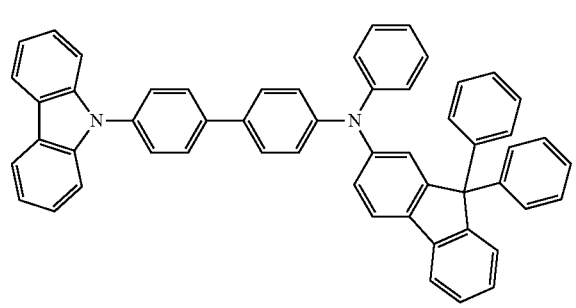
H-19
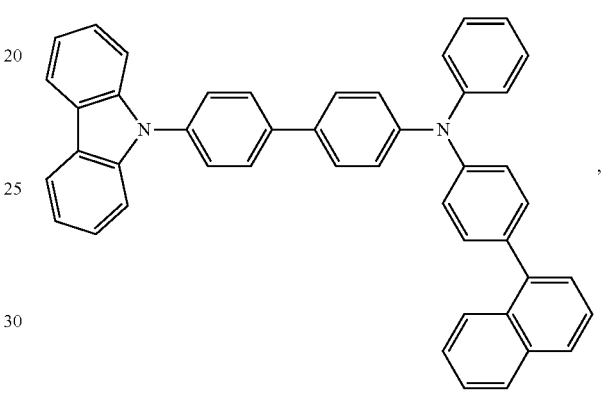
H-15
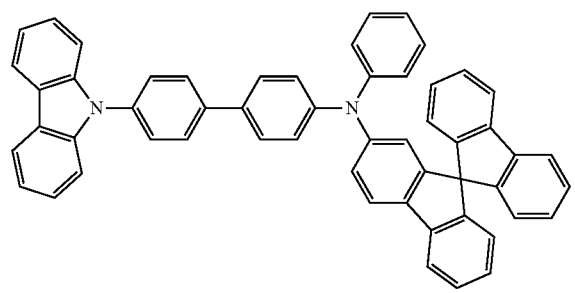
H-16
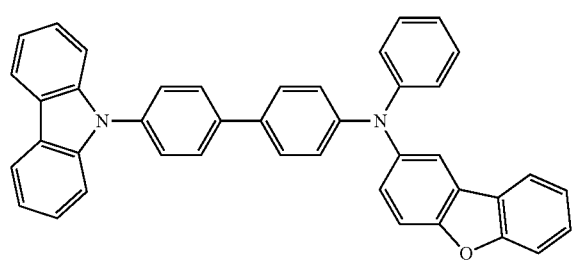
H-20
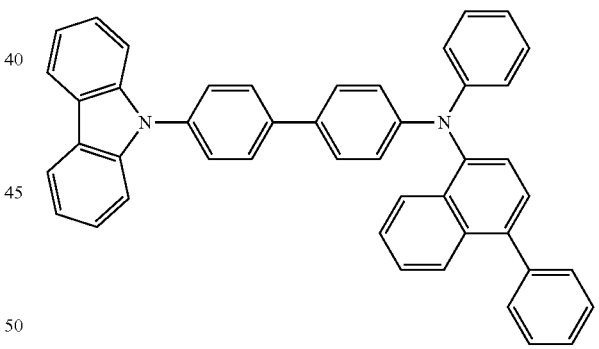
H-17
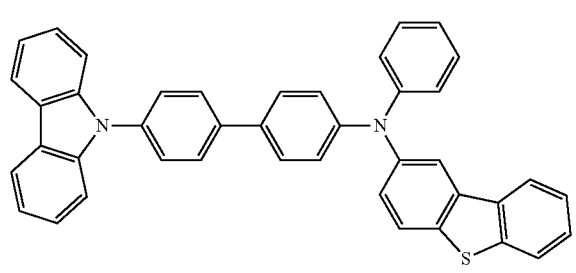
H-21

H-22
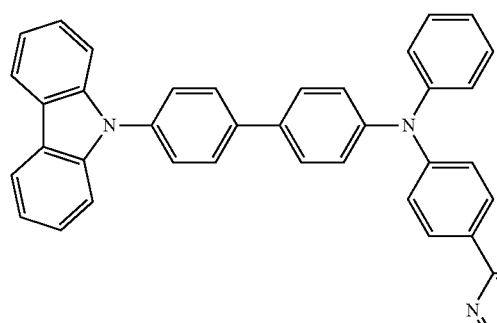
H-23
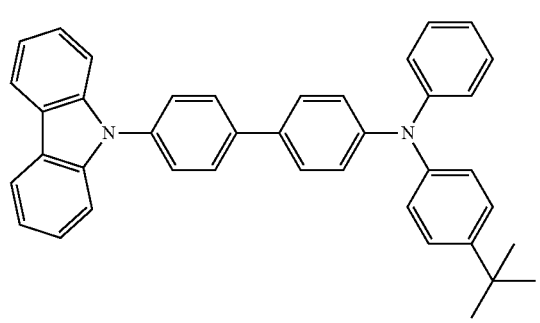
H-24
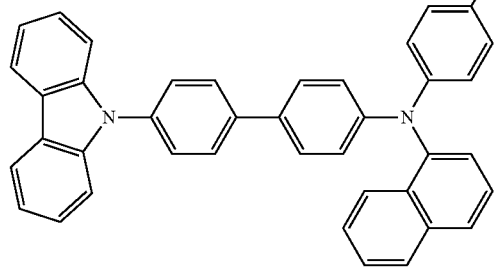
H-25
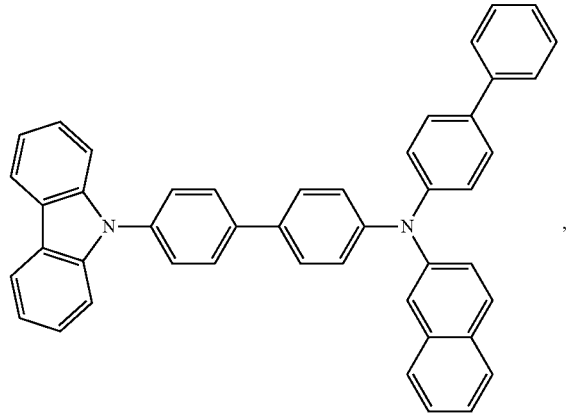
H-26
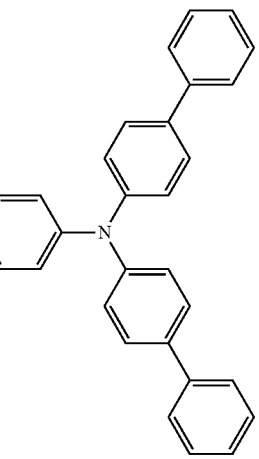
H-27
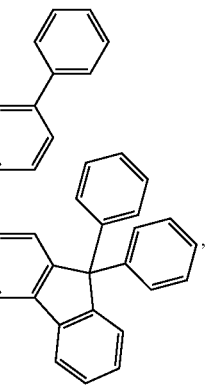
H-28

H-29
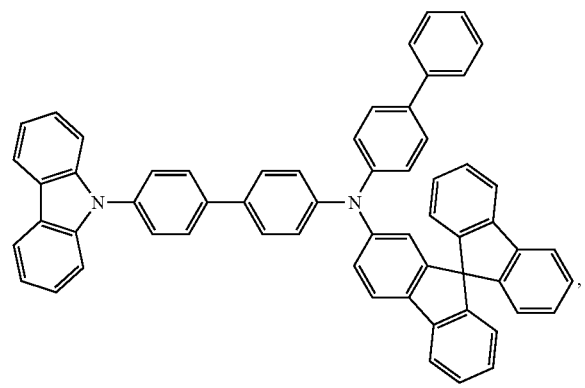
H-30
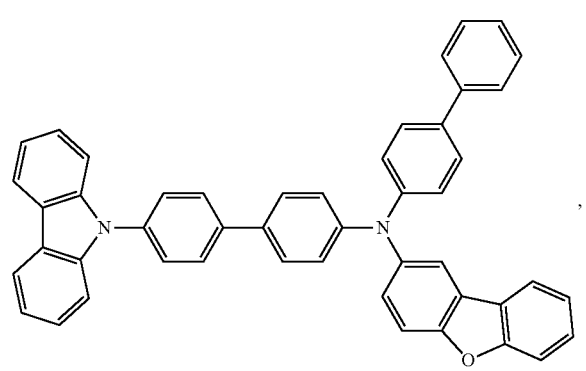
H-31
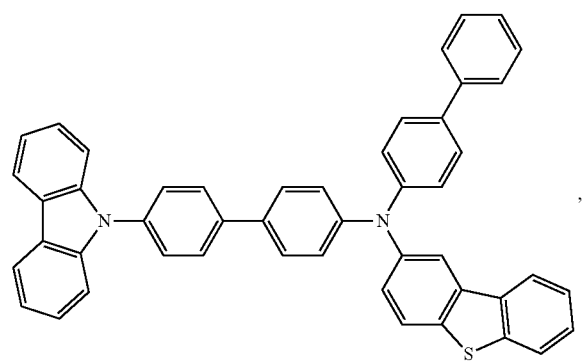
H-32
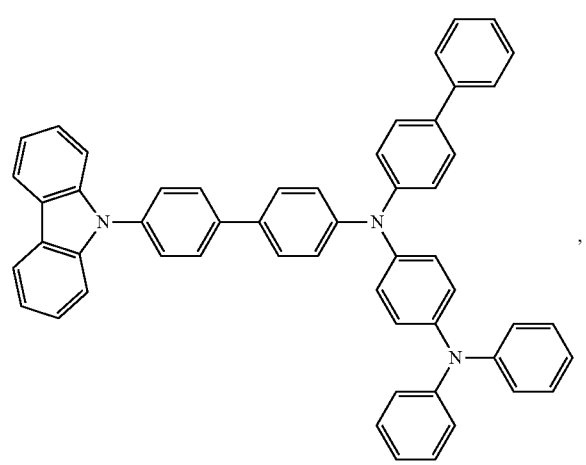
H-33
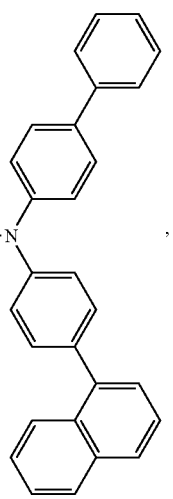
H-34
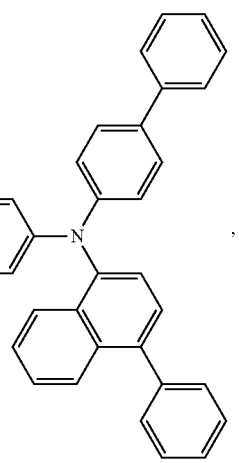
H-35
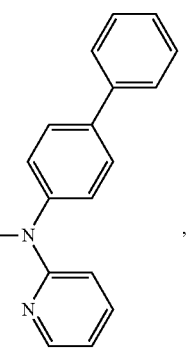

-continued
H-36
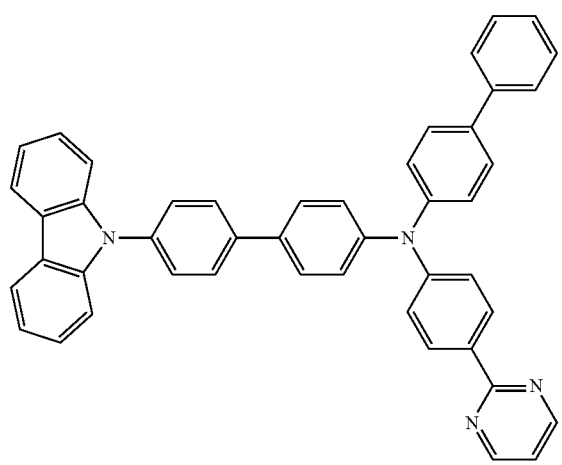
H-37
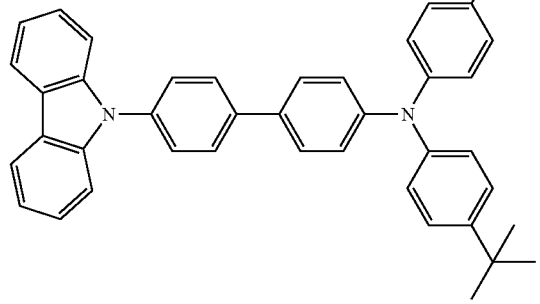
H-38
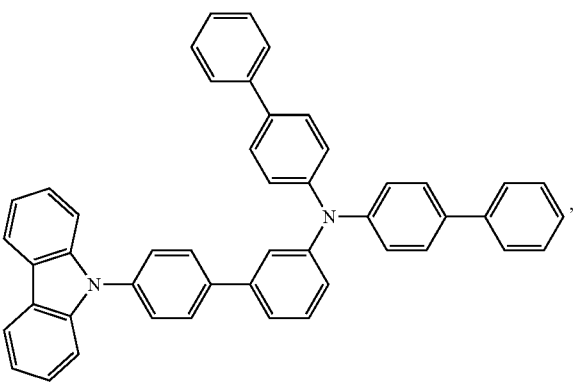
H-39
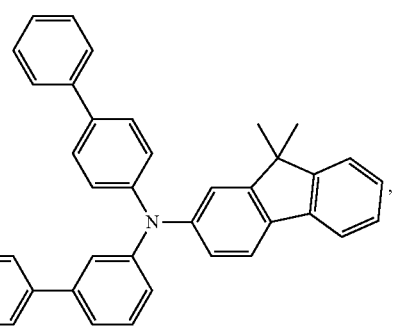
H-40, H-41, H-42
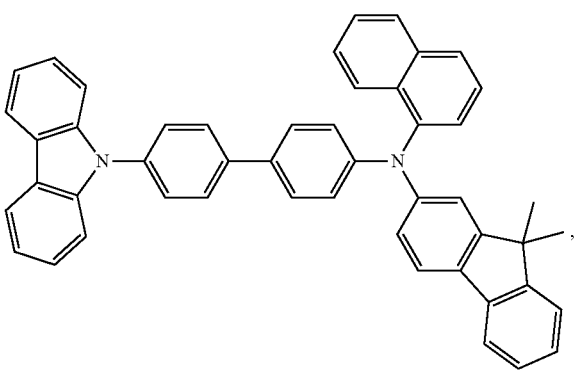

-continued
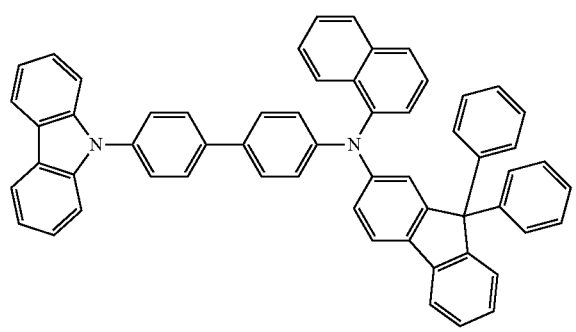
H-43
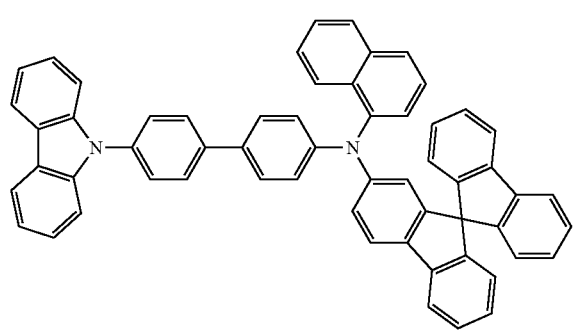
H-44
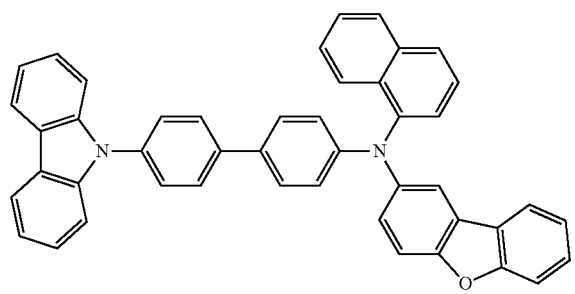
H-45
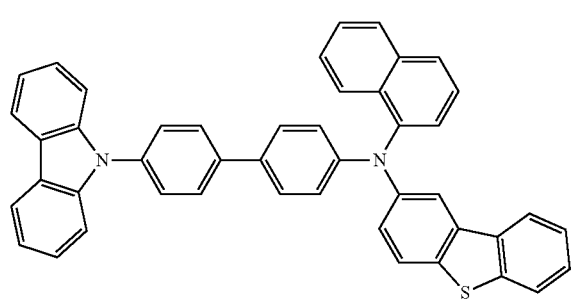
H-46
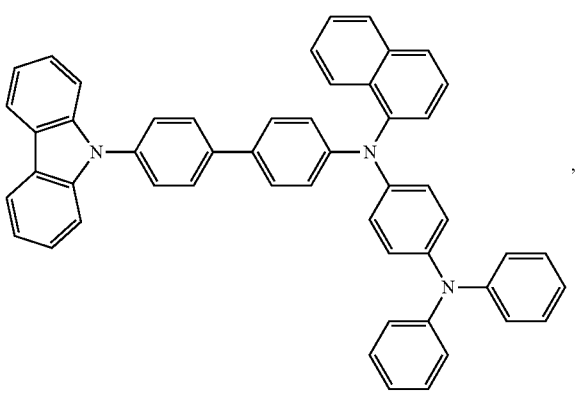
H-47
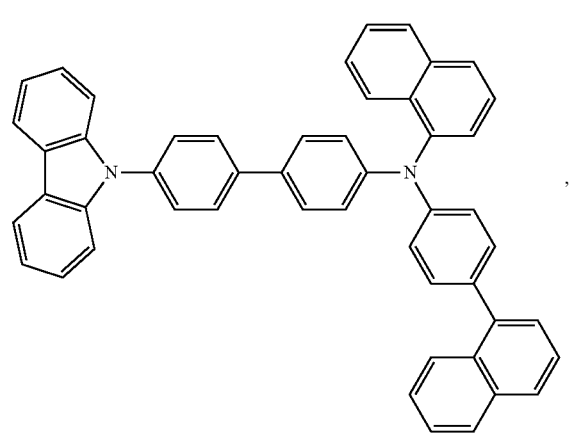
H-48
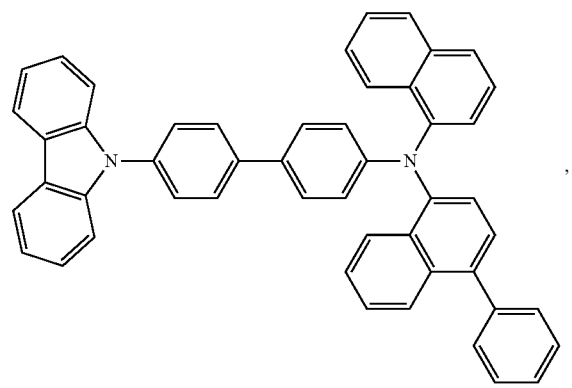
H-49
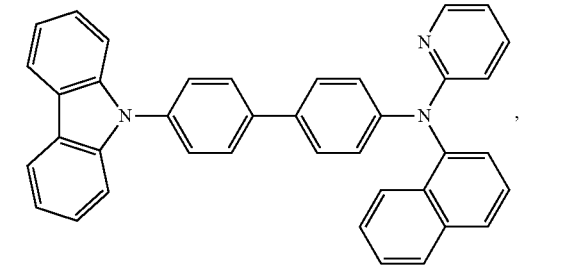
H-50

H-51
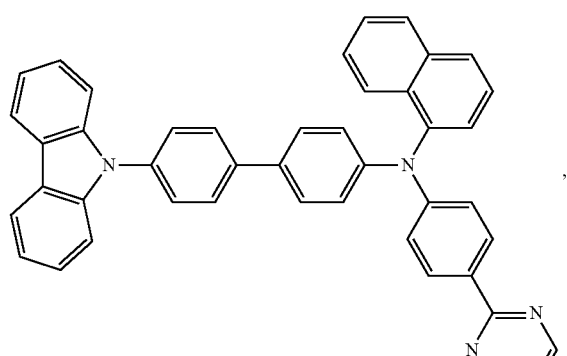
H-52
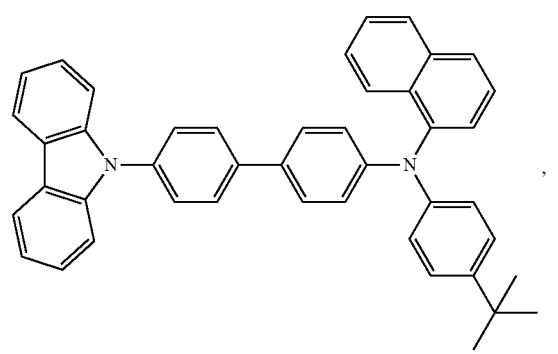
H-53
H-54
H-55
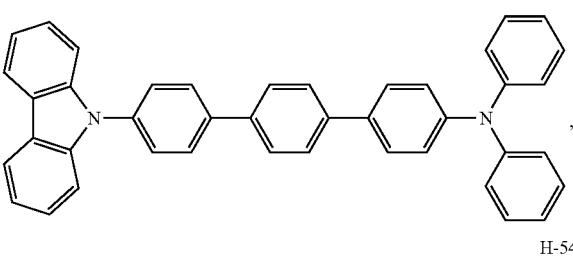
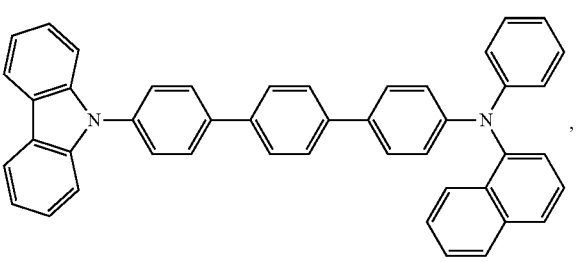
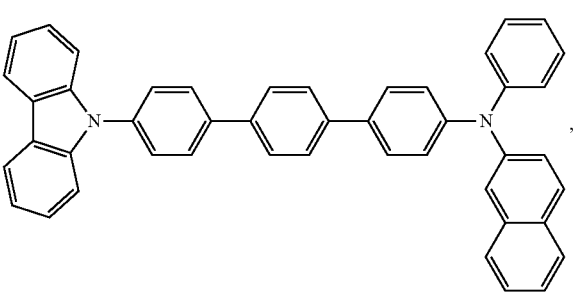
H-56
H-57
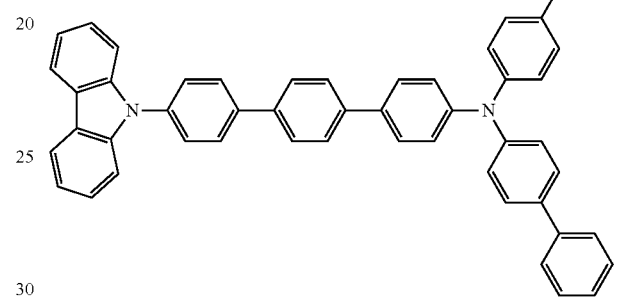
H-59

H-60
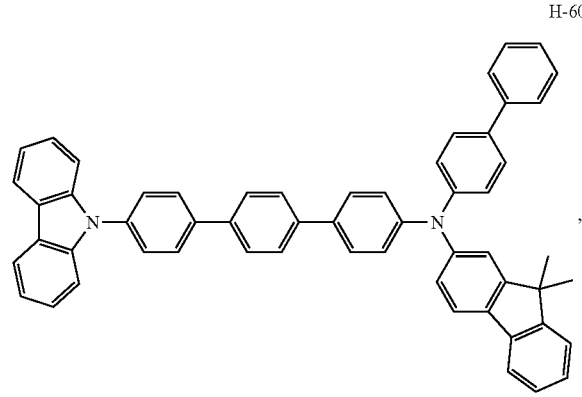
,
H-61
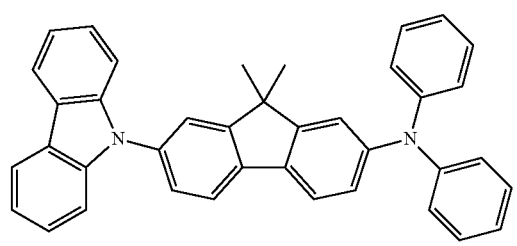
,
H-62
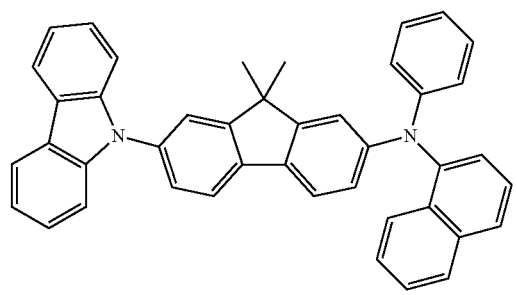
,
H-63
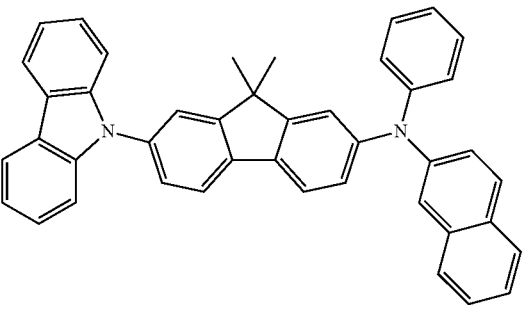
,
H-64
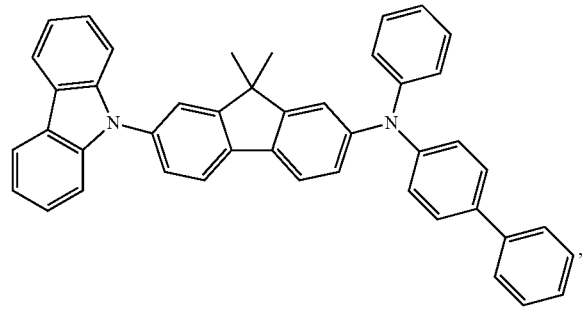
,
H-65
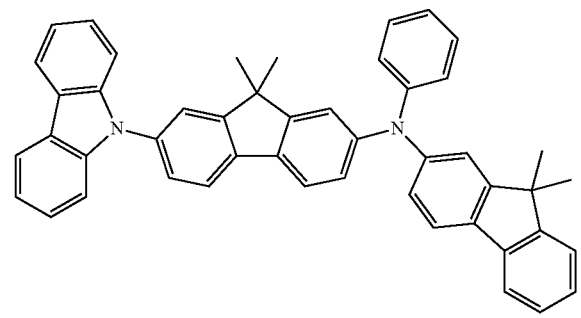
,
H-66
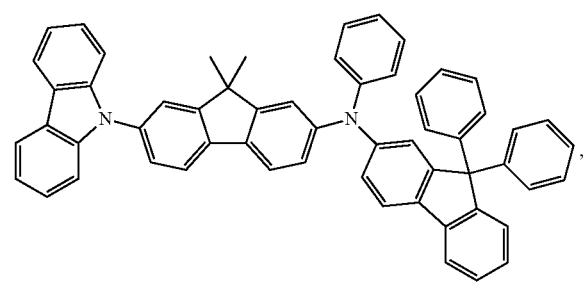
,
H-67
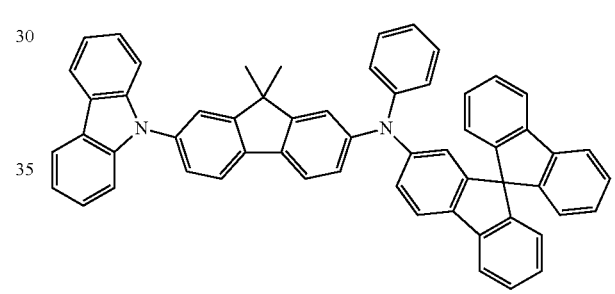
,
H-68
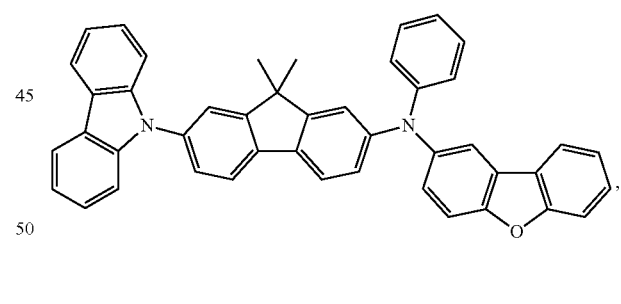
,
H-69

-continued
H-70
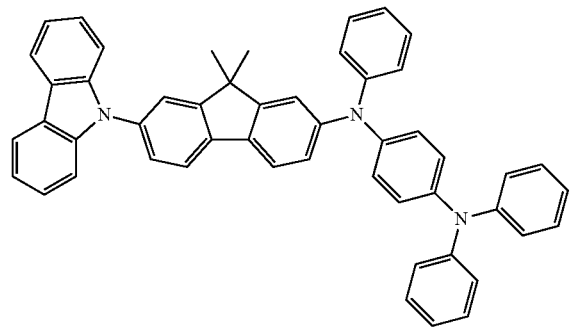
H-71
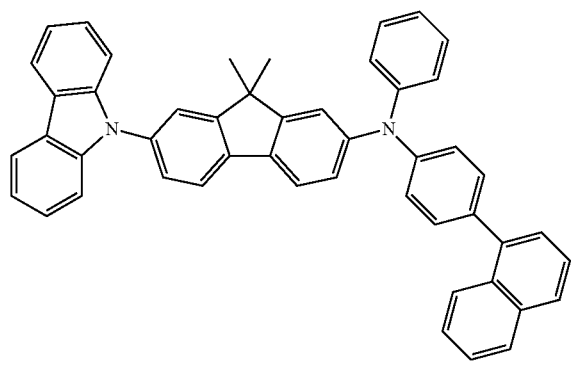
H-72
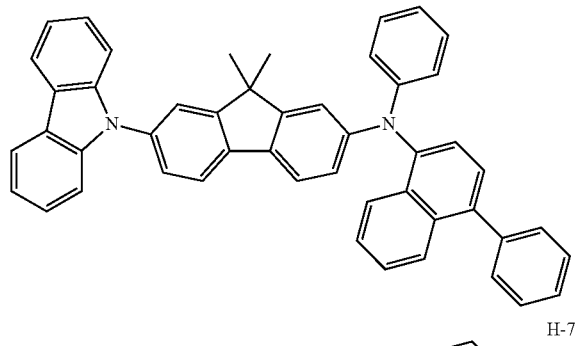
H-73
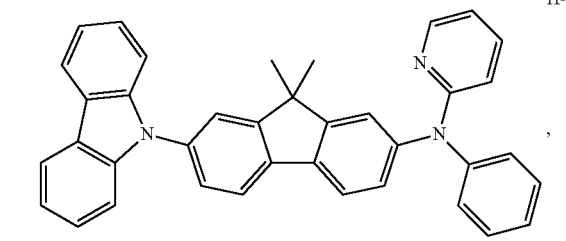
H-74
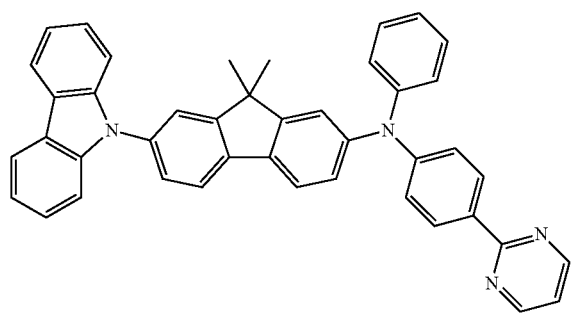
-continued
H-75
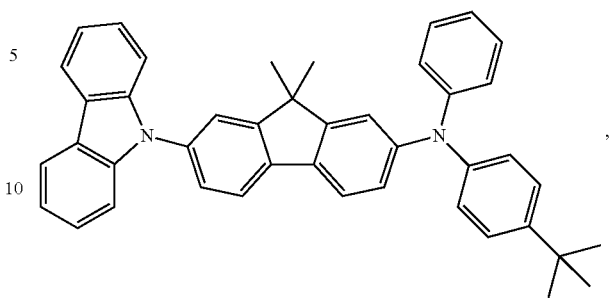
H-76
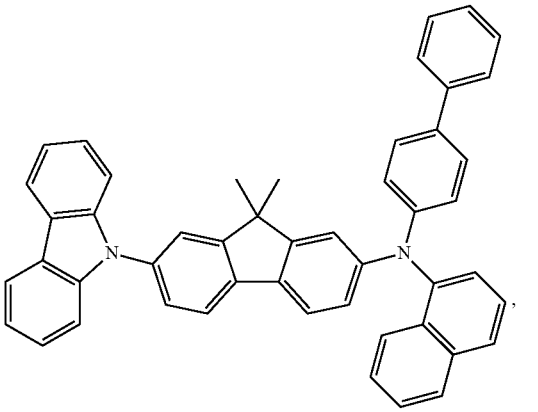
H-77
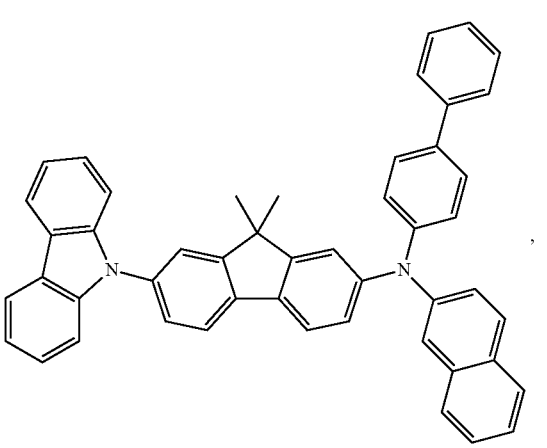
H-78
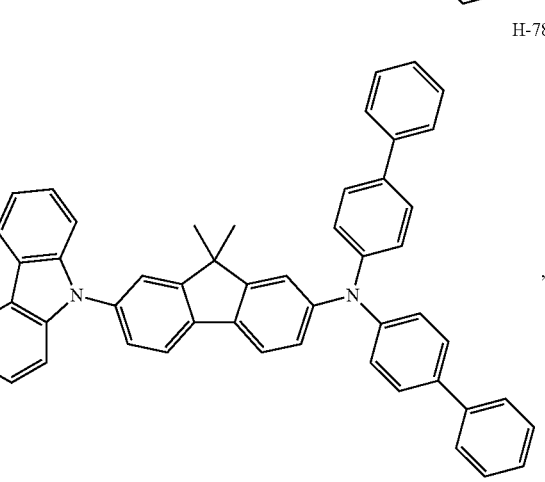

-continued
H-79
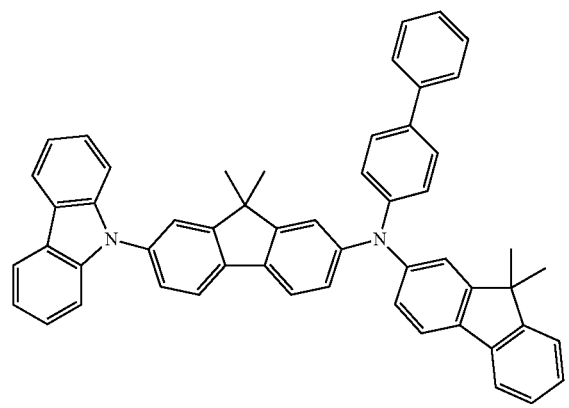
H-80
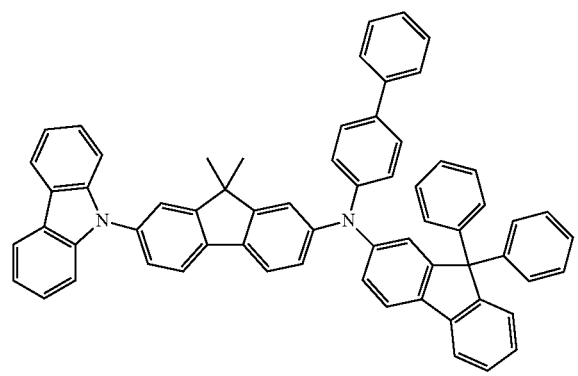
H-81
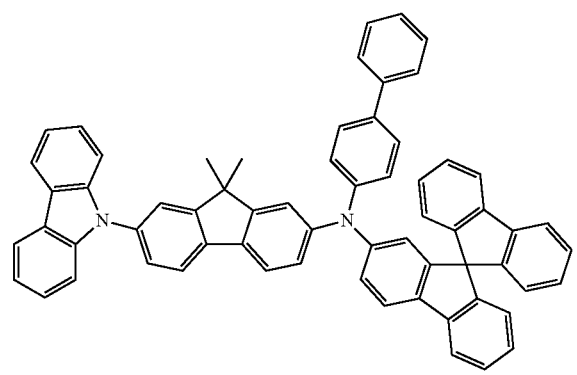
H-82
H-83
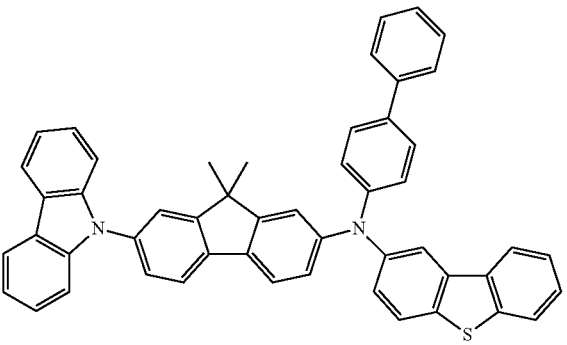
H-84
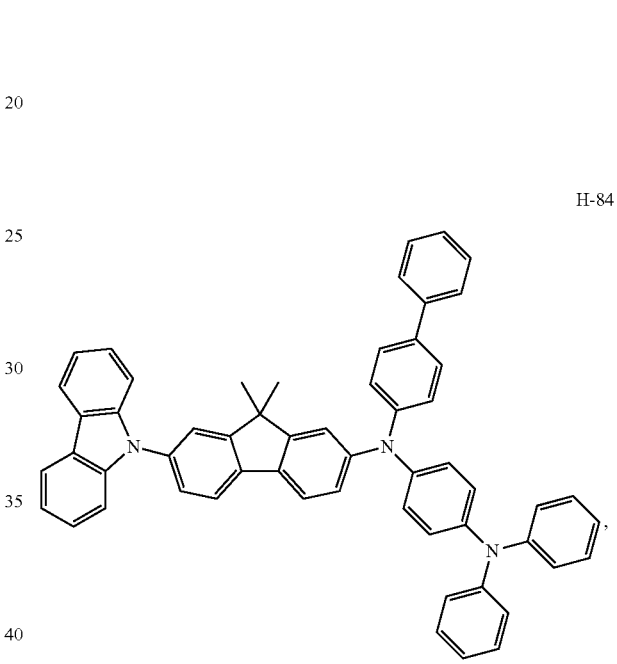
H-85
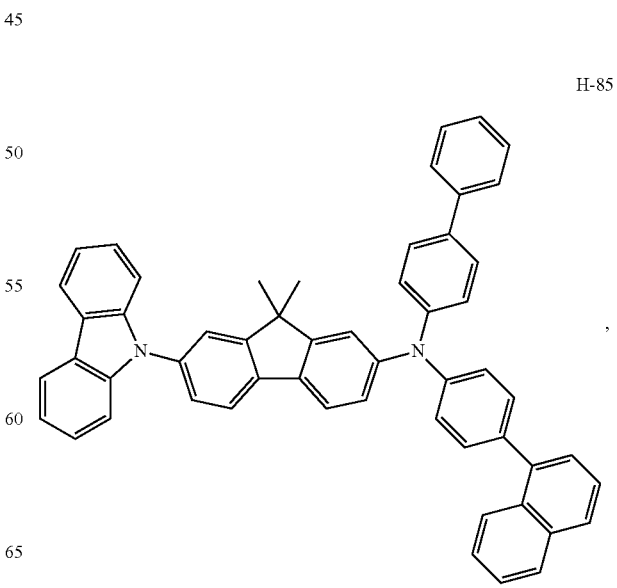

H-86
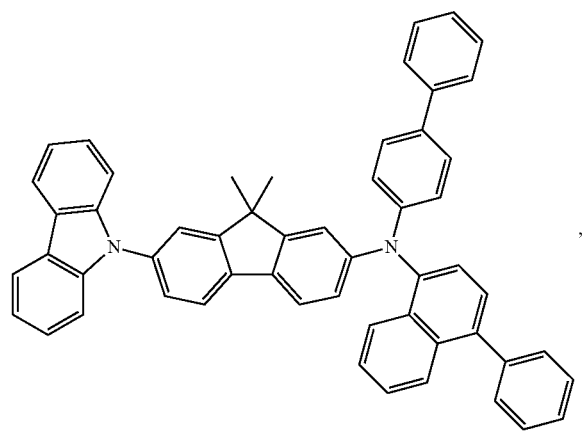
H-87
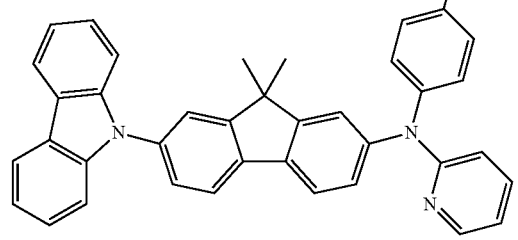
H-88
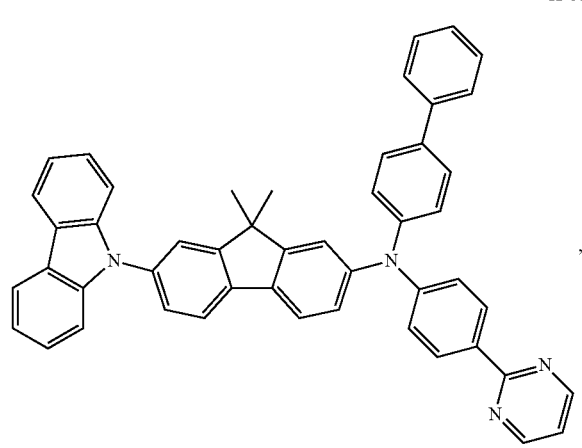
H-89
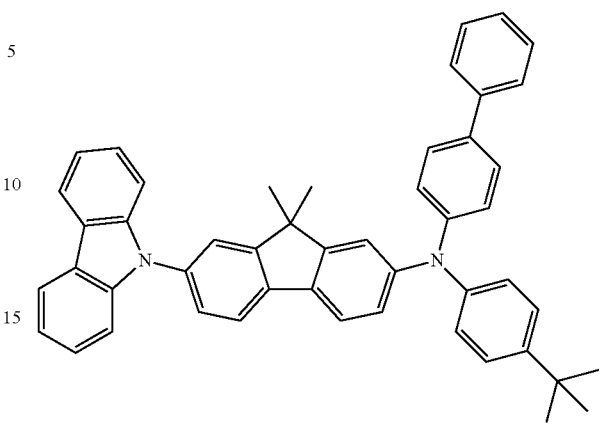
H-90
H-91
H-92
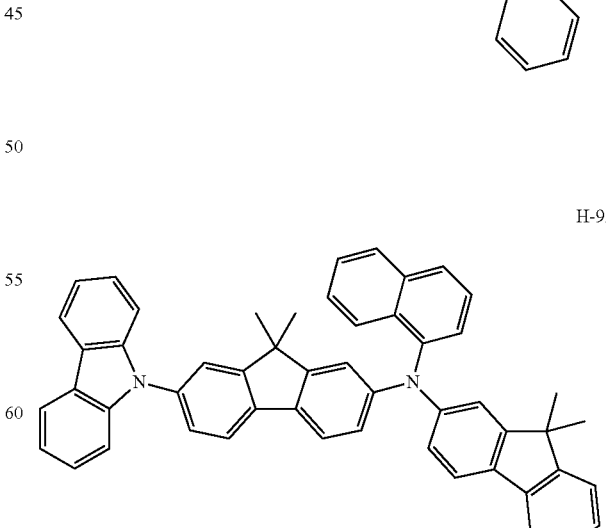

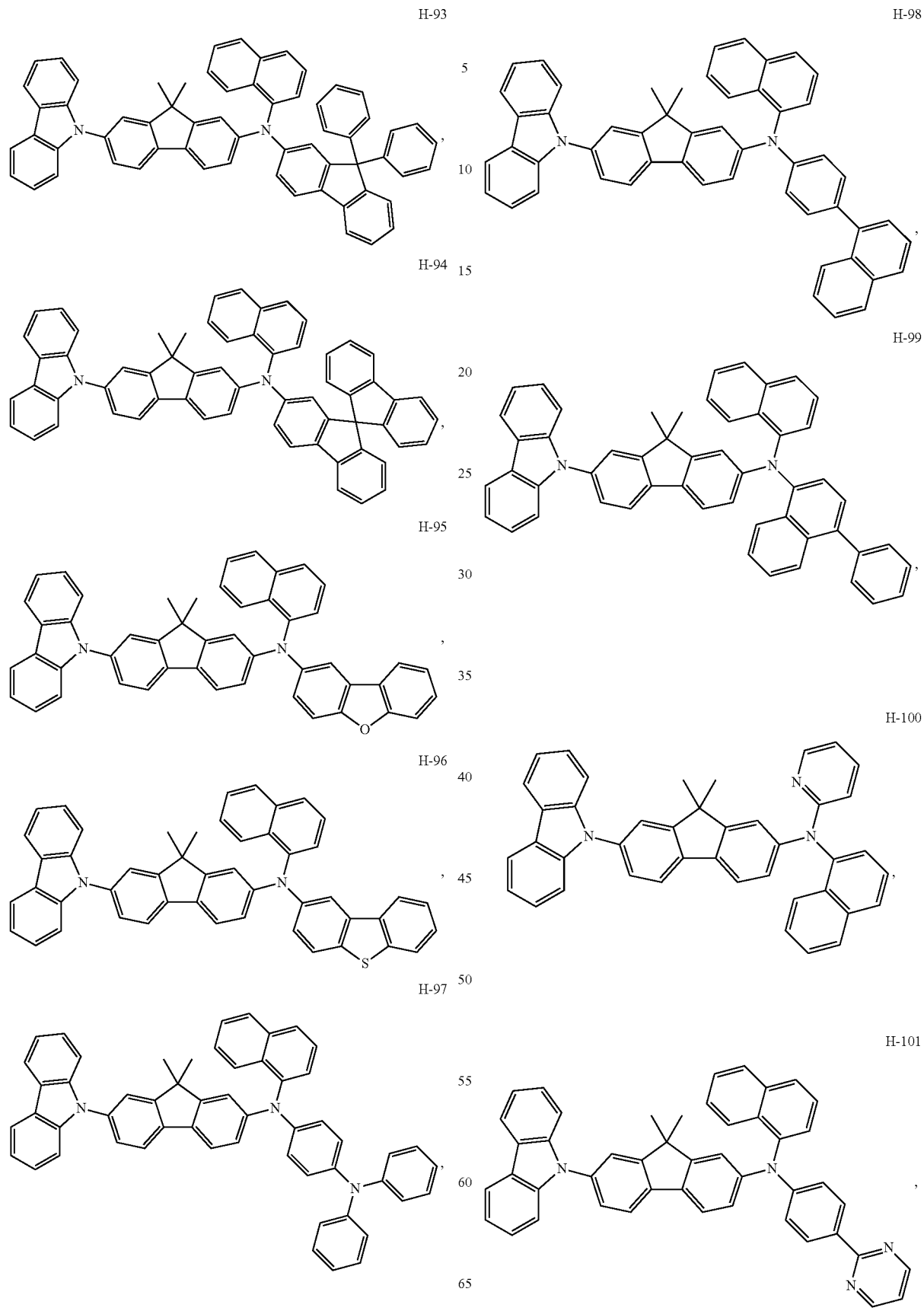

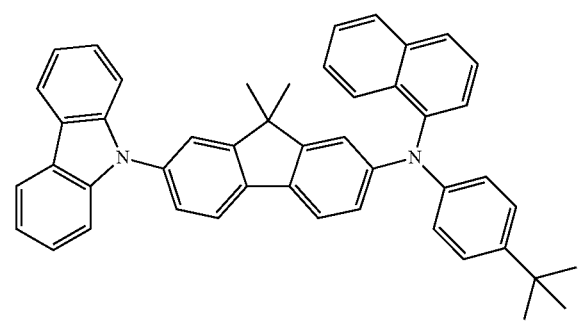
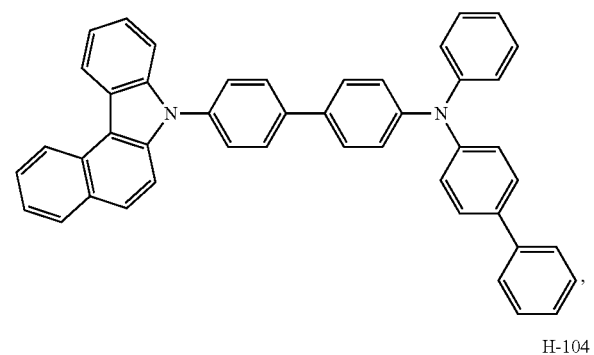
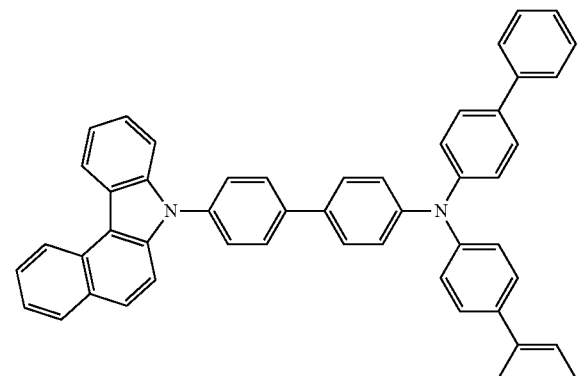
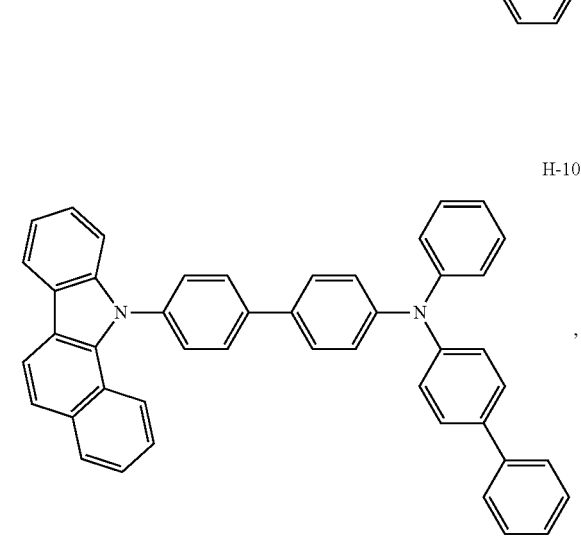

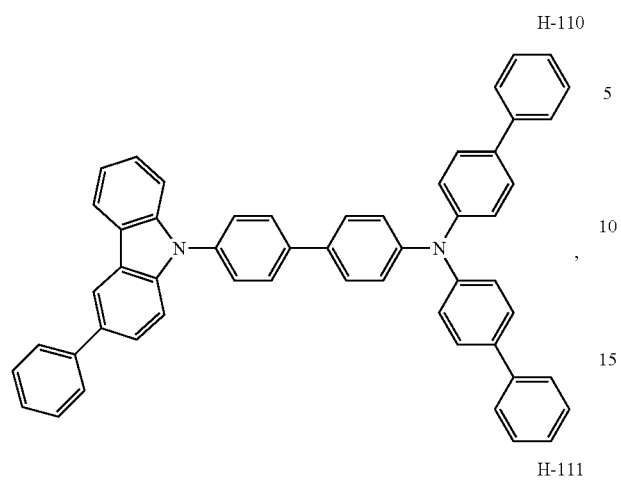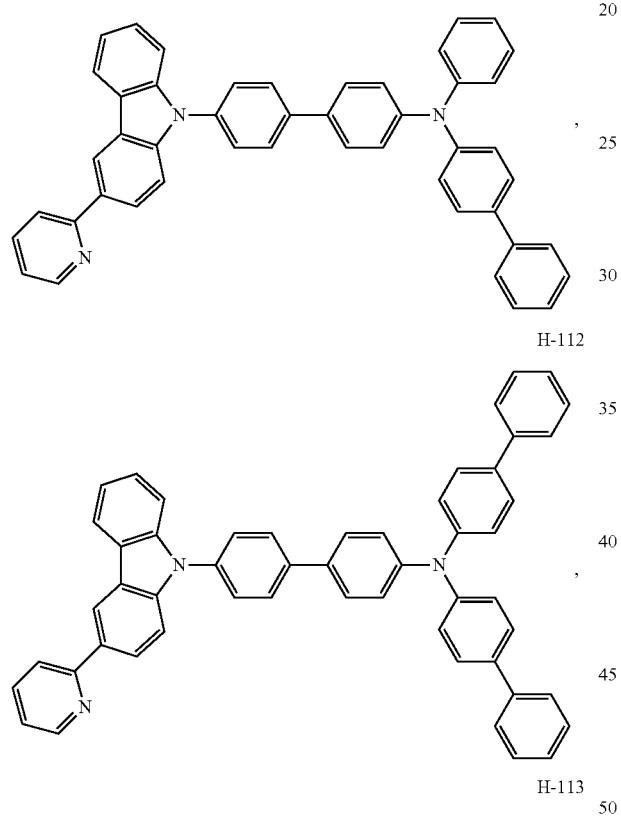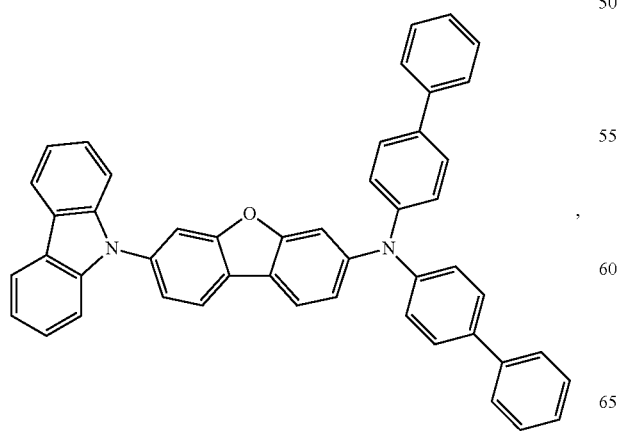

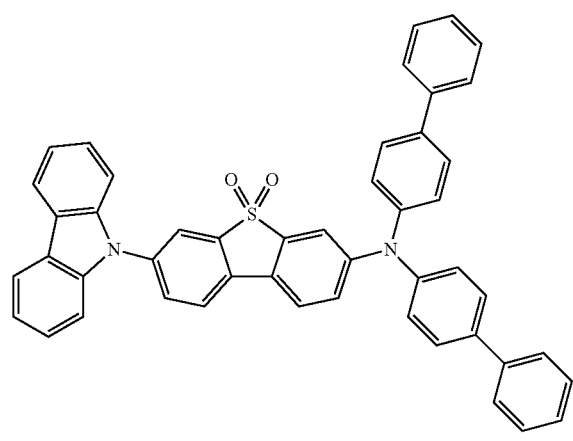
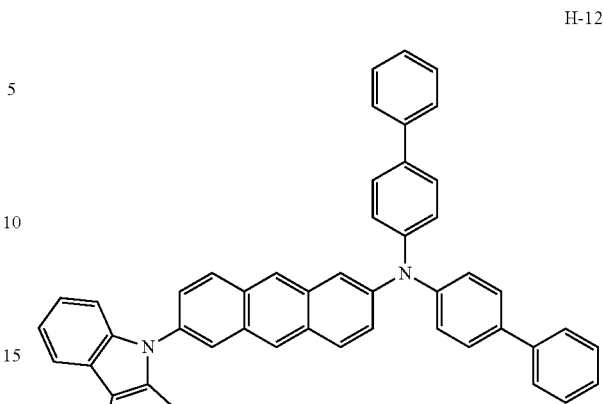
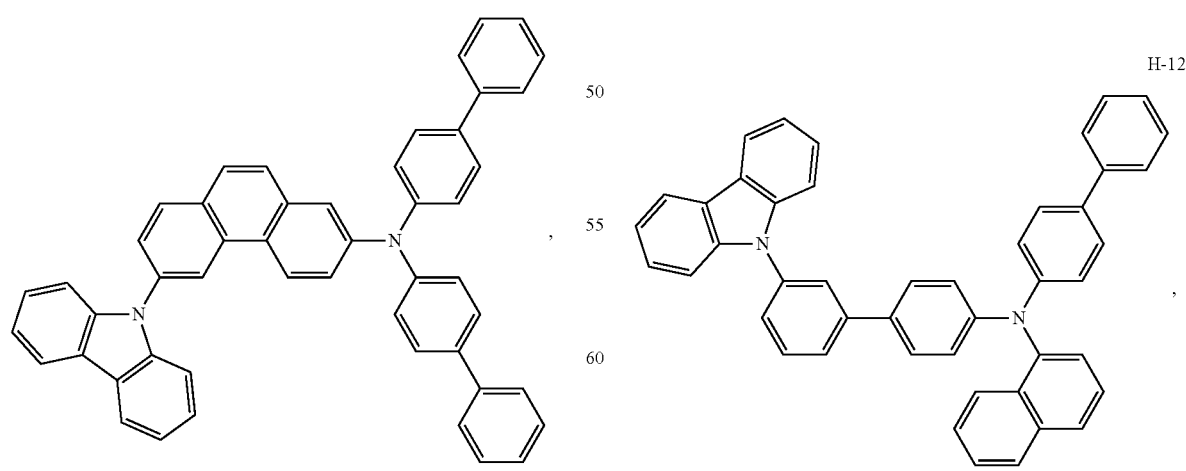

H-123
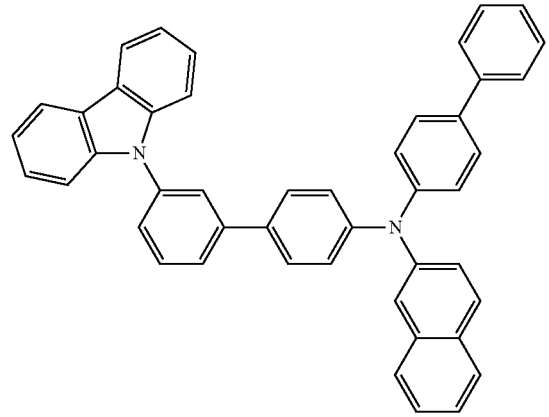
H-126
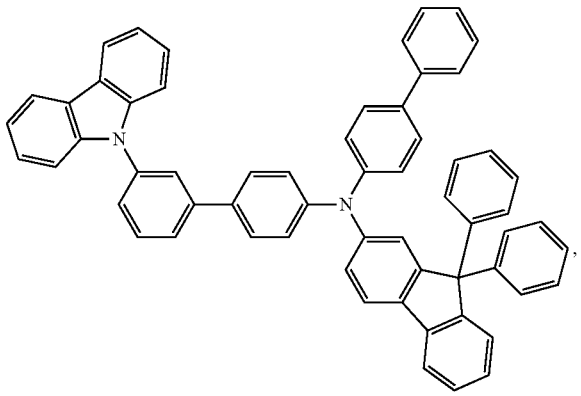
H-127
H-124
H-128
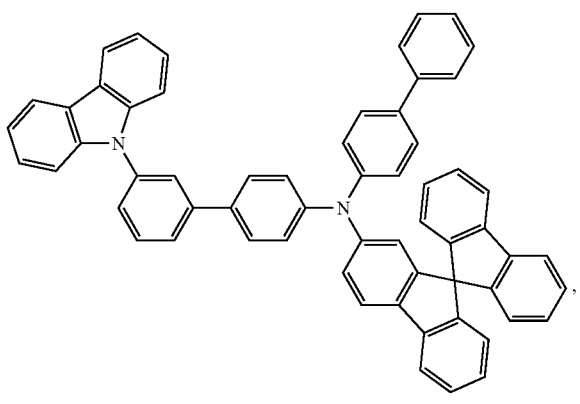
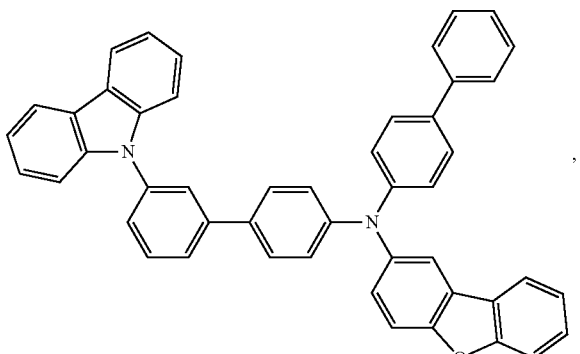
H-129
H-125
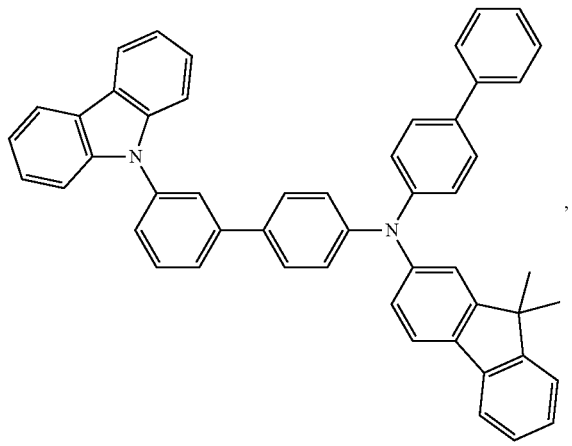

H-130
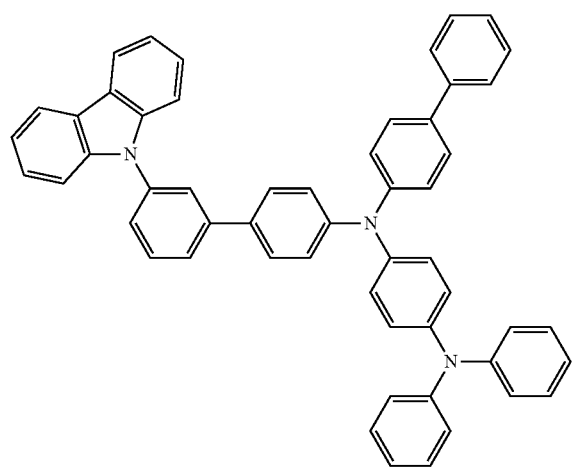
H-131
H-132
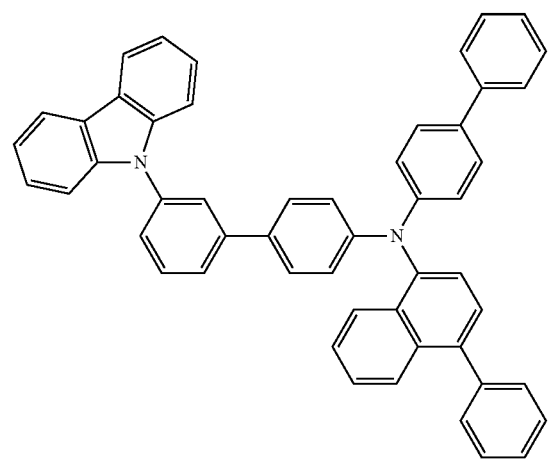
H-133
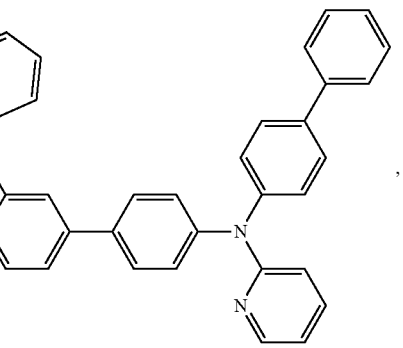
H-134
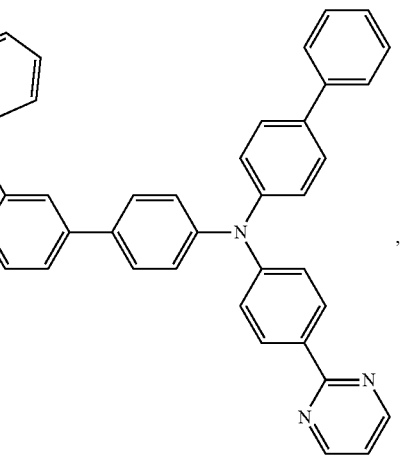
H-135
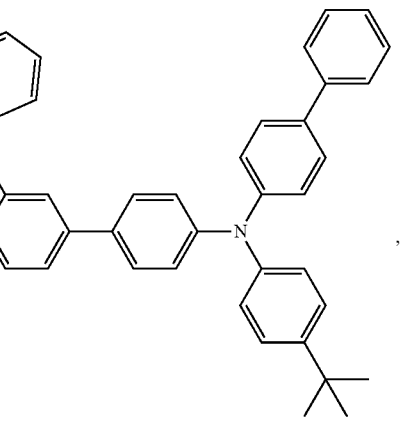
H-136
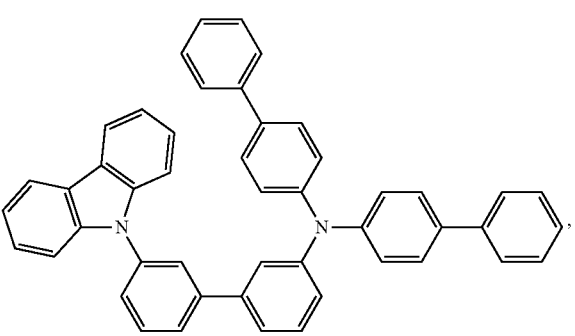

H-137
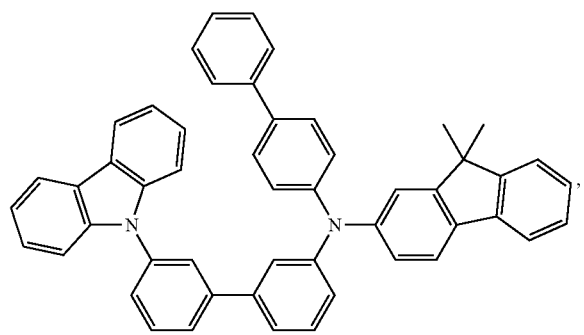
H-138
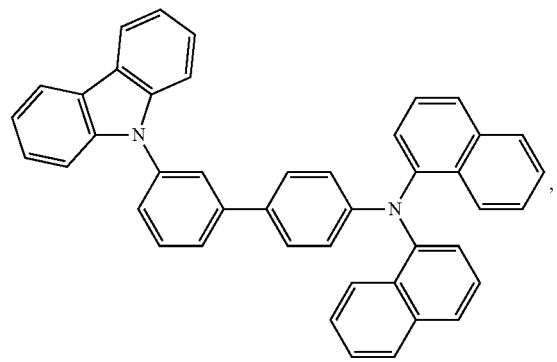
H-139
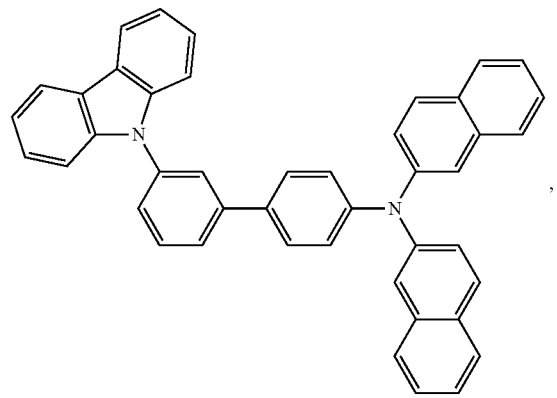
H-140
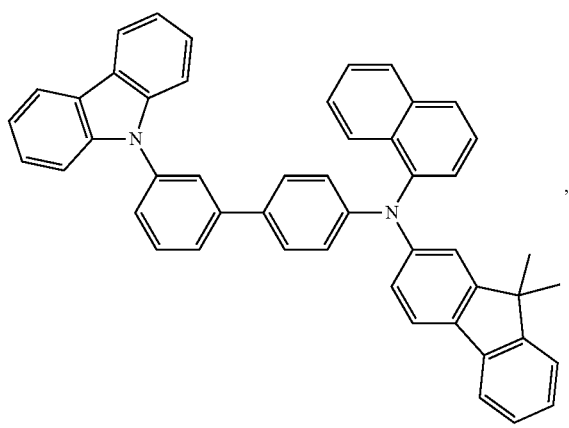
H-141
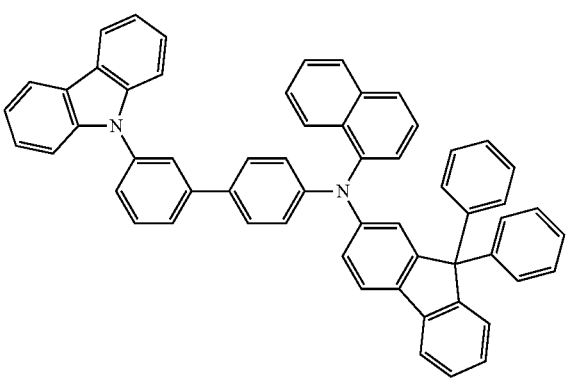
H-142
H-143
H-144
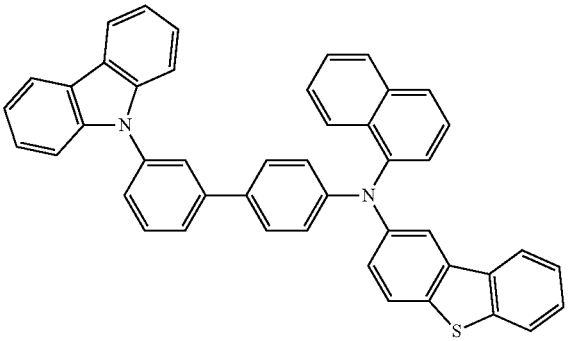

H-145
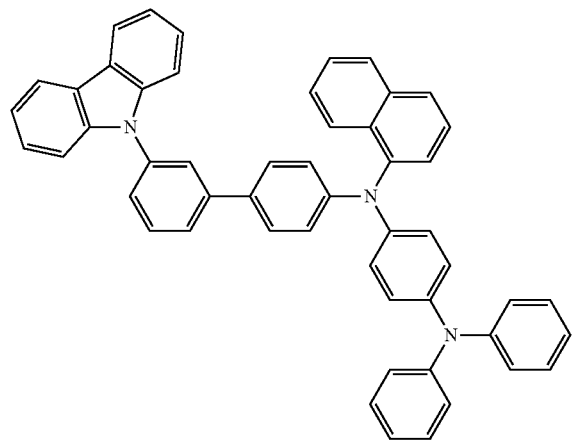
H-146
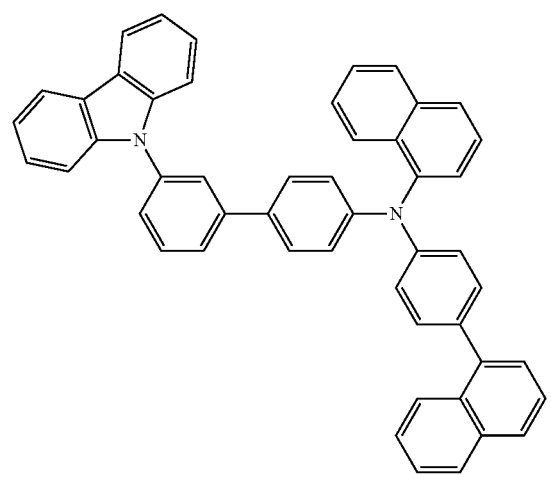
H-147
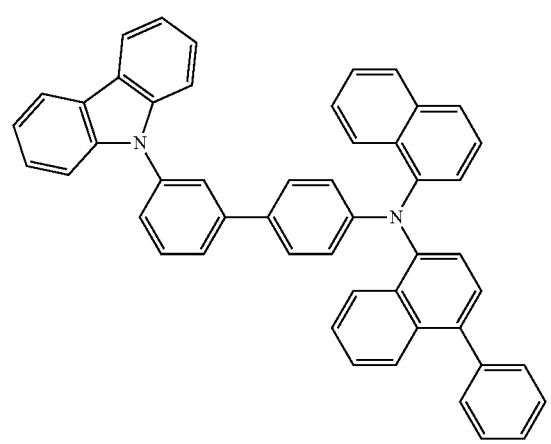
H-148
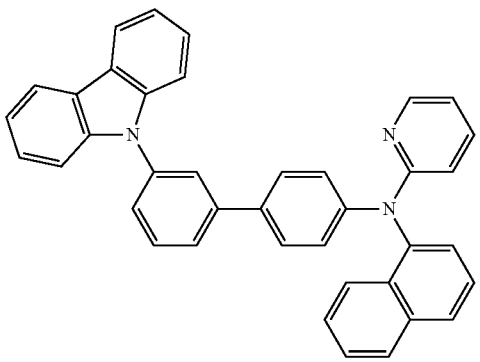
H-149
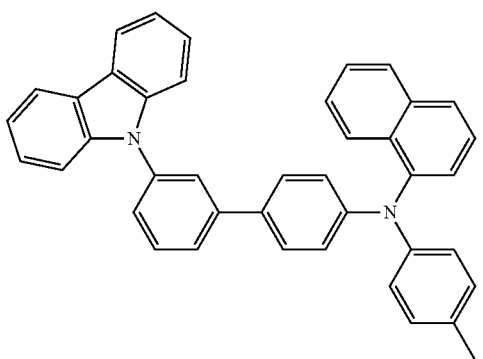
H-150
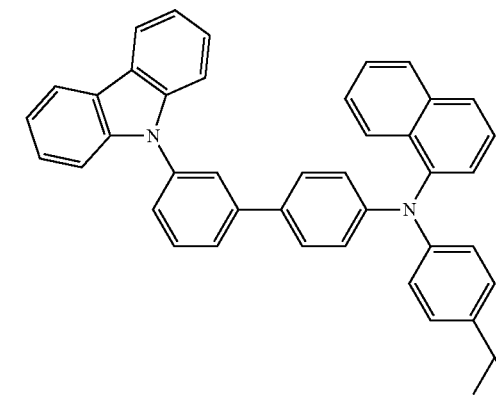
H-151
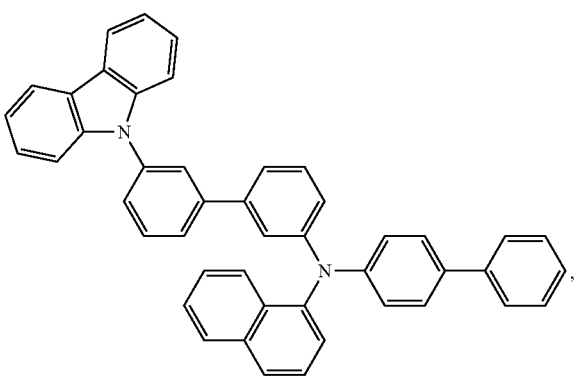

H-152
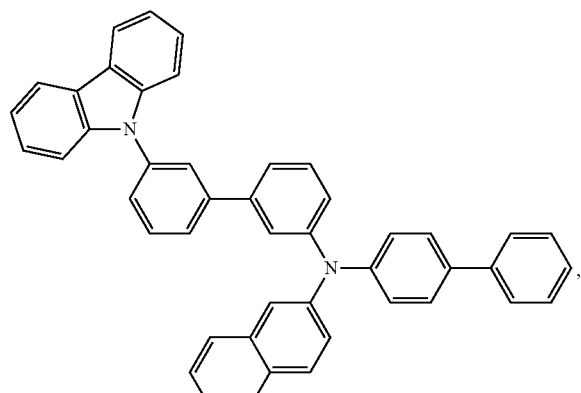
H-153
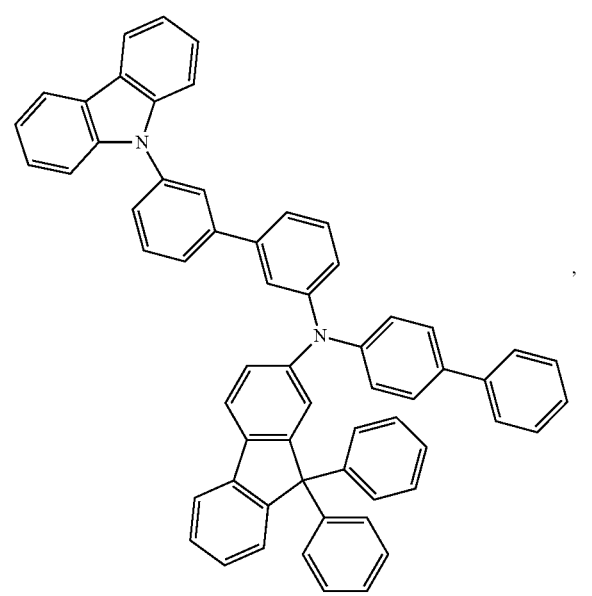
H-154
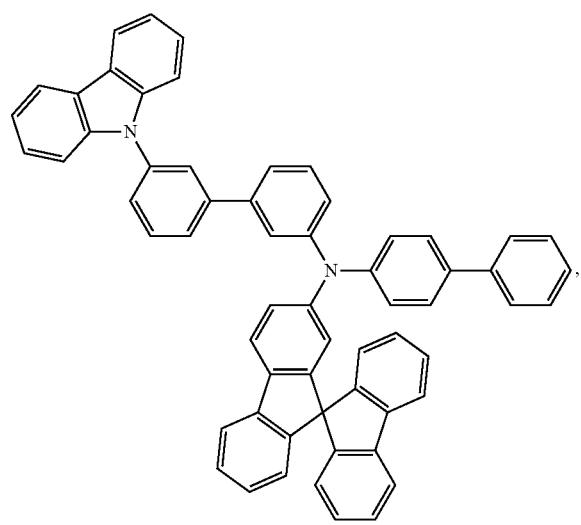
H-155
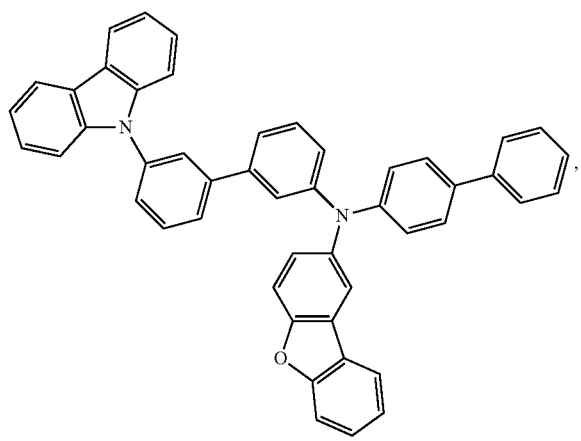
H-156
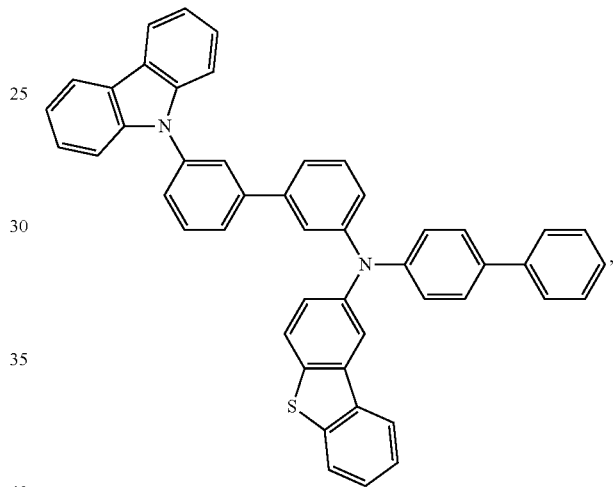
H-157
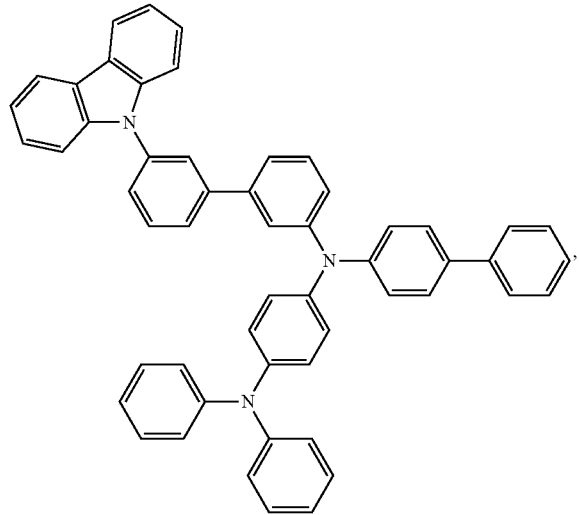

H-158
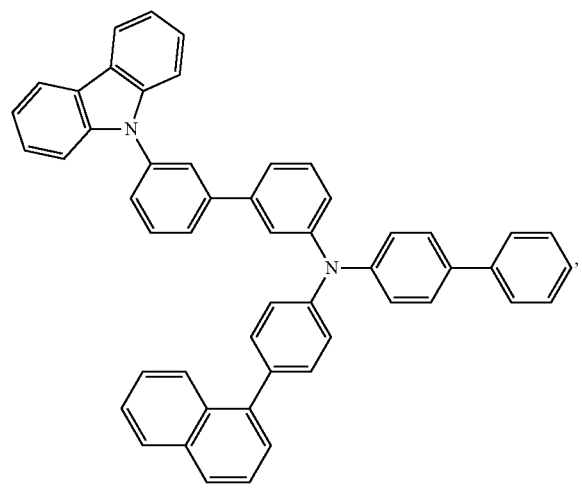
H-159
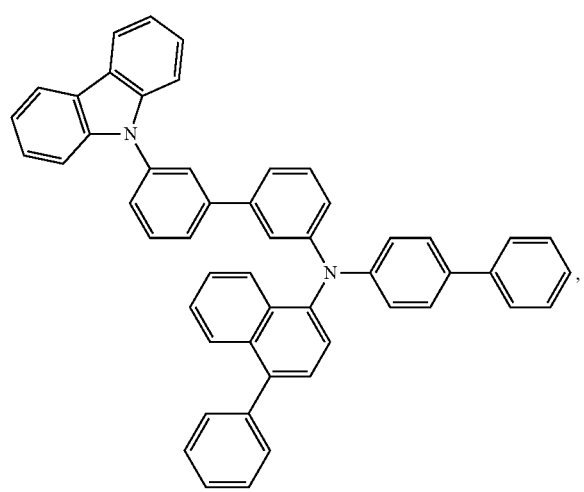
H-160
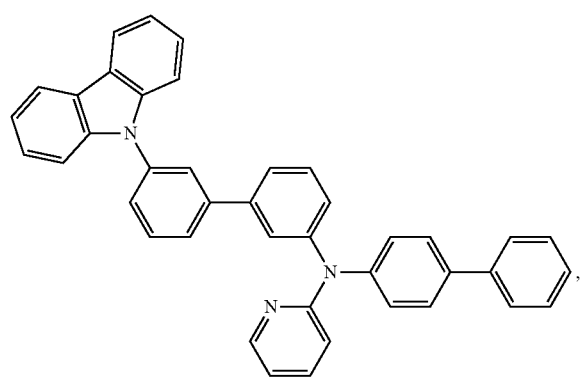
H-161
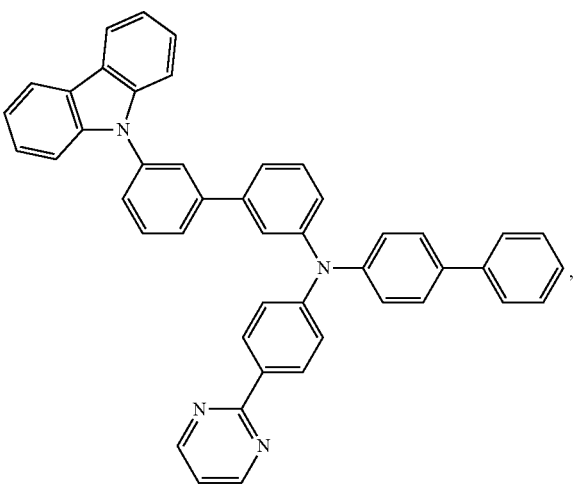
H-162
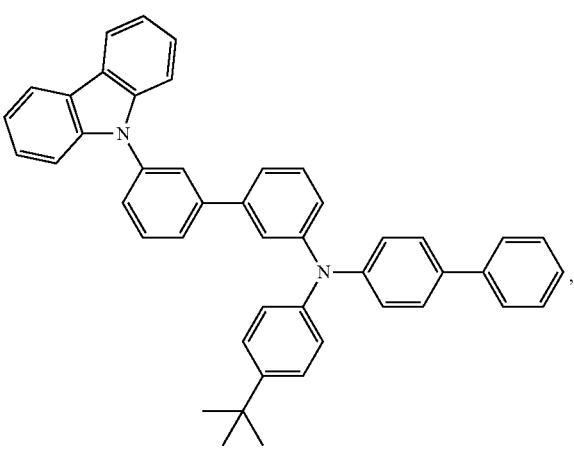
H-163
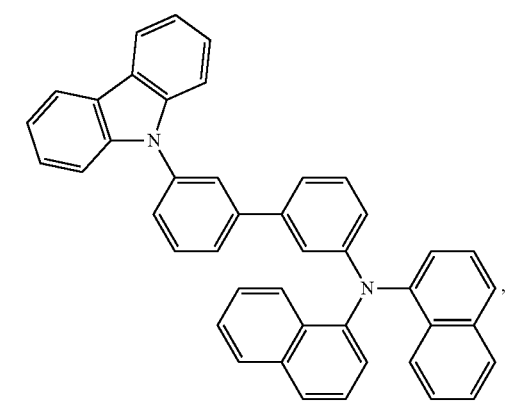

H-164
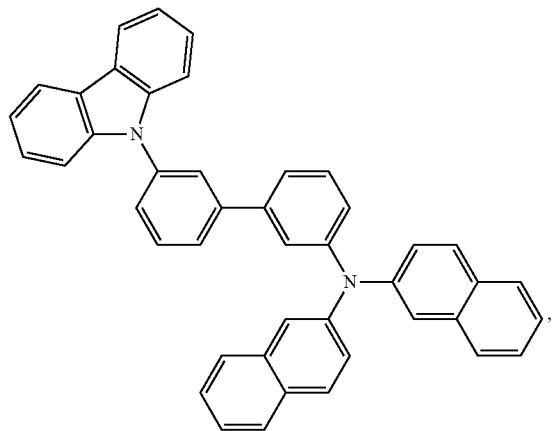
H-165
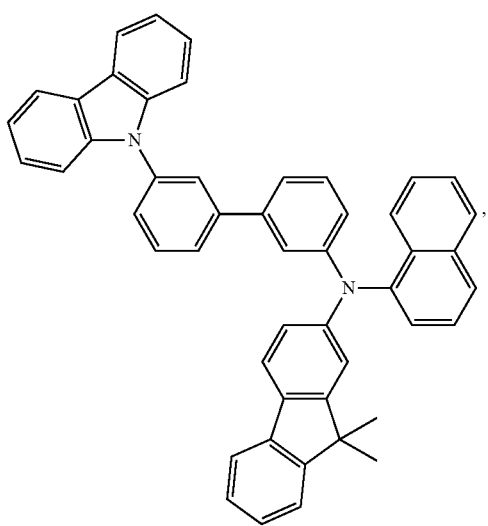
H-166
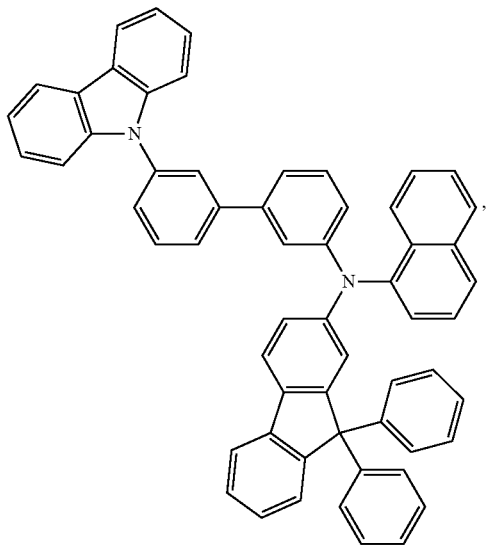
H-167
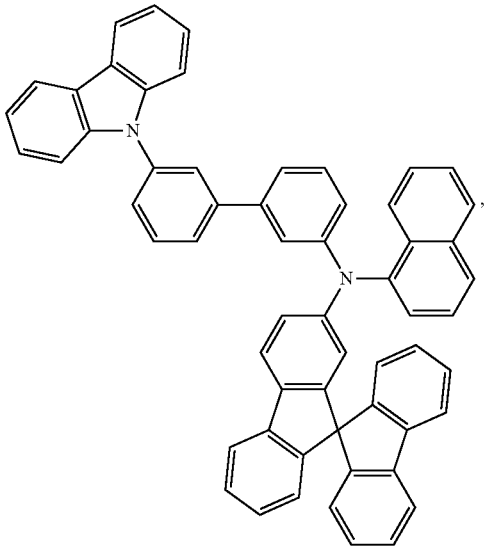
H-168
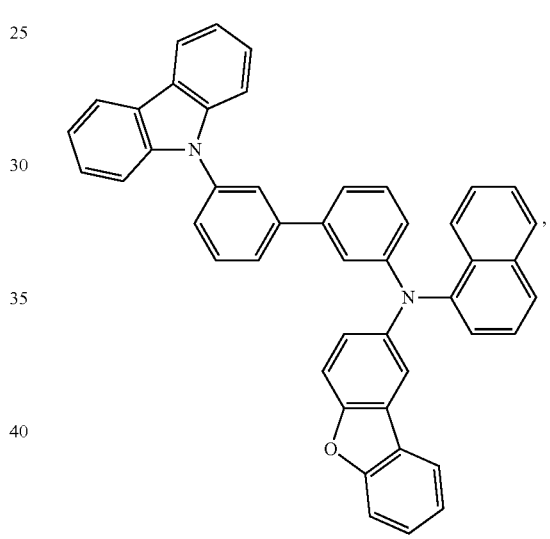
H-169
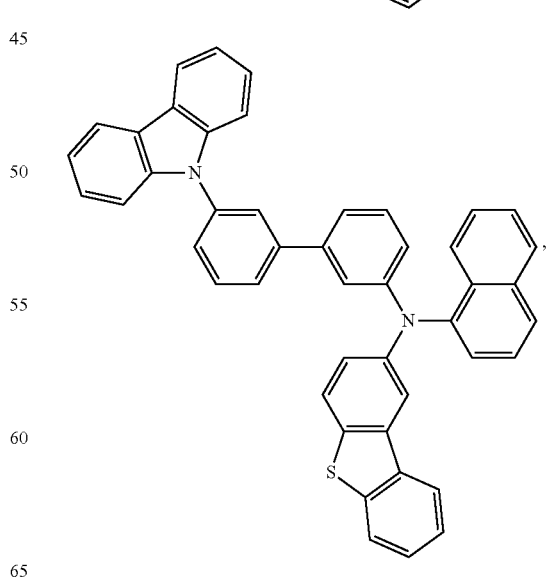

-continued
H-170
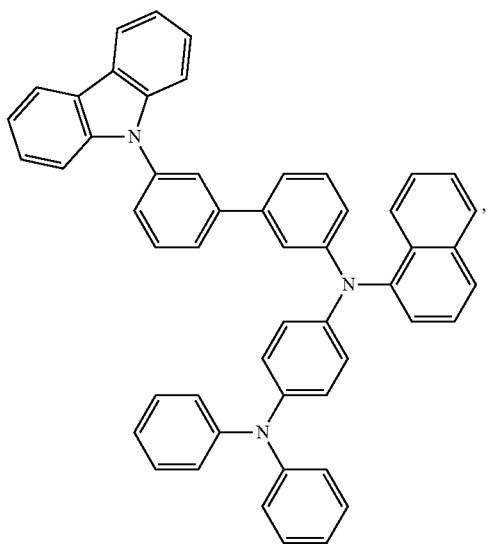
H-171
H-172
H-173
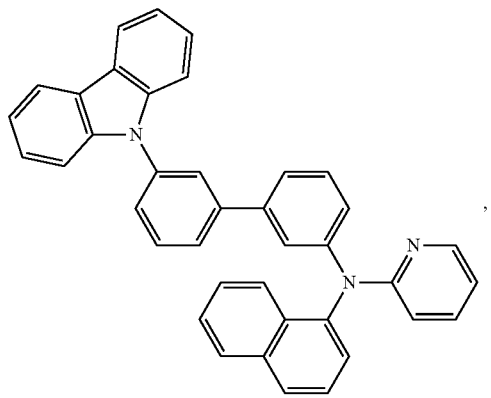
H-174
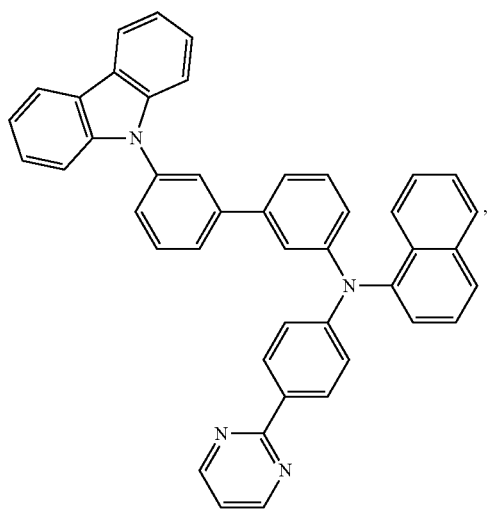
H-175
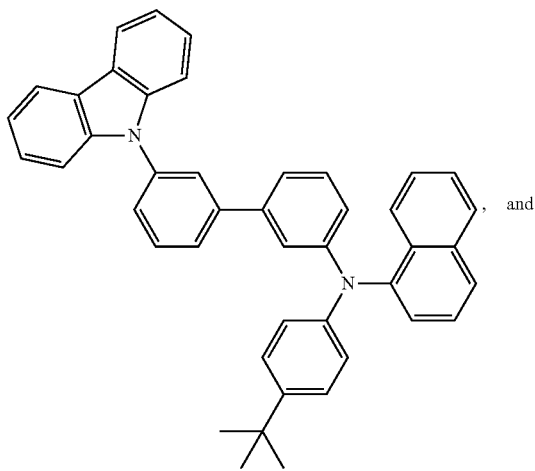
and -continued

H-176

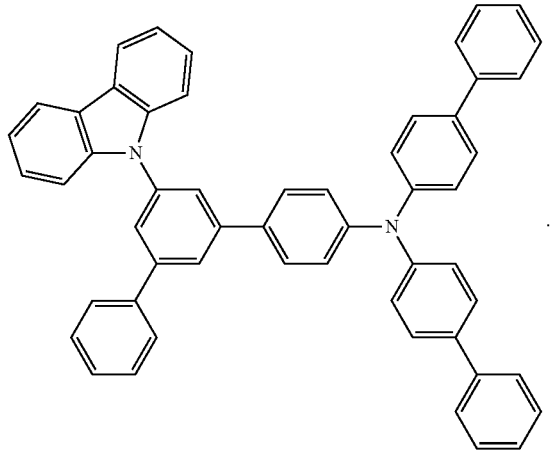

15. The organic electroluminescent device according to claim 1, wherein the LUMO energy level of the first organic material is greater than or equal to 5.36 eV, preferably greater than or equal to 5.49 eV, and more preferably greater than or equal to 5.69 eV.

16. The organic electroluminescent device according to claim 1, wherein the HOMO energy level of the second organic material is greater than or equal to 5.21 eV.

17. The organic electroluminescent device according to claim 1, wherein the LUMO energy level of the third organic material is greater than or equal to 5.36 eV, preferably greater than or equal to 5.49 eV, and more preferably greater than or equal to 5.69 eV.

18. The organic electroluminescent device according to claim 1, wherein the charge generation layer further comprises a metal layer.

19. The organic electroluminescent device according to claim 1, wherein the light-emitting unit further comprises a second organic layer disposed between the first organic layer and the emissive layer, the second organic layer comprises the second organic material, and the second organic layer is in contact with the emissive layer.

20. The organic electroluminescent device according to claim 1, wherein the first organic material and the third organic material are an identical compound.

21. The organic electroluminescent device according to claim 1, wherein, among the light-emitting units, at least two light-emitting units each comprise the first organic material and the second organic material, and the first organic material comprised in the at least two light-emitting units is identical, and the second organic material comprised in the at least two light-emitting units is identical.

22. The organic electroluminescent device according to claim 1, wherein the first organic layer is in contact with an anode, or the first organic layer is in contact with the buffer layer.

23. The organic electroluminescent device according to claim 1, wherein the weight proportion of the first organic material comprised in the first organic layer is not greater than 5% of the entire first organic layer;
   preferably, wherein, the weight proportion of the first organic material comprised in the first organic layer is not greater than 3% of the entire first organic layer;
   more preferably, wherein, the weight proportion of the first organic material comprised in the first organic layer is not greater than 2% of the entire first organic layer.

24. A display assembly, comprising the organic electroluminescent device according to claim 1.

* * * * *